(12) United States Patent  
Murooka

(10) Patent No.: US 8,134,177 B2  
(45) Date of Patent: Mar. 13, 2012

(54) SWITCHING ELEMENT, SEMICONDUCTOR DEVICE AND METHOD OF MANUFACTURING THE SAME

(75) Inventor: Kenichi Murooka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1198 days.

(21) Appl. No.: 11/566,937

(22) Filed: Dec. 5, 2006

(65) Prior Publication Data

US 2007/0278076 A1 Dec. 6, 2007

(30) Foreign Application Priority Data

Jun. 2, 2006 (JP) ................ P2006-155169

(51) Int. Cl.
*H01L 29/74* (2006.01)

(52) U.S. Cl. . 257/107; 257/119; 257/122; 257/E21.209; 257/E21.422; 438/257; 438/258; 438/593

(58) Field of Classification Search .............. None
See application file for complete search history.

(56) References Cited

U.S. PATENT DOCUMENTS

| | | | | |
|---|---|---|---|---|
| 5,731,598 A | * | 3/1998 | Kado et al. | 257/30 |
| 5,834,824 A | * | 11/1998 | Shepherd et al. | 257/530 |
| 6,441,392 B1 | * | 8/2002 | Gautier et al. | 257/12 |
| 6,479,365 B2 | * | 11/2002 | Lee et al. | 438/409 |
| 6,815,763 B2 | * | 11/2004 | Osabe et al. | 257/324 |
| 7,081,641 B2 | * | 7/2006 | Kawasaki et al. | 257/40 |
| 7,407,856 B2 | * | 8/2008 | Yoo et al. | 438/257 |

FOREIGN PATENT DOCUMENTS

| | | |
|---|---|---|
| JP | 2004-537846 | 12/2004 |
| JP | 2005-209503 | 8/2005 |

OTHER PUBLICATIONS

U.S. Appl. No. 11/501,897, filed Aug. 10, 2006, Kenichi Murooka, et al.

Ozgur Turel, et al, "CrossNets: possible neuromorphic networks based on nanoscale components", International Journal of Circuit Theory and Applications, vol. 31, 2003, pp. 37-53, and 4 additional pages.

* cited by examiner

*Primary Examiner* — Zandra Smith  
*Assistant Examiner* — Khanh Duong  
(74) *Attorney, Agent, or Firm* — Oblon, Spivak, McClelland, Maier & Neustadt, L.L.P.

(57) ABSTRACT

A switching element includes a first electrode having a first surface; a second electrode having a second surface which stands off from the first surface; and a channel region constituted by a plurality of unit channels, each unit channel having opposite ends thereof being in contact with the first electrode and the second electrode, and including fine particles which are aligned in lines in a first direction from the first surface of the first electrode to the second surface of the second electrode, and the unit channels being separated from one another in a second direction across the first direction.

24 Claims, 54 Drawing Sheets

REPULSIVE FORCE

ATTRACTIVE FORCE

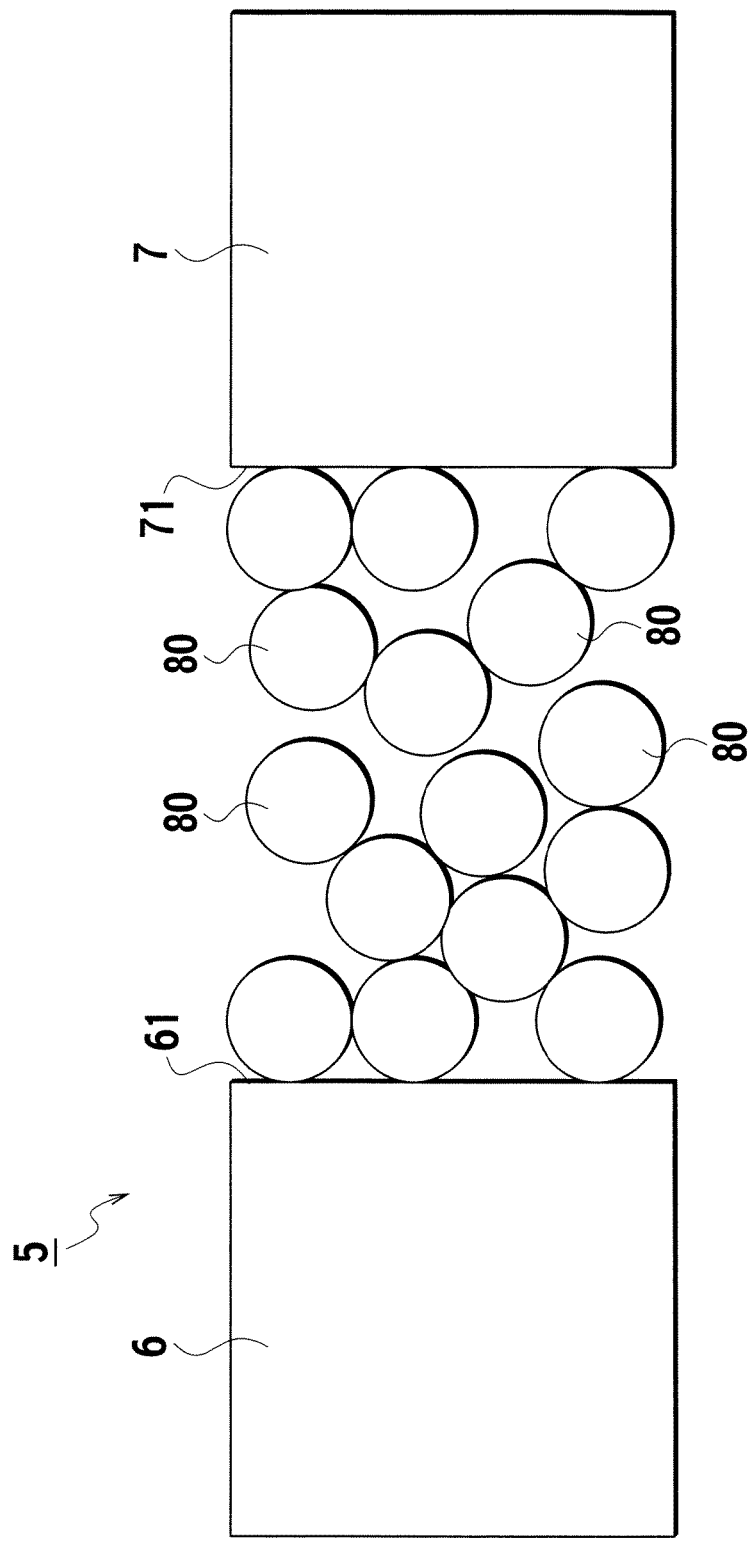

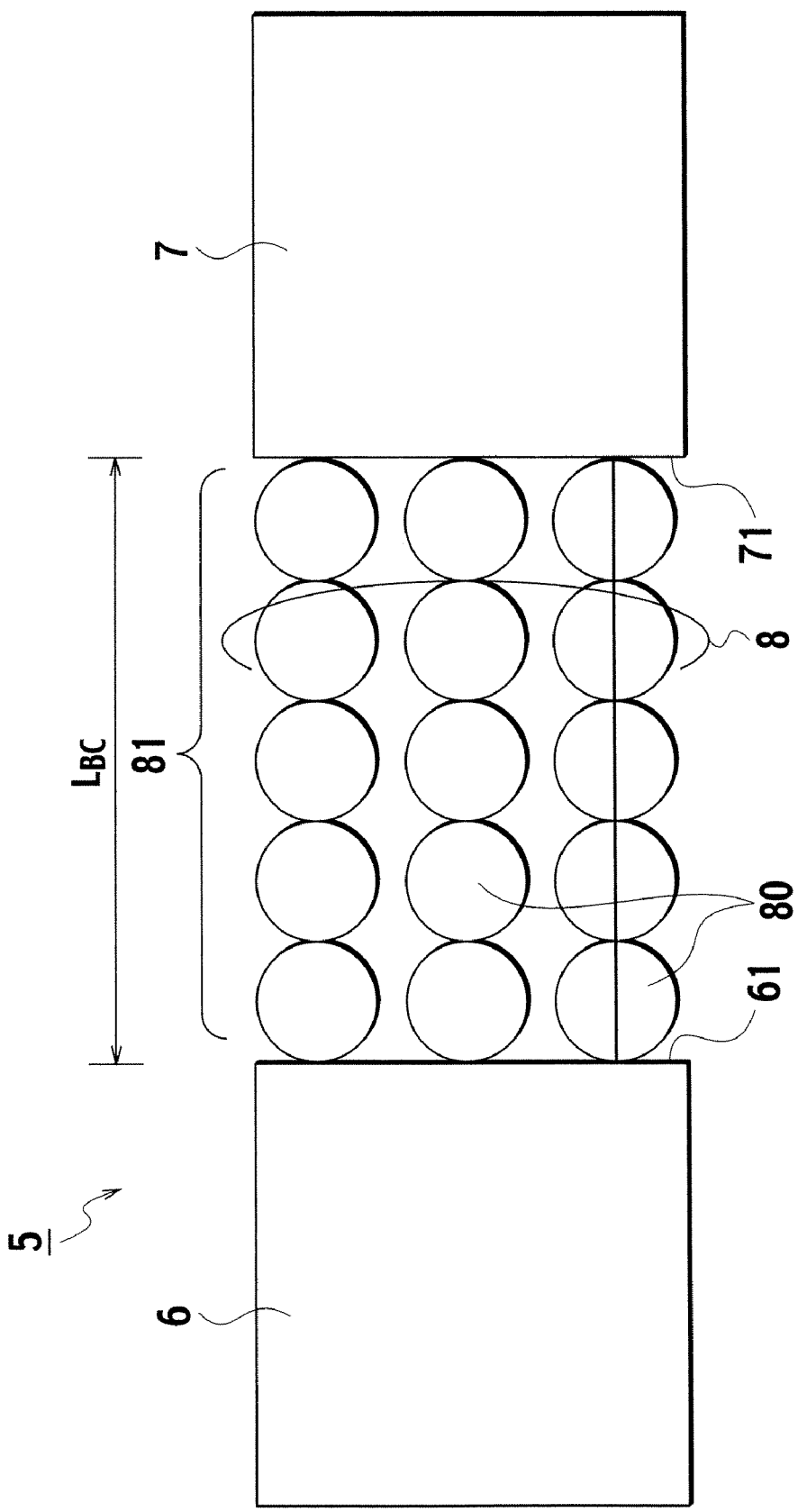

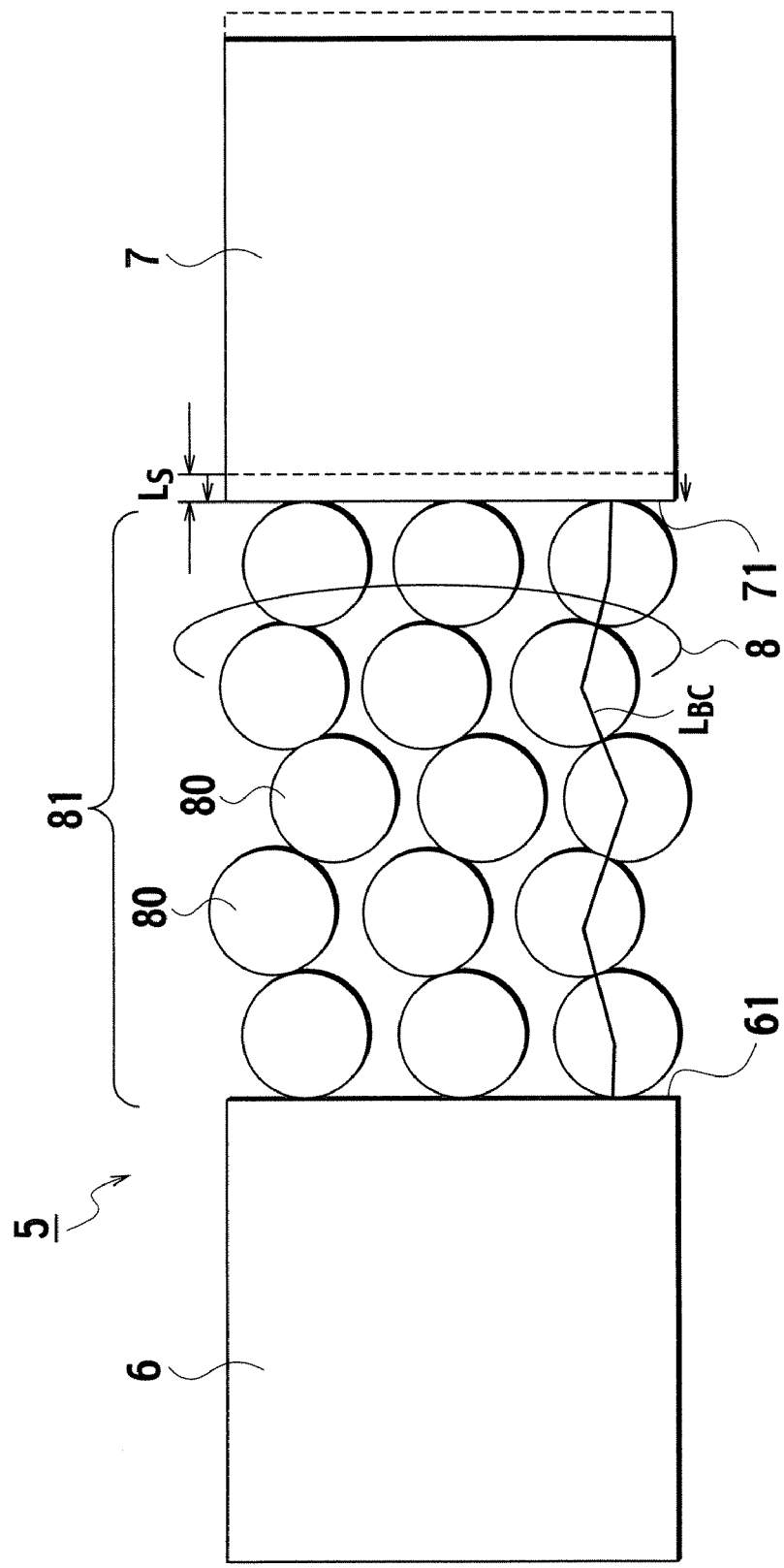

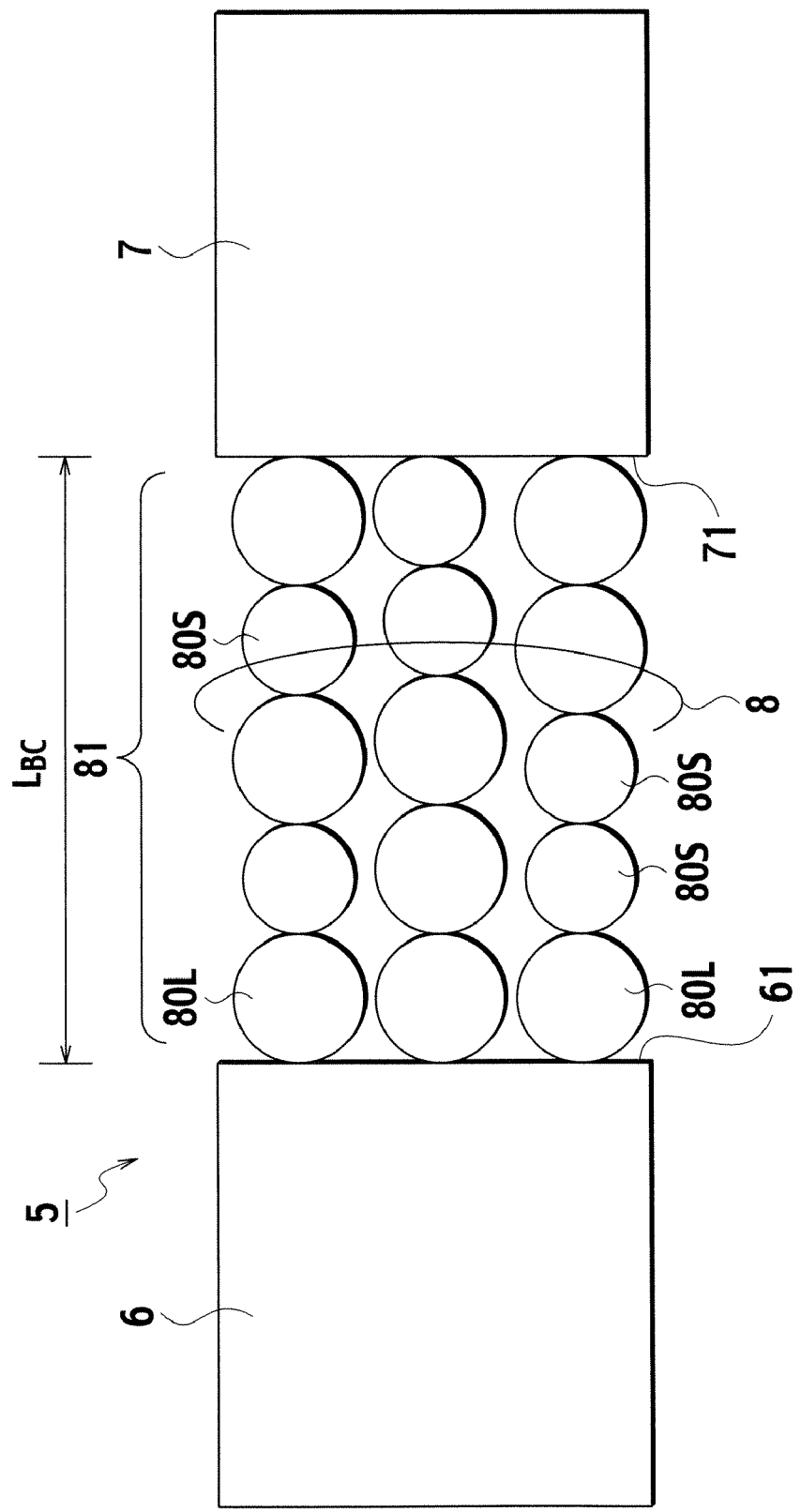

FIG. 17
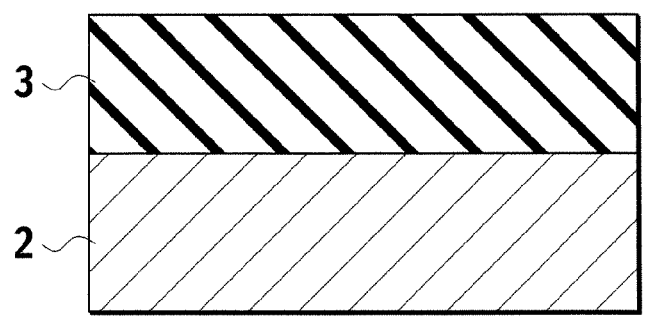
FIG. 18A  FIG. 18B
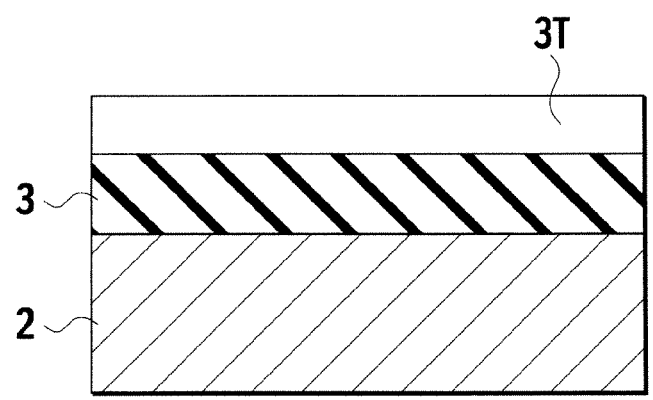 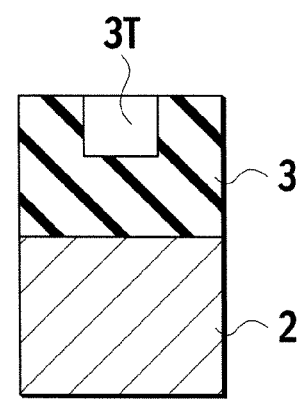
FIG. 19A  FIG. 19B
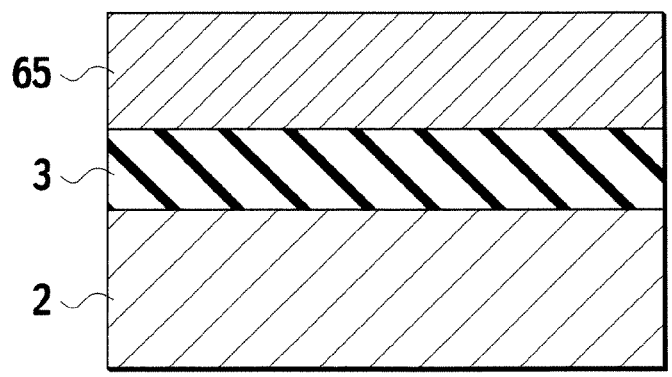 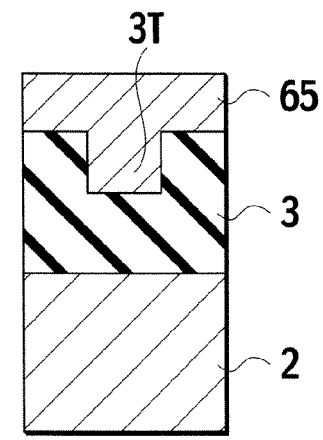

FIG. 20A
FIG. 20B
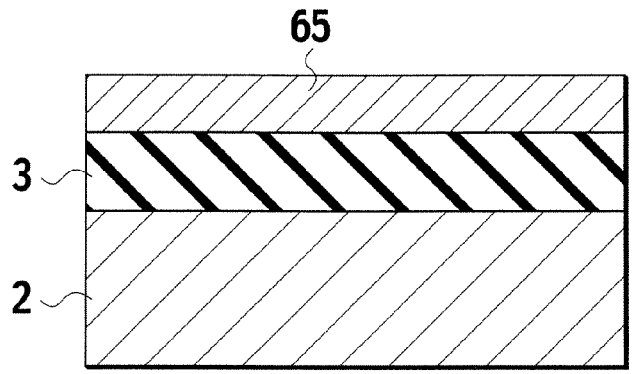
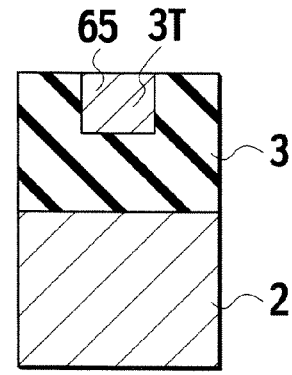
FIG. 21A
FIG. 21B
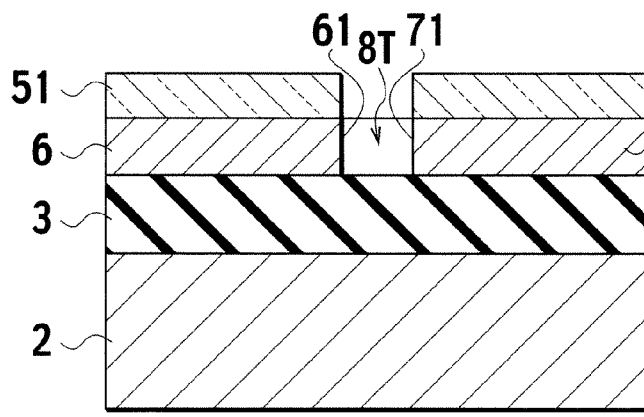
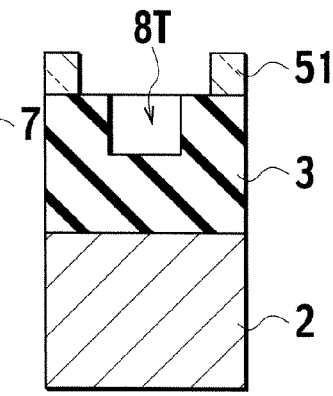
FIG. 22A
FIG. 22B
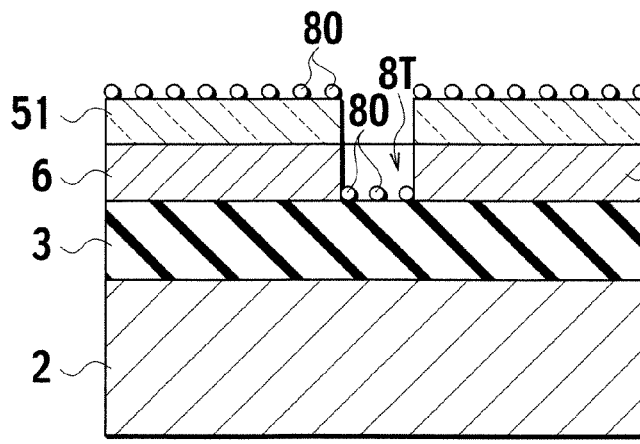
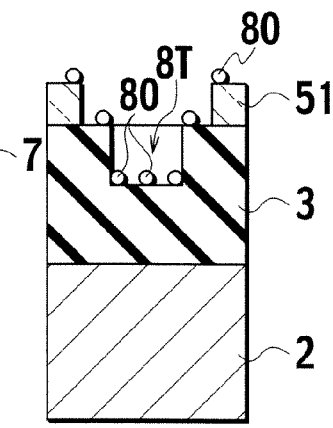

SWITCHING ELEMENT, SEMICONDUCTOR DEVICE AND METHOD OF MANUFACTURING THE SAME

CROSS REFERENCE TO RELATED APPLICATION

This application is based upon and claims the benefit of priority from the prior Japanese Patent Application No. 2006-155169 filed on Jun. 2, 2006, the entire contents of which are incorporated herein by reference.

BACKGROUND OF THE INVENTION

1. Field of the Invention

This invention relates to a switching element, a semiconductor device and a method of manufacturing the same, and more particularly relates to a switching element having a channel region between main electrodes, a semiconductor device including such a switching element, and a method of manufacturing the switching element and semiconductor device.

2. Description of the Related Art

The more extensively semiconductor devices are integrated, the more micro-fabricated wiring patterns are required for large scale integrated circuits, transistor elements, wire connections and so on. In order to promote micro-fabrication of wiring patterns, wires should be not only scaled down but also be precisely designed, sized and arranged. Especially, a MOSFET (Metal Oxide Semiconductor Field Effect Transistor) should be extensively scaled down and more precisely fabricated. Therefore, a great amount of load is placed on the lithography process which directly affects the minimum size and the precision of the fabricated pattern. In addition, as lithography technology account for the most of mass production cost of semiconductor devices, the improvement of the precision in fabricating patterns along with the reduction of the size leads to increase the cost of semiconductor devices.

In order to substantially overcome problems related to the foregoing top-down type micro-fabrication technique, the following two references have proposed the bottom-up type micro-fabrication techniques. In the references, the desired molecular architecture is artificially synthesized, and elements having uniform attributes are produced using uniform molecules. However, in order to put the foregoing technique into practical use, there are a number of problems related to arrangement of synthesized molecules at desired positions, electric connections between arranged electrodes and wirings, and so on. The references are Domestic Re-Publication of PCT International Application No. 2004-537846 (called the "Reference 1") and Ö. T. ürel and K. Likharev, "Cross Nets: Possible Neuromorphic Networks based on Nanoscale Component", Int. J. of Circuit Theory and Appl. 31, pp. 37-53 (2003) (called the "Reference 2").

With the foregoing top-down type patterning method using the lithography process, more strong request have been made on improved fabrication sizes of components in order to accomplish finer micro-fabrication of patterns. This is very difficult to accomplish. On the contrary, the bottom-up type patterning method can easily satisfy the requirements for the improved fabrication sizes, but is difficult to put into practical use with respect to arrangement of micro-fabricated components at desired positions, and so on.

SUMMARY OF THE INVENTION

The present invention has been contemplated in order to overcome problems of the related art, and is intended to provide a switching element which has micro-fabricated patterns and precise fabrication sizes, and assures easy control of arrangement of micro-fabricated patterns. The invention also intends provide a semiconductor device including such a switching element.

A further object of the invention is to provide a method of manufacturing the foregoing switching element and a semiconductor device including the switching element.

According to a first aspect of the embodiment of the invention, there is provided a switching element which includes a first electrode having a first surface; a second electrode having a second surface which stands off from the first surface; and a channel region constituted by a plurality of unit channels, each unit channel having opposite ends thereof in contact with the first electrode and the second electrode and containing fine particles which are aligned in a first direction from the first surface of the first electrode to the second surface of the second electrode, and the unit channels being separated from one another in a second direction across the first direction.

According to a second aspect of the embodiment of the invention, there is provided a switching element includes a first electrode having a first surface; a second electrode having a second surface which stands off from the first surface; and fine particles which are randomly dispersed between the first surface of the first electrode and the second surface of the second electrode, and whose state can be at least once changed to the aligned one in which a plurality of unit channels constitute a channel region, each unit channel has opposite ends thereof in contact with the first electrode and the second electrode and contains fine particles which are aligned in a first direction from the first surface of the first electrode to the second surface of the second electrode, and the unit channels are separated from one another in a second direction across the first direction.

According to a third aspect of the embodiment of the invention, there is provided a semiconductor device includes a substrate; a switching element mounted on the substrate; and the switching element comprising: a first electrode having a first surface; a second electrode having a second surface which stands off from the first surface; a channel region constituted by a plurality of unit channels, each unit channel having opposite ends thereof being in contact with the first electrode and the second electrode and containing fine particles which are aligned in a first direction from the first surface of the first electrode to the second surface of the second electrode, and the unit channels being separated from one another in a second direction across the first direction.

According to a fourth aspect of the embodiment of the invention, there is provided a semiconductor device includes a substrate; a switching element mounted on the substrate; and the switching element comprising: a first electrode having a first surface a second electrode having a second surface which stands off from the first surface; a dielectric film placed between the first and second surfaces; a channel region constituted by a plurality of unit channels, each unit channel having opposite ends thereof being in contact with the first electrode and the second electrode on the dielectric film and containing fine particles which are aligned in a first direction from the first surface of the first electrode to the second surface of the second electrode; and the unit channels being separated from one another in a second direction across the first direction.

According to a fifth aspect of the embodiment of the invention, there is provided a method of manufacturing of a semiconductor device which includes making a first electrode having a first surface and a second electrode having a second surface which stands off from the first surface; applying fine particles between the first electrode and the second electrode; and making a channel region, the channel region being constituted by a plurality of unit channels, each unit channel having opposite ends thereof in contact with the first electrode and the second electrode and containing fine particles which are aligned in a first direction from the first surface of the first electrode to the second surface of the second electrode, and the unit channels being separated in a second direction across the first direction.

According to a sixth aspect of the embodiment of the invention, there is provided a method of manufacturing of a semiconductor device which includes making a first electrode having a first surface and a second electrode having a second surface which stands off from the first surface on a substrate; applying fine particles between the first electrode and the second electrode; and making a channel region, the channel region being constituted by a plurality of unit channels, each unit channel having opposite ends thereof in contact with the first electrode and the second electrode and containing fine particles which are aligned in a first direction from the first surface of the first electrode to the second surface of the second electrode, and the unit channels being separated in a second direction across the first direction.

According to a seventh aspect of the embodiment of the invention, there is provided a method of manufacturing of a semiconductor device which includes forming a first insulating film on a substrate; applying fine particles onto the insulating film; placing the substrate between electrodes, aligning the fine particles vertically with respect to the first insulating film by attractive force generated in response to application of a voltage between the electrodes, and separating the aligned fine particles by repulsive force; forming a second insulating film in which the fine particles are embedded; oxidizing surfaces of the fine particles in the second insulating film; and forming electrodes on the second insulating film.

BRIEF DESCRIPTION OF THE SEVERAL VIEWS OF THE DRAWINGS

Like or corresponding parts are denoted by like or corresponding reference numerals.

FIG. 7 is an enlarged schematic view of the switching element in FIG. 3;

FIG. 8 is an enlarged schematic view of the switching element in FIG. 4;

FIG. 9 is an enlarged schematic view of a first modified example of the switching element in the first embodiment;

FIG. 10 is an enlarged schematic view of a second modified example of the switching element in the first embodiment;

FIG. 17 is a cross section of the switching element, showing how the switching element and a semiconductor device is manufactured in a first manufacturing process;

FIG. 18A is a cross section of the switching element in a second manufacturing process;

FIG. 18B is a cross section of a central part of the switching element (i.e., the channel region of switching element), taken in a plane perpendicular to the drawing;

FIG. 19A is a cross section of the switching element in a third manufacturing process;

FIG. 19B is a cross section of the central part of the switching element in FIG. 19A;

FIG. 20A is a cross section of the switching element in a fourth manufacturing process;

FIG. 20B is a cross section of the central part of the switching element in FIG. 20A;

FIG. 21A is a cross section of the switching element in a fifth manufacturing process;

FIG. 21B is a cross section of the central part of the switching element in FIG. 21A;

FIG. 22A is a cross section of the switching element in a sixth manufacturing process;

FIG. 22B is a cross section of the central part of the switching element in FIG. 22A;

FIG. 104 is a cross section of a switching element and a semiconductor device in the sixth embodiment and in a first manufacturing process;

FIG. 105 is a cross section of the switching element and the semiconductor device in the sixth embodiment and in a second manufacturing process;

FIG. 106 is a cross section of the switching element and the semiconductor device in the sixth embodiment and in a third manufacturing process;

FIG. 107 is a cross section of the switching element and the semiconductor device in the sixth embodiment and in a fourth manufacturing process;

FIG. 108 is a cross section of the switching element and the semiconductor device in the sixth embodiment and in a fifth manufacturing process;

FIG. 109 is a cross section of the switching element and the semiconductor device in the sixth embodiment and in a sixth manufacturing process;

FIG. 110 is a cross section of the switching element and the semiconductor device in the sixth embodiment and in a seventh manufacturing process;

FIG. 111 is a cross section of the switching element and the semiconductor device in the sixth embodiment and in an eighth manufacturing process;

FIG. 112 is a cross section of the switching element and the semiconductor device in the sixth embodiment and in a ninth manufacturing process; and FIG. 113 is a cross section of the switching element and the semiconductor device in the sixth embodiment and in a tenth manufacturing process.

DETAILED DESCRIPTION OF THE INVENTION

Figure 1:
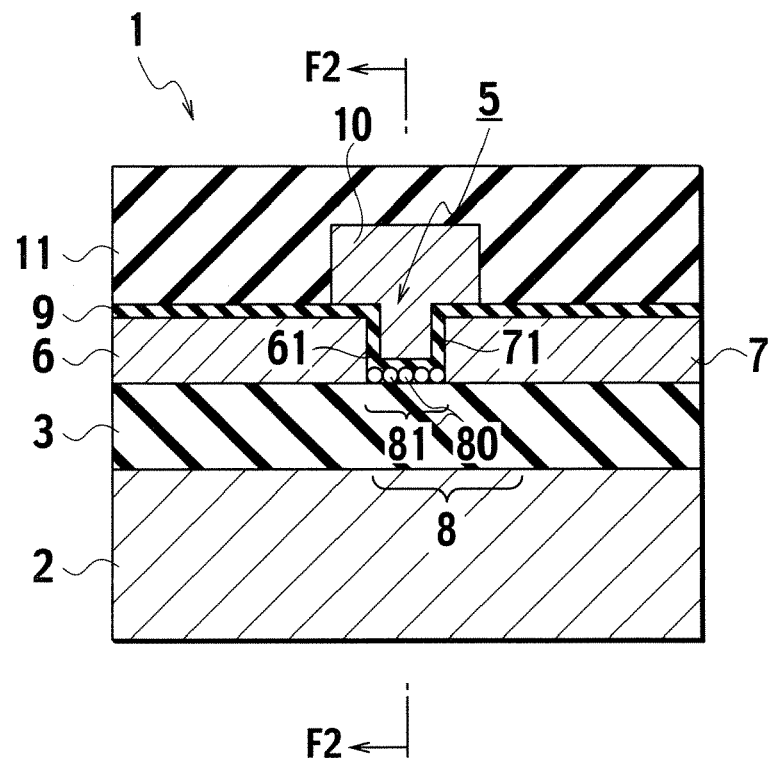
FIG. 1 is a cross section of an essential part of a semiconductor device including a switching element according to the first embodiment of the invention.

The invention will be described with reference to several embodiments shown in the drawings.

First Embodiment

[Configuration of Switching Element and Semiconductor Device]

In the first embodiment, a semiconductor device 1 includes a first main electrode 6, a second main electrode 7, a switching element 5, and a substrate 2. The first main electrode 6 has a first electrode surface 61. The second main electrode 7 has a second electrode surface 71 which stands off from the first electrode surface 61. The switching element 5 has its opposite ends in contact with the first electrode surface 61 and the second electrode surface 71, and includes a channel region 8. Each channel region 8 is constituted by a plurality of unit channels 81. Each unit channel 81 is constituted by fine particles 80 which are closely aligned in a first direction extending between the first electrode surface 61 and the second electrode surface 71. A plurality of unit channels 81 are separately arranged in a second direction across the first direction. The switching element 5 is mounted on the substrate 2. Further, the switching element 5 is provided with an insulating film 9 extending over the channel region 8, and a control electrode 10 on the insulating film 9.

The substrate 2 usually mounts one switching element 5, or is used as a base substrate which mounts a plurality of switching elements 5 in an integrated manner. The substrate 2 is preferably made of a single crystal silicon which is stable and reliable in a semiconductor manufacturing process. Alternatively, the substrate 2 may be a III-V group compound semiconductor substrate, an insulating substrate, SOI (silicon on insulator) or the like.

The first and second main electrodes 6 and 7 introduce a main current, and function as source or drain electrodes. The simplest form of the first and second main electrodes 6 and 7 is in the shape of a rectangular prism or a cube. The first electrode surface 61 of the first main electrode 6 faces with the second electrode surface 71 of the second electrode 7 with a shortest distance. The distance between the first and second electrode surfaces 61 and 71 corresponds to the length of the channel region 8. The foregoing simplest form of the first and second main electrodes 6 and 7 means the shape of the first and second main electrodes 6 and 7 is defined by a length, a width and a height thereof which are given values. In this case, the first or second electrodes 6 and 7 are supposed not to be partly expanded nor L-shaped in view of alignment allowance for connection with upper components or wirings.

The first and second main electrodes 6 and 7 are made of poly-crystal silicon films which are very reliable in the semiconductor manufacturing process and are very thermo-stable in a preprocessing stage. The poly-crystal silicon films may contain conductive n-type impurities such as P (phosphor) or As (arsenic), for instance. In short, the first and second electrodes 6 and 7 can be made of "semiconductor regions (source and drain regions)", or precisely "diffusion regions". Further, p-type impurities such as B (boron) are usable.

The channel region 8 introduces the main current (or the current of electrons or holes) in response to a field effect produced by a voltage applied to the control electrode 10. The fine particles 80 are preferably IV group Si (silicon) semiconductor particles whose threshold voltage can be controlled by the field effect (i.e., the field effect can control an energy level), and which are stable and reliable in circuit operations of the switching element 5 and in the semiconductor manufacturing process. Further, the fine particles 80 may be made of Ge or C of IV group, or GaAs, GaN, GaSb or InP of III-V group compound semiconductor, and so on. The channel region 8 is structured and fabricated as will be detailed later. The fine particles 80 are spheres having the same diameter, which is a few nm, e.g., 1 nm to 3 nm, in order to make the micro switching element 5 which is a few tens of nm or smaller. Although all of the fine particles 80 are preferably identical in their shape and size, they may be different within a range which is allowable in the manufacturing process. Alternatively, the fine particles 80 may be elliptical.

Each unit channel 81 of the channel region 8 is constituted by a plurality of fine particles 80 which are closely joined to be in direct physical contact (see also for example. FIG. 8) in the first direction in a space between the first electrode surface 61 and the second electrode surface 71. The space is as long as a channel length of the switching element 5. Although not shown in drawing, the first direction extends along the length of the channel. Specifically, each unit channel 81 is made of a plurality of fine particles 80 which are closely aligned in direct physical contact using attractive force between them, and remains as it is even after the semiconductor manufacturing process is over. Further, the unit channels 81 which are adjacent in the second direction are separated by repulsive force between the fine particles and remain separated even after the manufacturing process is over. Although not shown in drawings, the second direction extends along the width of the channel, and is orthogonal to the first direction. Further, the space between the first and second electrode surfaces 61 and 71 depends upon the precision of fabricating sizes in the semiconductor manufacturing process, and is usually minimized.

The insulating film 9 serves as a gate insulating film, and is preferably made of a single $SiO_2$ (silicon oxide), $Si_3N_4$ (silicon nitride), oxy-nitride, HFSiON (hafnium silicon oxy-nitride) film and so on, or a composite layers of the foregoing films, for instance.

The control electrode 10 functions as a gate electrode, and is preferably made of a poly-crystal silicon film, a refractory metal silicide film, a refractory metal film or the like, or a composite layer of the refractory metal silicide film or refractory metal film applied onto the poly-crystal silicon film.

In the first embodiment, the switching element 5 functions as an insulated gate field effect transistor (IGFET), and more specifically, a metal insulated semiconductor field effect transistor (MISFET).

A passivation film 11 extends over the switching element 5. Although not shown, a wiring for connecting elements or circuits is provided on the passivation film 11, and is connected to the first and second main electrodes 6 and 7 of the switching element 5 via holes in the passivation film 11. The wiring is made of a single aluminum alloy film, a Cu film or the like, or a composite layer of the aluminum alloy film, the Cu film and so on covered by a barrier metal film or anti-reflection film.

[Basic Configuration and Basic Fabricating Method of Switching Element]

(1) Basic Fabricating Method of Switching Element

Figure 3:
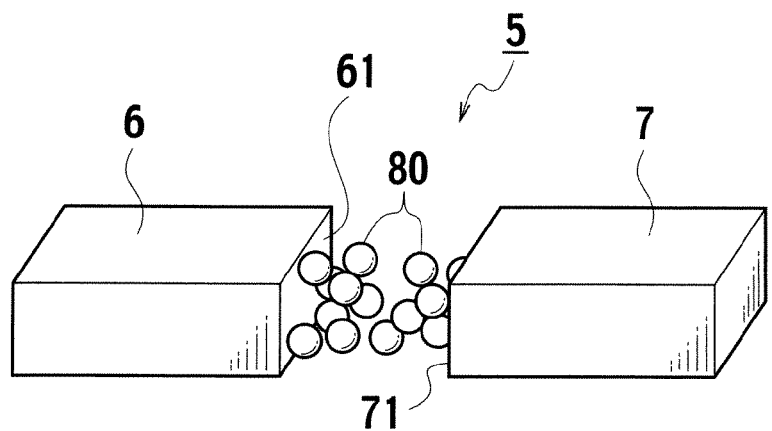
FIG. 3 is a schematic perspective view of the switching element in the semiconductor device in FIG. 1, showing a basic structure of the switching element in a first manufacturing process.

Referring to FIG. 3, a plurality of fine particles 80 are distributed at random between the first and second electrode surfaces 61 and 71 of the first and second main electrodes 6 and 7 (i.e., in the channel region 8).

Thereafter, a voltage V is applied between the first and second main electrodes 6 and 7. In response to the voltage application, an electric field E is generated in the first direction between the first and second electrode surfaces 61 and 71. Because of interactions of attractive force and repulsive force the fine particles 80 are aligned along the length of the channel (in the first direction) from the first electrode surface 61 to the second electrode surface 71. Therefore, a plurality of unit channels 81 are formed. At the same time, a plurality of unit channels 81 are separated with given spaces kept between them, thereby making the channel region 8.

Compared with the fabricating patterns of the first and second main electrodes 6 and 7, the unit channels 81 can be produced using the fine particles 80 having much smaller size patterns. The channel region 8 can be constituted by such unit channels 81. This enables the channel region 8 to have the finer pattern size, on which a device size depends (2) Basic Configuration of Switching Element In the switching element 5, the interactions act on the fine particles 80 in the channel region 8 as described hereinafter. When placed in the electric field, each fine particle 80 has a polarization p depending upon an electric field intensity, a dielectric constant and a shape. It is assumed that two fine particles 80 have polarizations $p_1$ and $p_2$, and that a position vector of the polarization $p_2$ is "r" from the polarization $p_1$ which is considered to be the origin point. Force F applied to the polarization $p_1$ because of the interactions between the fine particles 80 is derived by the formula (1).

$$F = -\frac{3}{4\pi\epsilon_0}\left(\frac{(p_1 \cdot r)p_2 + (p_2 \cdot r)p_1 + (p_1 \cdot p_2)r}{r^5} - \frac{5(p_1 \cdot r)(p_2 \cdot r)r}{r^7}\right) \quad (1)$$

In the formula (1), $\epsilon_0$ denotes a vacuum dielectric constant (approximately $8.85 \times 10^{-12}$ F/m). Strictly speaking, if a medium is not vacuum, the vacuum dielectric constant $\epsilon_0$ should be corrected. However, if the medium is a gas having a pressure which is substantially equal to an atmospheric pressure, an amount of correction is negligible. As can be understood on the law of action and reaction, the magnitude of attractive or repulsive force applied to the polarization $p_2$ is equal to the force F expressed by the formula (1), but the direction is in the opposite direction.

Figure 5A:
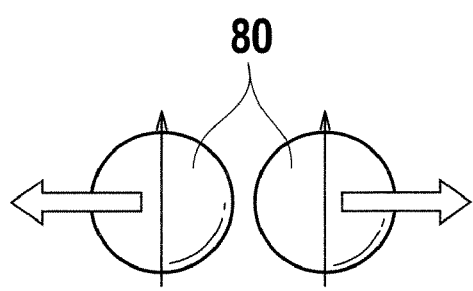
FIG. 5A and FIG. 5B show interactive force between dipoles.
Figure 5B:
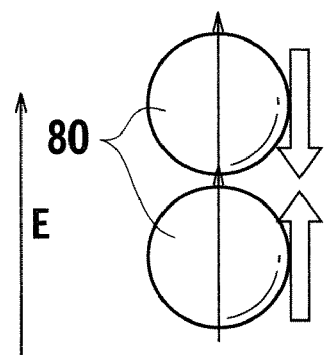

The direction of the force acting between the two fine particles 80 (dipoles) which are polarized in the same direction as the direction of the acting electric field E can be derived by evaluating the sign in the formula (1). If the two fine particles 80 are lined up with respect to the direction of the acting electric field E, the repulsive force acts on the fine particles 80 as shown in FIG. 5A. On the contrary, when the two fine particles 80 are aligned in parallel to the direction of the acting electric field E, the attractive force acts on the fine particles 80 as shown in FIG. 5B. Therefore, a number of fine particles 80 which are present between the first and second electrode surfaces 61 and 71 are beaded in the same direction of the acting electric field, and are separated from one another in the perpendicular direction. In this state, the fine particles 80 are most stable in view of energy.

If fine particles 80 are isotropic, have a uniform dielectric constant $\epsilon_1$, and are spheres having a diameter "a", an amplitude of the electric polarization p induced to the fine particles 80 in the electric field E is derived by formula (2). When the fine particles 80 are perfect conductors, the dielectric constant $\epsilon_1$ is the infinite (i.e., a fractional number comes near 1).

$$p = 4\pi\epsilon_0 \frac{\epsilon_1 - \epsilon_0}{\epsilon_1 + 2\epsilon_0} a^3 E \quad (2)$$

If the first and second electrode surfaces 61 and 71 come near on a parallel plate, the electric field E can be expressed to be equal to V/d (E=V/d), where V denotes the voltage applied between the first and second electrode surface 61 and 71, and "d" denotes a distance between them. Therefore, it is possible to estimate the amplitude of the force F in the formula (1).

For instance, it is assumed that the diameter of the fine particles 80 is 2 nm; the distance d is 10 nm; and the voltage between the electrodes is 1 V. The repulsive force of 0.2 pN acts on the fine particles 80 when the two fine particles 80 are aligned vertically in the direction of the acting electric field E. Further, when the two fine particles 80 are arranged in parallel along the acting direction of the electric field E, the attractive force of approximately 0.4 pN acts on the fine particles 80.

The amplitude of the force F is small by comparison with chemical bonding force, and is almost equal to intermolecular bonding force. Therefore, states and arrangement of the fine particles 80 can be appropriately controlled by adjusting such conditions as the dielectric constant (of a material) of the fine particles 80 and the voltage V between the electrodes.

Figure 6:
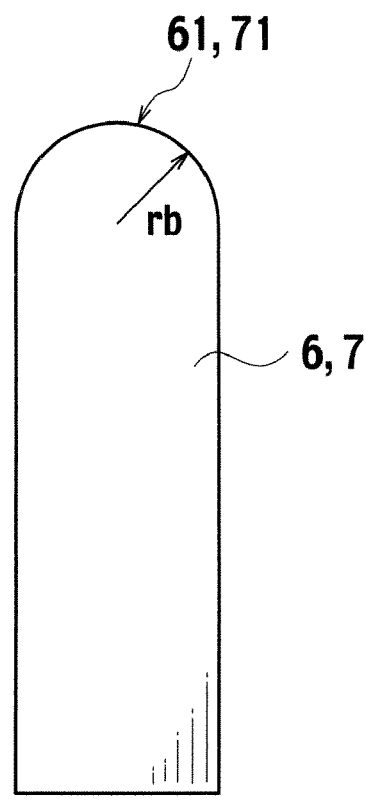
FIG. 6 is a top plan view of a modified main electrode of the switching element in FIG. 1.

A large electric intensity can be produced between the first and second main electrodes 6 and 7 even if their line width is equal to or less than several ten nm and they are widely separated so as not to come near in the shape of a parallel plate. The foregoing is based on the approximate expression of the electric intensity which is a well-known principle of the field-ion microscope, i.e., E=V/(krb). For this purpose, the channel region 8 between the first and second main electrodes 6 and 7 is arc-shaped as shown in FIG. 6. In short, the first and second electrode surfaces 61 and 71 are curved. In E=V/(krb), "k" is a constant of approximately 5 to 7, and "rb" is a curvature radius of the arc-shaped part. An upper limit of a minimum curvature radius "rb" is a half of the line width of the first and second main electrodes 6 and 7. When the line width is 10 nm, an equivalent of the field intensity can be attained by applying a voltage which is 2.5 to 3.5 times as large as that in the parallel plate state.

Further, if the size of the fine particles 80 is equal to or less than several 10 nm, electric energy necessary for charging the fine particles 80 will be increased, so that a current will be controlled. In this case, a so-called Coulomb blockade phenomenon will be caused. In other words, even if the conductive fine particles 80 are joined and short-circuit the space between the first and second main electrodes 6 and 7, a flow of the man current can be suppressed, and such problems as abnormal heat caused by an excess current can be prevented. Charging energy of the fine particles 80 can be expressed by $(\frac{1}{2})q^2/C$, where "q" denotes an electric charge, and "C" denotes electrostatic capacitance. Since the electric charge q is always an integral multiple of elementary charges (approximately $1.6 \times 10^{-19}$ C), minimum energy to incorporate one electron in the fine particles 80 will be $(\frac{1}{2})e^2/C$. The Coulomb blockade phenomenon will occur when the charging energy exceeds thermal fluctuation energy kT at a room temperature (operation temperature), where "k" is a Boltzmann constant, and T is an absolute temperature. The electrostatic capacitance is, therefore, required only to satisfy $C < e^2/(2kT)$. When the absolute temperature T is 300 K, this condition correspond to the static capacitance $C < 3 \times 10^{-18}$ F. If the medium is vacuum, and if the fine particles 80 are spherical, this condition is satisfied when the diameter of the fine particles 80 is smaller than 28 nm.

The structure of the switching element 6 before and after the formation thereof will be described in detail. Referring to FIG. 7, in the switching element 5, a number of fine particles 80 are dispersed between the first and second main electrodes 6 and 7 (shown in FIG. 3). In this state, the fine particles 80 are in an untidy state, i.e., the channel region 8 is incomplete. When applying a voltage V, which does not organize fine particles 80, between the first and second main electrodes 6 and 7, a main current does not flow linearly, and is locally interrupted. This means that a part of the main current flows as a tunneling current.

Figure 4:
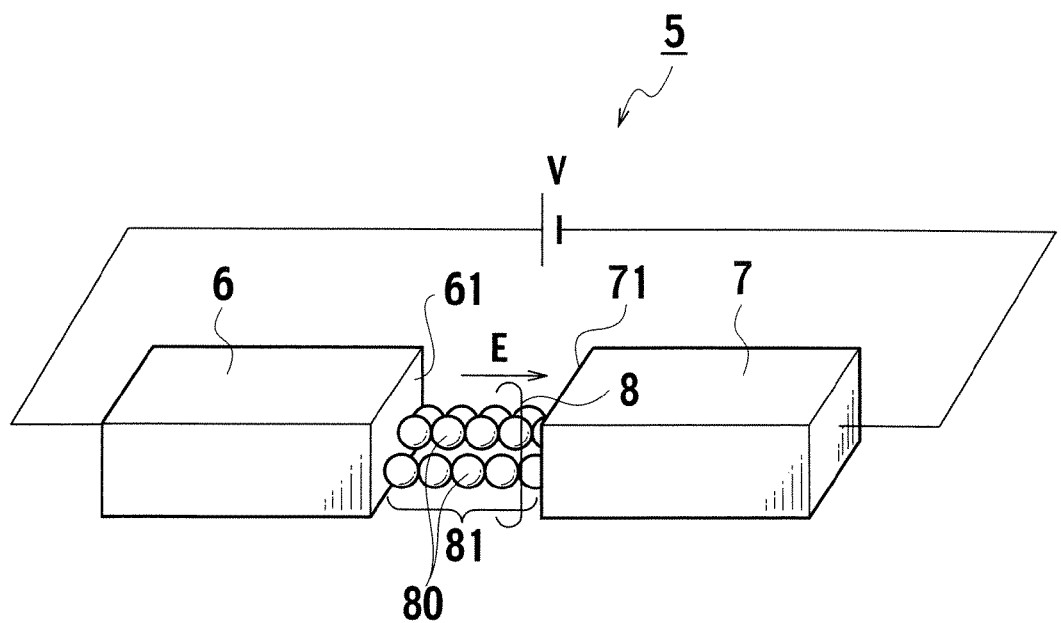
FIG. 4 is a schematic perspective view showing the switching element in a second manufacturing process.

Referring to FIG. 8, the switching element 8 includes a plurality of unit channels 81 which are constituted by fine particles 80 aligned between the first and second main electrodes 6 and 7 (shown in FIG. 4 in direct physical contact). In this state, the channel region 8 is completed. A main current route is formed in the channel region 8, and has a size depending upon a length of the unit channels 81 and a width (channel width) defined by the number of unit channels 81. The length of the unit channel 81 is defined by the size of the fine particles 80. The main current does not flow as the tunneling current in this switching element 5, contrary to the switching element 5 shown in FIG. 7.

It is possible to check whether the fine particles 80 remain untidy (as shown in FIG. 7) or they are aligned (as shown in FIG. 8) by measuring the main current flowing to the channel region 8. This represents that the switching element 5 of the first embodiment is applicable not only as a 3-terminal element but also as 2-terminal element, i.e., as an anti-fuse.

Generally speaking, the finer the element for the purpose of the micro-fabrication, the smaller the sectional area of the element. With the IGFET, scaling down the element size reduce the channel width, and decrease an amount of current for enabling the IGFET to operate external elements. In order to protect the element against degradation of its performance and enable the element to operate as designed, the following conditions have to be satisfied: the current routes should have a uniform length, i.e., a plurality of fine patterns should be arranged in parallel without having different lengths of current route; and a current flow should be controlled simultaneously. The switching element 5 shown in FIG. 8 is structured to meet the foregoing requirements, and has a length (a length of the current routes) expressed by the formula (3).

Channel length=2×(radius of the fine particles 80)× (No. of the fine particles in a linear line)  (3)

The number of aligned fine particles 80 is always an integer. Therefore, if the fine particles 80 have a uniform diameter (i.e., the same diameter), a length $L_{BC}$ of the unit channels 81 in the channel region 8 is the same. This means that the channel length of the channel region 8 is the same in a plurality of switching elements 5.

(3) First Modification of Switching Element

FIG. 9 shows that the length $L_{BC}$ of the unit channel 81 always remains constant even when the distance between the first and second electrode surfaces 61 and 71 is shortened by $L_S$ because of unknown factors in the lithography process during the fabrication of the switching element 5, for instance. The effective length $L_{BC}$ of the unit channel 81 denotes a length of the current route, through which the current flows a shortest distance. The current route passing through one fine particle 80 corresponds to a total of every two radii (i.e., diameter) of the fine particle 80 between the first and second electrode surfaces 61 and 71, even when the fine particles 80 remain in the untidy state.

(4) Second Modification of Switching Element

Referring to FIG. 10, large fine particles 80L and small fine particles 80S are present in the unit channel 81. However, even in this situation, the dispersion of the length of the unit channel 81 can be suppressed due to the averaging effect. As each unit channel 81 includes a total of five fine particles 80L and 80S in FIG. 10, the dispersion of the length of the unit channel 81 can average out by five and become much smaller than the dispersion of the diameter of the fine particles 80L and 80S. By arranging the large and small fine particles 80L and 80S and determining the number of thereof in appropriate ways, a plurality of unit channels 81 can have small enough dispersion of the length, i.e., substantially the uniform length $L_{BC}$.

(5) Third Modification of Switching Element

Figure 11A:
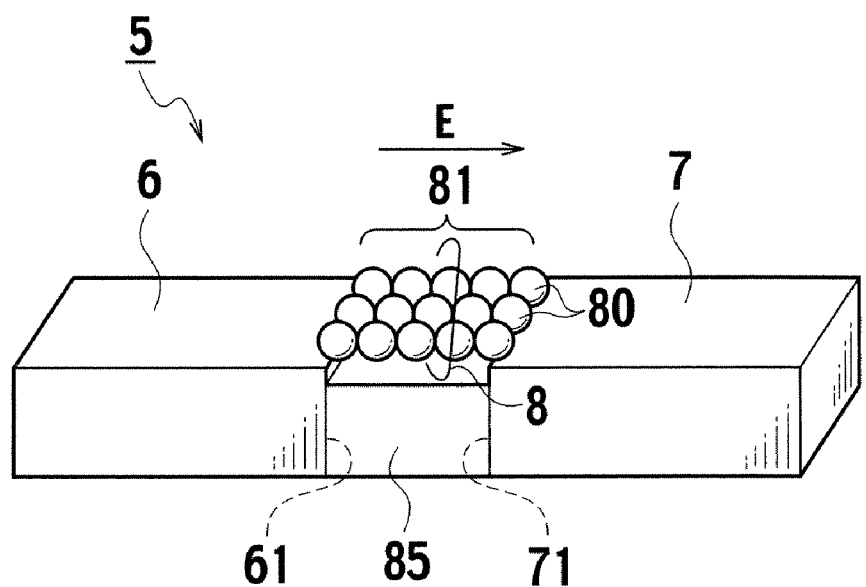
FIG. 11A is a schematic perspective view of a third modified example of the switching element in the first embodiment.
Figure 11B:
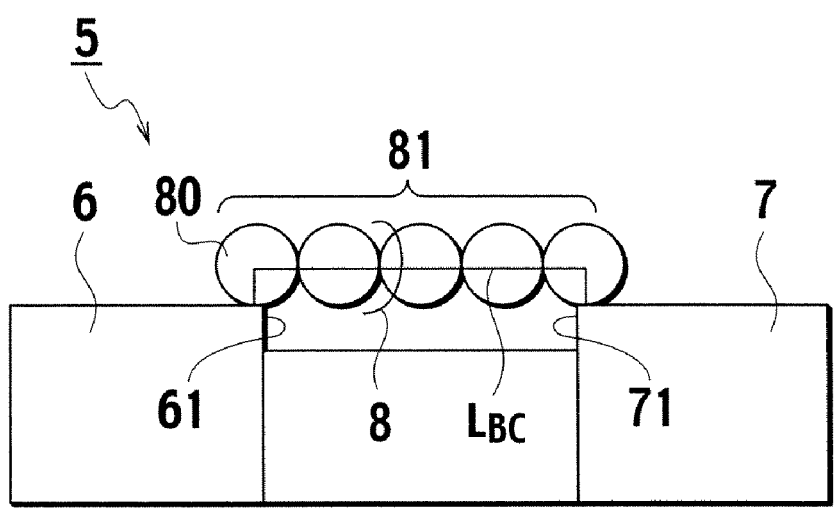
FIG. 11B is an enlarged cross section of an essential part of the switching element of FIG. 11A.

FIG. 11A and FIG. 11B show that the fine particles 80 stick out of the space between the first and second electrode surfaces 61 and 71. It is possible to substantially keep the length $L_{BC}$ of the unit channels 81 in the channel region 8 even if the fine particles 80 are not in the space. In this case, the switching element 5 is made based on the fact that the electric field E acting between the first and second main electrodes 6 and 7 extends outside the space between the first and second electrode surfaces 61 and 71. Further, the switching element 5 includes an insulator 85 which is filled between the first and second electrode surfaces 61 and 71 to a level below upper parts thereof. The insulator 85 is configured based on dielectric polarization, which causes repulsion between the insulator 85 and fine particles 80 because of the interaction of dipole moment. The length $L_{BC}$ of the unit channel 81 is derived by the formula (3). The channel region 8 of the switching element 5 shown in FIG. 11A and FIG. 11B is present between the first and second electrode surfaces 61 and 71 in the top plan view, and at the upper parts of the first and second main electrodes 6 and 7 when viewed stereoscopically.

(6) Fourth Modification of Switching Element

Figure 12A:
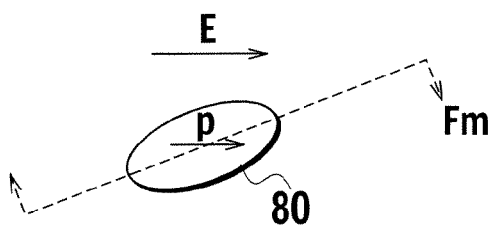
FIG. 12A and FIG. 12B schematically show how force acts on fine particles in a channel region of the switching element in a fourth modified example of the first embodiment.
Figure 12B:
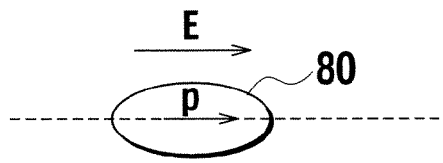

This modification relates to a switching element 5 which includes the channel region 8 having oval fine particles 80. In this case, it is necessary to consider anisotropy of a polarization axis of the fine particle 80. Referring to FIG. 12A and FIG. 12B, the polarization p of the fine particle 80 in an external electric field E is largest and the total energy is minimized when the major axis of the fine particle 80 is oriented to the direction of the electric field E. In this case, a couple of forces Fm are applied to the oval fine particle 80 in addition to the dipole interaction in order that the long axis of the oval extends in the same direction as that of the electric field E.

Figure 13A:
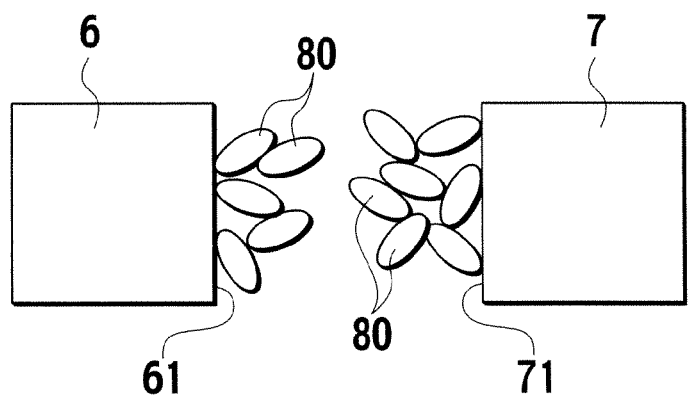
FIG. 13A is a schematic cross section of the switching element in the fourth modified example, the switching element being in the first manufacturing process.
Figure 13B:
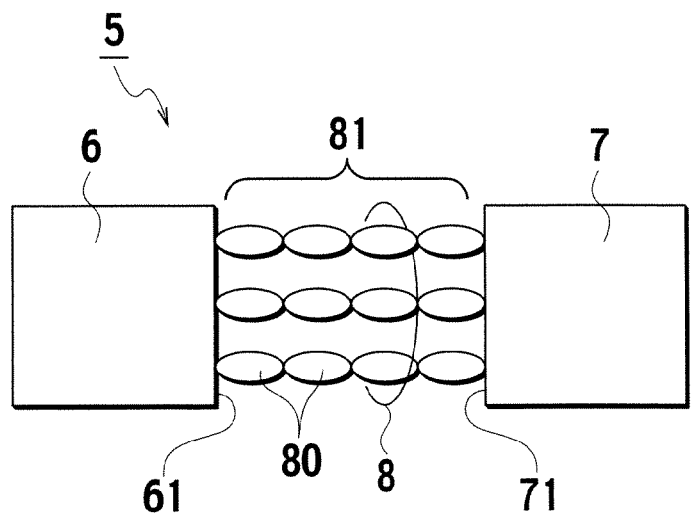
FIG. 13B is a schematic cross section of the switching element in the fourth modified example, the switching element being in the second manufacturing process.

Referring to FIG. 13A, the oval fine particles 80 are placed with their major axes oriented at random between the first and second electrode surfaces 61 and 71. When the voltage V is applied between the first and second main electrodes 6 and 7, as shown FIG. 13B, the couple of forces Fm are applied to the oval fine particles 80, so that the major axes of the oval fine particles 80 are aligned, and the center of gravity is ordered. Therefore, the oval fine particles 80 are tied in a row with their major axes aligned in the first direction. In other words, each unit channel 81 is constituted by the aligned oval fine particles 80, thereby forming the channel region 8. The switching element 5 including the foregoing channel region 8 can have a large ON/OFF ratio.

(7) Fifth Modification of Switching Element

In a switching element 5, fine particles 80 are aligned using magnetization dipole interaction in place of the electric polarization dipole interaction, thereby forming the channel region 8. The magnetization dipole interaction has a proportionality factor which differs from that of the electric polarization dipole interaction given by the formula (1), but is dependent upon a distance and angle of dipoles similarly in response to the magnetization.

Figure 14A:
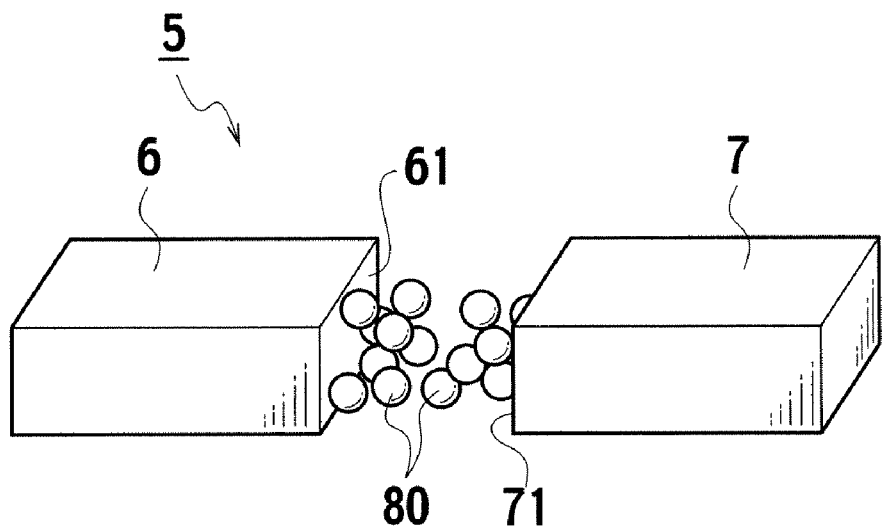
FIG. 14A is a schematic cross section of the switching element in a fifth modified example, the switching element being in the first manufacturing process.
Figure 14B:
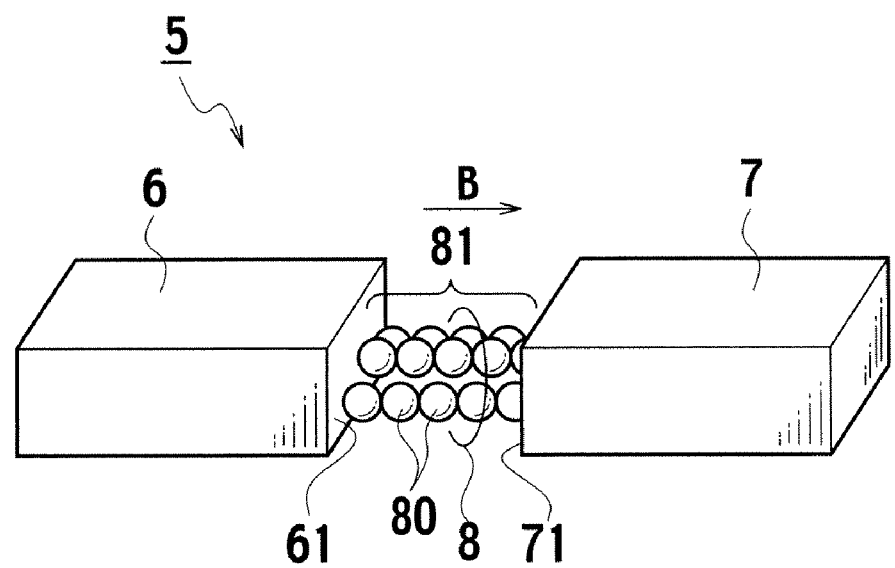
FIG. 14B is a schematic cross section of the switching element in the fifth modified example, the switching element being in the second manufacturing process.

As shown in FIG. 14A, fine particles 80 are applied at random between the first and second electrode surfaces 61 and 71. In this case, the first and second main electrodes 6 and 7 are made of magnetic materials. The fine particles 80 are also made of a magnetic material. When an external magnetic field B is applied, as shown FIG. 14B, the dipole interaction acts on the fine particles 80, a plurality of unit channels 81 having the fine particles 80 tied are made, and the channel region 8 is constituted. The external magnetic field B is used to magnetize the fine particles 80 in place of the magnetic field E. The first and second main electrodes 6 and 7 do not have to be magnetic themselves. In the fifth modification, since the first and second main electrodes 6 and 7 are made of the magnetic materials, the dipole interaction acts between the first main electrode 6 and the fine particles 80, and between the second electrode 7 and the fine particles 80. Therefore, the fine particles 80 can be reliably bonded.

(8) First Specific Use of Switching Element

In the switching element 5 of the first embodiment, and in the switching elements of the first to fifth modifications, once the fine particles 80 are aligned, they are metastable and can maintain their state even after the electric field E or the magnetic field B is removed. However, if the channel region 8 is heated, the fine particles 80 can obtain thermal kinetic energy, so that the fine particles will be disarrayed. Further, if the electric field E or the magnetic field B whose direction is different from that used for aligning the fine particles 80, the fine particles 80 can be disarranged. Using this phenomenon positively, the ON/OFF state between the first and second main electrodes 6 and 7 can be switched over in the switching element 5.

On the contrary, in order to keep the fine particles 80 reliably aligned, the fine particles 80 themselves, the first main electrode 6 and the fine particles 80, and the second main electrode 7 and the fine particles 80 should be firmly bonded. For this purpose, the foregoing components are preferably exposed to light, for instance. Specifically, light is illuminated to fine particles 80 whose diameter is equal to or less than several ten nm, in order to excite plasmons and produce a very firm energy density between the fine particles 80, between the first main electrode 6 and the fine particles, and between the second main electrode 7 and the fine particles 80. Using the energy density, a local photochemical reaction or a local heating effect is induced, so that chemical bonding is locally caused to join the foregoing components. Accordingly, the aligned fine particles 80 can be reliably bonded. Further, so long as the electric field E or the magnetic field B remains applied, the fine particles 80 can keep their aligned state even if the channel region 8 is heated. Resistance heat generated by the current flowing through the unit channels 81 (resistive element) can be used to heat the fine particles 80.

(9) Second Specific Use of Switching Element

Figure 15A:
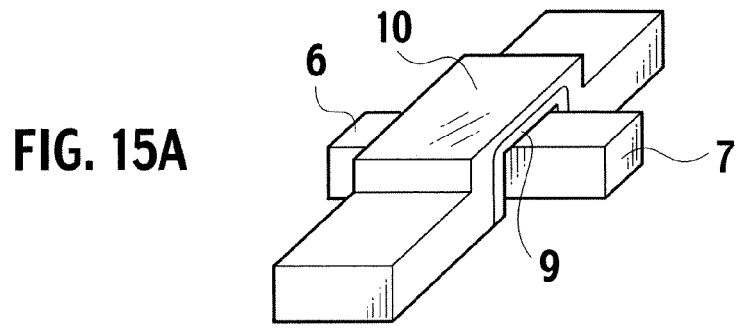
FIG. 15A is a schematic perspective view of the switching element in the first embodiment, showing how the switching element is used in a second use in the first embodiment.
Figure 15B:
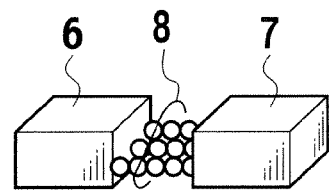
FIG. 15B is a schematic perspective view showing first and second main electrodes and a channel region of the switching element.
Figure 15C:
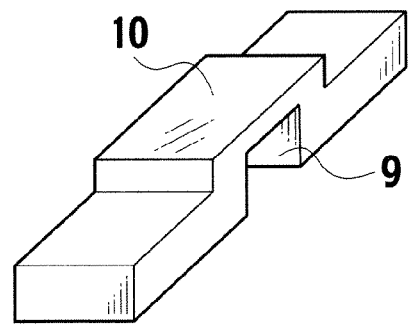
FIG. 15C is a schematic perspective view of an insulating film and a control electrode.

FIG. 15A shows a simple structure of the switching element 5 in a specific example. FIG. 15B shows a structure of the first main electrode 6, second main electrode 7, and channel region 8 of the switching element 5. FIG. 15C shows a structure of the insulating film 9 and the control electrode 10. In the switching element 5, the fine particles 80 are dispersed between the first and second main electrodes 6 and 7, and the electric field E or the magnetic field B is applied, thereby making a plurality of unit channels 81. In this state, the channel region 8 is completed. Refer to FIG. 15B. The insulating film 9 is made on the channel region 8, on which the control electrode 10 is made. See FIG. 15C. After the foregoing processes, the switching element 5 will be completed as a three-terminal element. In the switching element 5, the current flowing to the channel region 8 can be controlled by the field effect from the control electrode 10.

Figure 16:
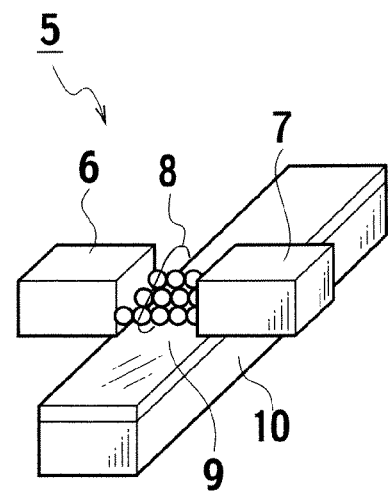
FIG. 16 is a schematic perspective view of the switching element, showing a further use in the first embodiment.

Further, the switching element 5 may be structured as shown in FIG. 16. Specifically, the insulating film 9 is placed on the control electrode 10. The fine particles 80 are aligned on the insulating film 9 in order to make the channel region 8. In this instance, the control electrode 10 and the channel region 8 are vertically counterchanged.

In the switching element 5 and the semiconductor device 1 including the switching element 5 of the first embodiment, the minute patterns can be precisely and reliably put into practice, and can be easily controlled. Variations of the length of the channel region 8 of the switching element 5 can be reduced in comparison with variations of the length defined by the lithography process. Further, the current-voltage characteristics of the switching element 5 can be made uniform.

[Specific Method of Manufacturing Switching Element and Semiconductor Device]

The switching element 5 and semiconductor device 1 will be manufactured as shown in FIG. 17 to FIG. 27.

First of all, a 720 µm-thick substrate 2 is prepared, and is cleaned using hydrofluoric acid. An insulating film 3 is formed on the substrate 2. The insulating film 3 is made of a silicon oxide film 3 ($SiO_2$) which has grown to a thickness of 300 nm at 950° C. using the thermal oxidation process. Alternatively, an isolation-insulator film for isolating adjacent MISFET, MOSFET or the like fabricated on different parts of the substrate 2 may be utilized for the insulating film 3. For instance, if the shallow trench isolation process (STI) is utilized in the fabrication process in the first embodiment, a process for making silicon oxide film to be filled in an STI trench may be used also for making the insulating film 3. The silicon oxide film may be made from tetra ethoxy silane (TEOS) by the chemical vapor deposition (CVD), for instance.

Although not shown, a resist mask having a 10 nm open pattern is made on the insulating film 3 using the lithography process. The open pattern extends over the first main electrode 6, the second main electrode 7, and the channel region 8. The first and second main electrodes 6 and 7 are electrically connected to wirings provided over them later. A part of the wiring connected to the first main electrode 6 and a part of the wiring connected to the second main electrode 7 may be provided when the open pattern is made. The foregoing connecting parts may be in the shape of a comb. The insulating film 3 exposed out of the open pattern is etched using the resist mask. As shown in FIG. 18A and FIG. 18B, a trench 3T is made on the insulating film 3 in order to make the switching element 5. The reactive ion etching process using a $CHF_3$ and CO gas is preferably applied for the etching process. The trench 3T is 20 nm depth, for instance.

Referring to FIG. 19A and FIG. 19B, a main electrode film 65 is made on the insulating film 3 in order to fill the trench 3T. The main electrode film 65 is preferably made of a polycrystal silicon film doped with phosphor P which is mainly made from silane with added $PH_3$ by the low pressure CVD (LPCVD). The poly-crystal silicon film is 90 nm thick.

As shown in FIG. 20A and FIG. 20B, the main electrode film 65 has its top surface set back by the etching-back process, and is buried in the trench 3T. The other part of the main electrode film 65 is removed. The etching-back process is preferably carried out by the reactive etching using HBr and $O_2$ gases. The reactive ion etching process is completed on the basis of end point detection when the surface of the insulating film 3 is exposed. Accordingly, the main electrode film 65 is self-aligned in the trench 3T.

Thereafter, a resist mask 51 having an open pattern is made on a part in the insulating film 3 where the channel region 8 of the switching element 5 is to be made. For this purpose, the lithography process is utilized. The open pattern in the resist mask 51 has a 10 nm length for defining the channel length, and a 30 nm length for defining the channel width. Since the channel width is determined on the basis of the width of the trench 3T, the size of the open pattern of the resist mask 51 is equal to or larger than the sum of the width of the trench 3T and a minimum alignment allowance.

As shown in FIG. 21A and FIG. 21B, a part of the main electrode film 65 exposed from the open pattern of the resist mask 51 is removed, thereby making a trench 8T for the channel region 8. The length of the trench 8T corresponds to the channel length, and is defined by the open pattern of the resist mask 51. The width of the trench 8T is defined by that of the trench 3T. The remaining main electrode film 65 is used to make the first and second main electrodes 6 and 7. The first and second electrode surfaces 61 and 71 define the trench 8T. To make the trench 8T, or to partially remove the main electrode film 65, the reactive ion etching process using the HBr and $O_2$ gases is preferably utilized. Referring to FIG. 21B, the size of the open pattern for defining the channel width is larger than the width of the trench 3T. Although a part of the insulating film 3 is exposed from the open pattern, the insulating film 3 is not practically etched. This is because an etching rate of the main electrode film 65 is set to be larger than that of the insulating film 3. Therefore, only the main electrode film 65 is selectively etched. In the lithography process, alignment requirements of the channel width direction (in the second direction) in the open pattern can be alleviated, and may be ±10 nm under the foregoing conditions, which is effective in boosting yield of the switching element and semiconductor device.

The fine particles 80 are sprayed into the trench 3T where the channel region 8 will be made, as shown in FIG. 22A and FIG. 22B. In the first embodiment, since the resist mask 51 is left at this stage, the fine particles 80 are also sprayed onto the whole area of the resist mask 51. The fine particles 80 are Si particles which has the average diameter of 2 nm, are suspended in isopropyl alcohol, and are discharged as minute droplets via a high-voltage-applied nozzle. The isopropyl alcohol in the minute droplets is evaporated before they reach the surface of the substrate 2, i.e., the surface of the resist mask 51. This means that only the Si fine particles 80 are sprayed onto the resist mask 51. A dispenser for the fine particles 80 will be described later.

Figure 23A:
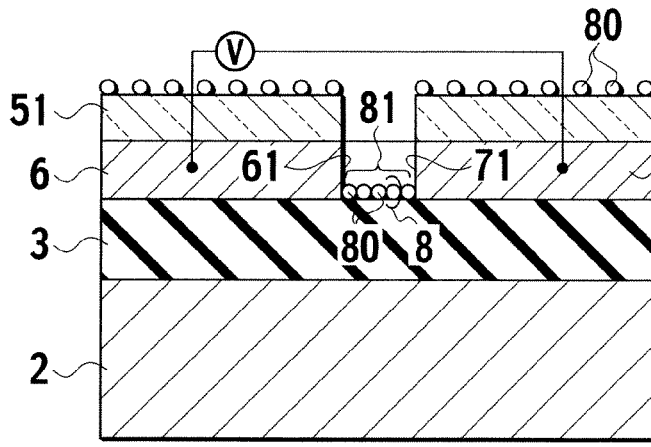
FIG. 23A is a cross section of the switching element in a seventh manufacturing process.
Figure 23B:
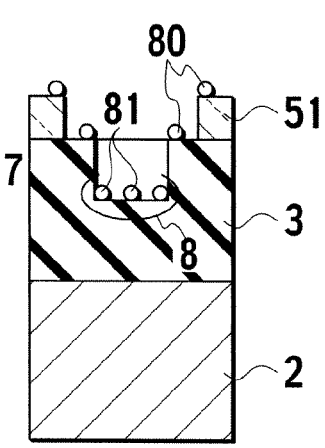
FIG. 23B is a cross section of the central part of the switching element in FIG. 23A.

A voltage of 1 V is applied between the first and second main electrodes 6 and 7, so that the electric field E is generated in the first direction from the first electrode surface 61 to the second electrode surface 71, as shown in FIG. 23A and FIG. 23B. Because of the electric field E, the attractive force acts on the fine particles 80 arranged at random, so that a plurality of unit channels 81 are formed. In each unit channel 81, the fine particles 80 are lined up in the first direction. Adjacent unit channels 81 are separated by the repulsive force acting on them. In other words, the plurality of unit channels 81 form the channel region 8. In this state, ArF excimer laser is illuminated onto the fine particles 80, so that they are bound together in the unit channels 81. Fine particles 80 at one end of each unit channel 81 are bonded to the first electrode surface 61 while fine particles 80 at the other end of each unit channel 81 are bonded to the second electrode surface 71.

Figure 24A:
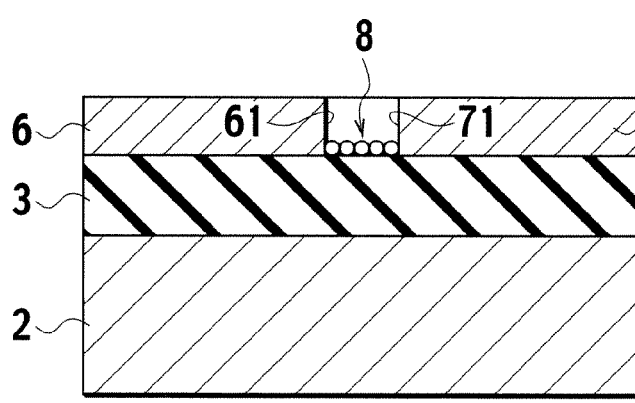
FIG. 24A is a cross section of the switching element in an eighth manufacturing process.
Figure 24B:
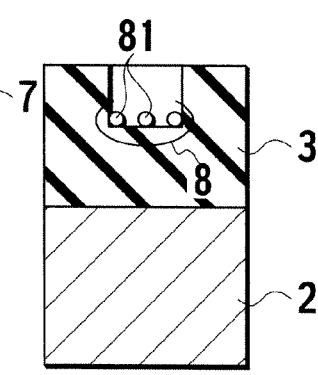
FIG. 24B is a cross section of the central part of the switching element in FIG. 24A.

The resist mask 51 and unnecessary fine particles 80 on the resist mark 51 are removed as shown in FIG. 24A and FIG. 24B. At this stage of the manufacturing process, connection areas (not shown) coupled to the first and second main electrodes 6 and 7, i.e., unnecessary parts of the comb-shaped connection areas, are removed using a new resist mask prepared by the lithography process. The reactive etching process using the HBr and $O_2$ gases is usable for this purpose. The unnecessary parts denote the connection areas where a probe is touched in order to apply the voltage V.

Figure 25A:
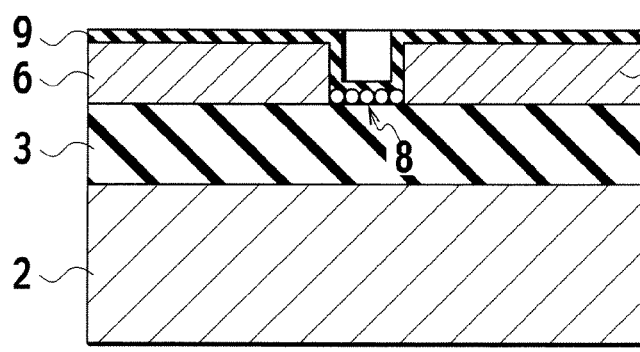
FIG. 25A is a cross section of the switching element in a ninth manufacturing process.
Figure 25B:
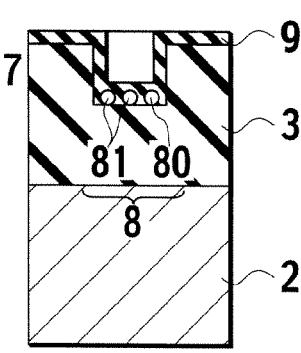
FIG. 25B is a cross section of the central part of the switching element in FIG. 25A.

Referring to FIG. 25A and FIG. 25B, an insulating film 9 is formed on the channel region 8, i.e., on the unit channels 81 or the fine particles 80. The insulating film 9 is preferably a 2 nm-thick $SiO_2$ film which is mainly made from TEOS and deposited by the CVD process. Specifically, the insulating film 9 extends over the fine particles 80, the first main electrode 6, first electrode surface 61, second main electrode 7, and second electrode surface 71. The insulating film 9 is preferably made of a single SiON film, an HfSiON film or the like, or composite films of SiON and $SiO_2$, or HfSiON and $SiO_2$.

Figure 26A:
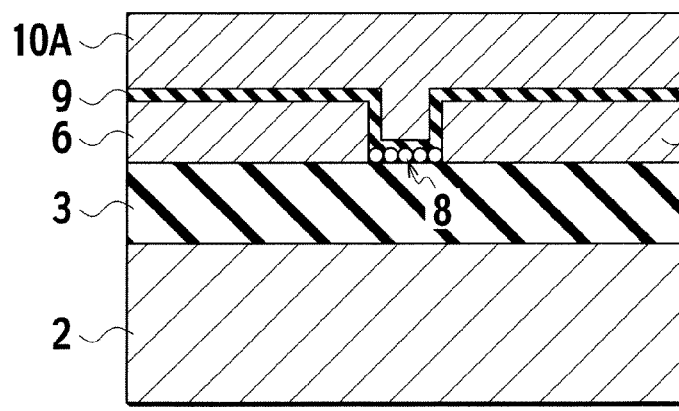
FIG. 26A is a cross section of the switching element in a tenth manufacturing process.
Figure 26B:
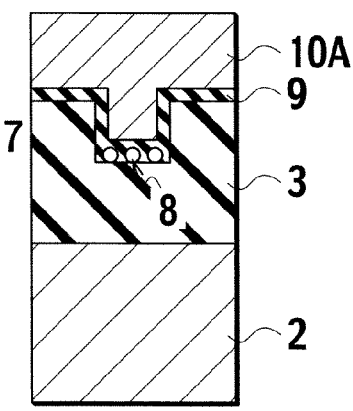
FIG. 26B is a cross section of the central part of the switching element in FIG. 26A.

A control electrode film 10A is deposited all over the substrate 2 including the insulating film 9 as shown in FIG. 26A and FIG. 26B. Specifically, the control electrode film 10A is mainly made from silane added with $PH_3$ by the LPCVD process, e.g., a P-doped poly-crystal silicon film, which is 30 nm thick.

Figure 27A:
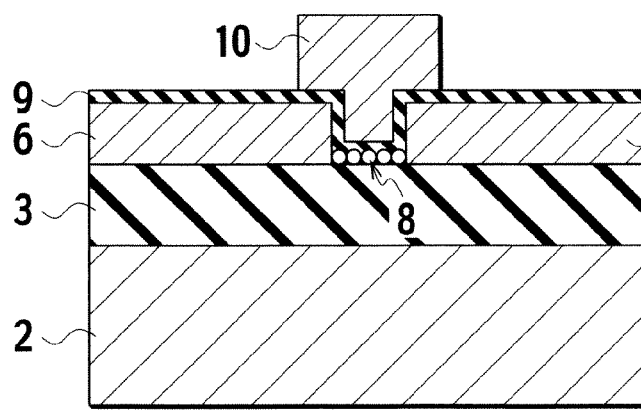
FIG. 27A is a cross section of the switching element in an eleventh manufacturing process.
Figure 27B:
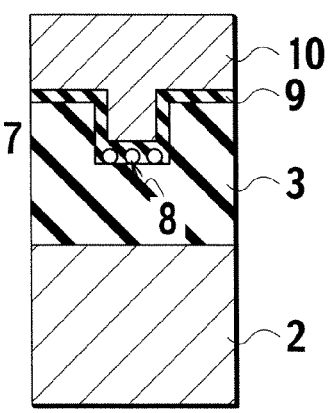
FIG. 27B is a cross section of the central part of the switching element in FIG. 27A.

A 15 nm thick resist mask (not shown) is formed on the control electrode film 10A using the lithography process. The resist mask is used to pattern the control electrode film 10A. As shown in FIG. 27A and FIG. 27B, a control electrode 10 is made using the control electrode film 10A and the resist mask. The reactive ion etching process is preferably applied using HBr and $O_2$ gases for the patterning.

After the foregoing processes, the switching element 5 is completed. In this state, the switching element 5 includes the first and second main electrodes 6 and 7 serving as the source and drain, channel region 8 constituted by the aligned fine particles 80, insulating film 9 functioning as the gate insulating film, and control electrode 10 functioning as the gate electrode.

Figure 2:
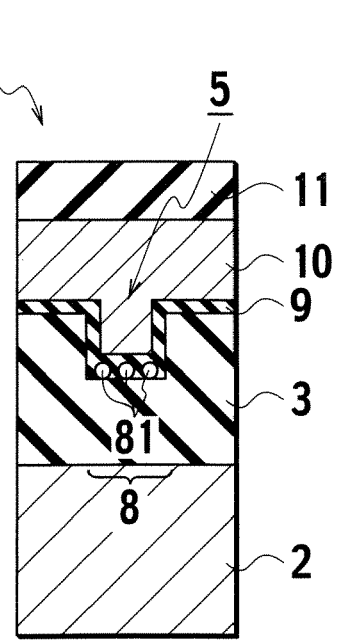
FIG. 2 is a cross section of an essential part of the semiconductor device, taken along line F2-F2 in FIG. 1.

A passivation film 11 is formed all over the substrate 2 and the switching element 5 as shown in FIG. 1 and FIG. 2. The passivation film 11 is mainly made from TEOS by using the CVD process. A 100 nm thick $SiO_2$ film is preferable as the passivation film 11. Although not shown, wirings for the first and second main electrodes 6 and 7 are formed on the passivation film 11. Further, a final passivation film is made on the wirings. In this state, the semiconductor device 1 of the first embodiment is completed.

With the foregoing fabricating method, it is possible to -fabricate the fine patterns, to improve the precision of the patterns, and to easily control the positions of the patterns.

[Configuration of Dispenser]

A fine particle dispenser 100 (called the "dispenser" 100) used to make the switching element 5 and semiconductor device 1 will be described hereinafter.

Figure 28:
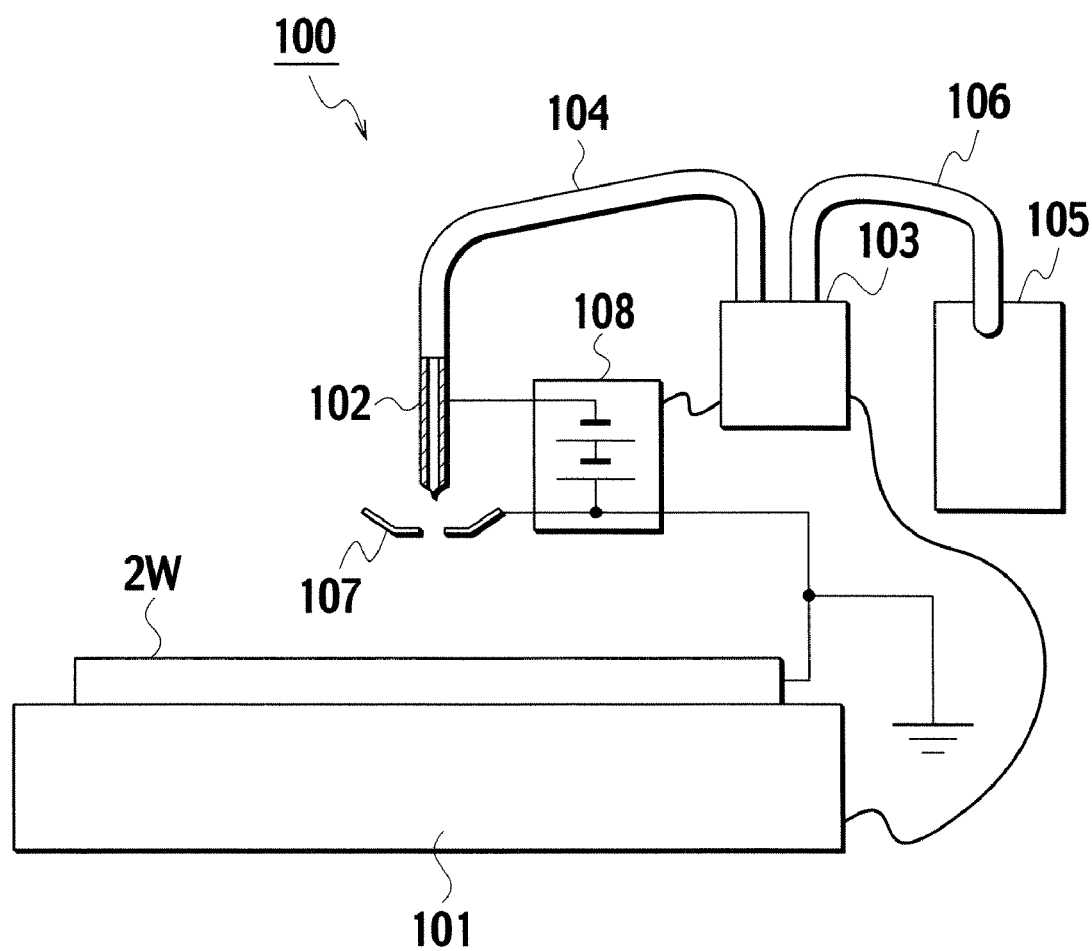
FIG. 28 is a schematic view of a dispenser used in the first embodiment.

Referring to FIG. 28, the dispenser 100 includes a substrate stage 101, a hollow needle electrode 102, a pump 103, a pipe 104, a tank 105, a pipe 106, an extraction electrode 107, and a voltage control unit 108. The substrate stage 101 holds a single crystal silicon wafer 2W which is used to make the switching element 5 and the semiconductor device 1. The hollow needle electrode 102 injects a solution in which fine particles 80 are suspended. The pump 103 supplies the solution to the hollow needle electrode 102. The pipe 104 connects the pump 103 and the hollow needle electrode 102. The tank 105 houses the solution. The pipe 106 connects the pump 103 and the tank 105. The extraction electrode 107 extends between the hollow needle electrode 102 and the substrate stage 101. The voltage control unit 108 applies an electric field between an outlet of the hollow needle electrode 102, the extraction electrode 107 and the substrate stage 101.

The voltage control unit 108 applies the electric field to droplets discharged via an outlet of the hollow needle electrode 102, and charges them. An intensity of the electric field for charging droplets is controlled in order that repulsive force caused by the charging becomes larger than the surface tension of droplets before they reach the single crystal silicon wafer 2W.

The tank 105 houses the fine particles 80 which are suspended in a solution. The solution and the fine particles 80 are introduced into the hollow needle electrode 102 via the pump 103. The electric field is produced between the hollow needle electrode 102 and the extraction electrode 107. The solution is discharged as minute droplets toward the substrate stage 101 via the outlet of the hollow needle electrode 102. Since minute droplets have a large ratio of a surface area to a cubic volume, molecules of the solution can be quickly evaporated. Further, since droplets discharged into the electric field have a large amount of charges on their surfaces, the repulsive force acting on charges is very large, and finally become larger than the surface tension of droplets. Thereafter, droplets are split into some minute drips, thereby extensively promoting evaporation of the solution. This process is repeated, and droplets are quickly broken up. Charges are shifted to the fine particles 80, which are charged and separated from one another. The fine particles 80 are not recombined as the repulsive force between charges act. Therefore, the fine particles 80 individually reach the single crystal silicon wafer 2W.

On the contrary, if the solution in which fine particles 80 are simply suspended is applied onto the single crystal silicon wafer 2W without the generation of the electric field, solvent molecules of the solution will be evaporated without separation between the fine particles 80. This means reducing the spaces between the fine particles 80 while evaporating the solvent and reducing the size of droplet, as the surface tension of the droplets is dominant.

The electric field applied between the hollow needle electrode 102 and the extraction electrode 107 is controlled by a voltage outputted by the voltage control unit 108, which also controls the voltage between the extraction electrode 107 and the single crystal silicon wafer 2W. In other words, the voltage control unit 108 can adjust kinetic energy of the fine particles 80 arriving on the single crystal silicon wafer 2W. Further, the voltage control unit 108 can control the supply operation of the pump 103 in conjunction with positioning of the substrate stage 101. For instance, when the single crystal silicon wafer 2W is positioned at the predetermined coordinate on the substrate stage 101, not only the pump 103 starts delivering the solution but also the hollow needle electrode 102 starts spraying the solution including the fine particles 80 via the outlet of the hollow needle electrode 107 under control of the voltage control unit 108. Still further, the voltage control unit 108 controls an amount of solution to be discharged by the pump 103 in accordance with an amount of the fine particles 80 to be sprayed.

The pipe 104 connecting the hollow needle electrode 102 and the pump 103 is made of such a highly insulating resin material as a fluorocarbon resin in order to protect the other components against the voltage applied to the hollow needle electrode 102. The pipe 106 connecting the tank 105 and the pump 103 is made of the same material as that of the pipe 104. The fluorocarbon resin has excellent property to reduce dust.

The switching element 5 and semiconductor device 1 can be fabricated using the dispenser 100 as described so far. Although only one hollow needle electrode 102 is used in the first embodiment, a plurality of hollow needle electrodes 102 may be arranged one-dimensionally, or two-dimensionally, if necessary.

[Modified Method of Dispensing Fine Particles]

In the method of manufacturing the semiconductor device 1 of the first embodiment, it is possible to suppress an insufficient amount of sprayed fine particles 80 or an amount of fine particles 80 spilling from the substrate 2 without use. The dispenser 100 shown in FIG. 28 is inevitable for the foregoing purpose. Installation of the dispenser 100 requires a lot of costs such as an installation cost in a clean room as well as a cost of the dispenser 100 itself. In order to save the foregoing costs, it is preferable to utilize existing facilities. In this modified example, a spin coater and a CMP unit are used in order to disperse the fine particles 80 onto the substrate 2 without agglomerating them.

Since the solution in which the fine particles 80 are simply dispersed in such a medium as an organic solvent or water is less sticky, it is very difficult to produce a uniform film using an ordinary spin coater. In order to overcome this problem, such a high viscosity resin as polyvinyl alcohol is added to the solution. The fine particles 80 can be prevented from agglomerating because of viscosity resistance. Further, not only the viscosity of polyvinyl alcohol can be extensively controlled in a wide range but also is easily soluble in hot water and is slow to be solved in water whose temperature is approximately equal to a room temperature. In short, if the fine particles 80 should be re-applied for some reason, they can be easily removed using hot water which is less expensive and easy to handle. Still further, the fine particles 80 can be easily embedded in the trench using room temperature water as a solvent and using the CMP process.

Polyvinyl alcohol becomes less soluble to room temperature water after heating process. Heating to 100° C. to 180° C. can prevent polyvinyl alcohol from swelling. Further, polyvinyl alcohol is less harmful to the environment, and can be easily treated after use. The plasma ashing process using the popular $O_2$ gas is applicable to remove only polyvinyl alcohol from a mixture of the fine particles 80 and polyvinyl alcohol, thereby leaving only the fine particles 80 on the substrate 2.

Specifically, silicon particles which are prepared by a reverse micelle process and have a 2 nm diameter are used as fine particles 80. The fine particles 80 are dispersed in pure water, thereby making a solution. Polyvinyl alcohol having an average polymerization degree of 1800 is blended in the solution at a weight percent of 3%. A spin coater is used to apply the solution onto the substrate 2 at a speed of 2000 rpm. Thereafter, the coated solution is heated at a temperature of 180° C. for 15 minutes, thereby producing a mixed film on which silicon fine particles are dispersed in the polyvinyl alcohol resin film. Since the solution is very viscous, the mixed film is very uniform. In addition, the trench 8T is made on the substrate 2 at the position where the fine particles 80 should be placed, specifically, where the channel region in the shape of a recess should be made.

The mixed film is polished by using room temperature water and the CMP process. When the polyvinyl alcohol film is polished and solved, fine particles 80 contained in the polyvinyl alcohol film can be also removed. Polishing is completed when the mixed film remains only in the trench 8T. Then, only polyvinyl alcohol is removed using the plasma ashing process with the $O_2$ gas. In this state, as only polyvinyl alcohol is removed, the fine particles 80 can be placed in the channel region without being agglomerated.

Figure 29A:
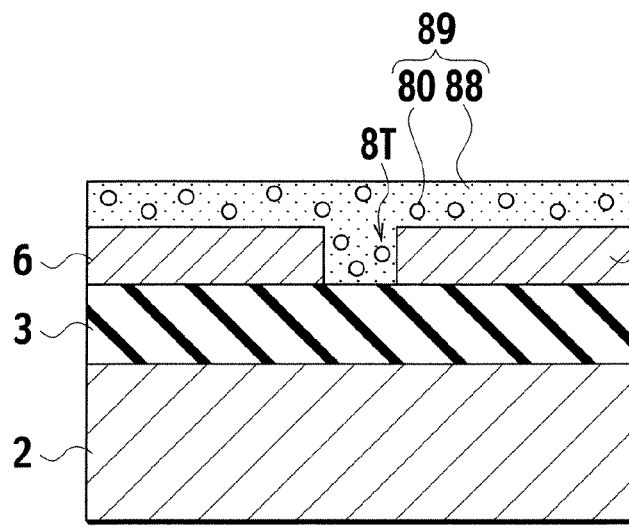
FIG. 29A and FIG. 29B are cross sections of a switching element and a semiconductor device in a modified example of the first embodiment and in a first manufacturing process.
Figure 29B:
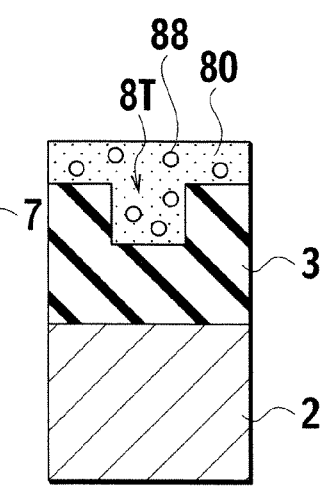

Specifically, in the state shown in FIG. 21A and FIG. 21B, the resist mask 51 is removed. Thereafter, as shown in FIG. 29A and FIG. 29B, the mixed film 89 including the fine particles 80 is formed on the substrate 2 on the insulating film 3 in order to fill the trench 8T. In other words, the silicon particles having the 2 nm diameter and prepared by the reverse micelle process are used as the fine particles 80. The fine particles 80 are dispersed in the pure water, into which polyvinyl alcohol having an average polymerization degree of 1800 is blended at a weight percent of 3%. The spin coater is used to apply the blended solution onto the substrate 2 at a speed of 2000 rpm. Thereafter, the coated solution is heated at a temperature of 180° C. for 15 minutes, thereby making the mixed film 89 of polyvinyl alcohol 88 and fine particles 80.

Figure 30A:
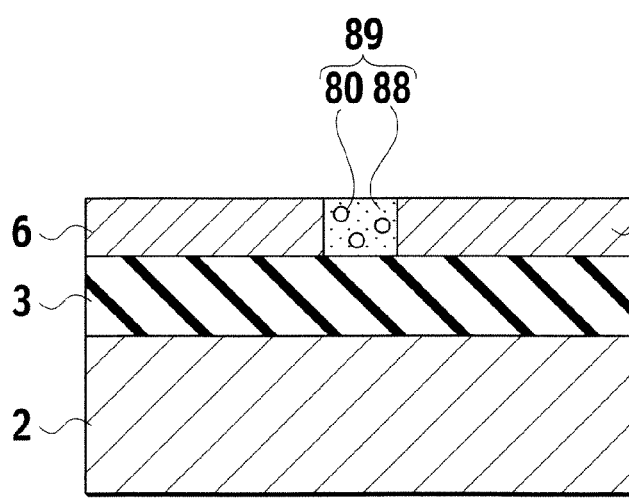
FIG. 30A and FIG. 30B are cross sections of the switching element and the semiconductor device in a modified example of the first embodiment and in a second manufacturing process.
Figure 30B:
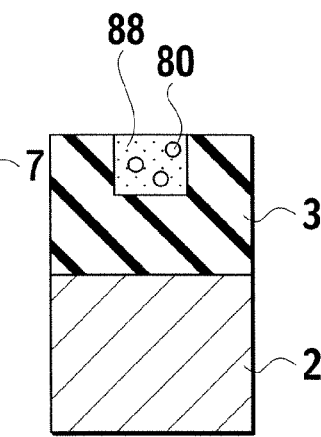
Figure 31A:
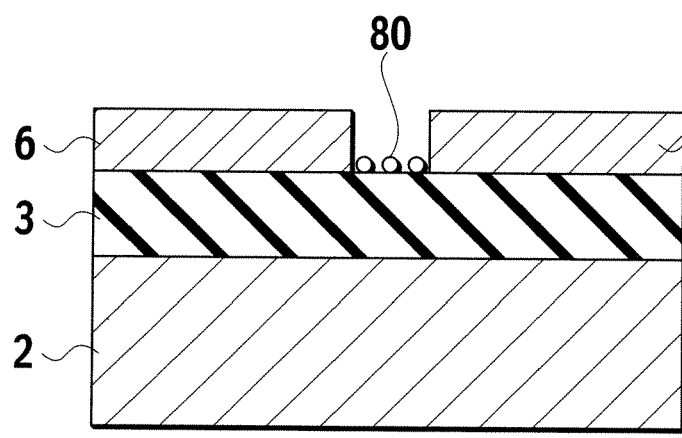
FIG. 31A and FIG. 31B are cross sections of the switching element and the semiconductor device in a modified example of the first embodiment and in a third manufacturing process.
Figure 31B:
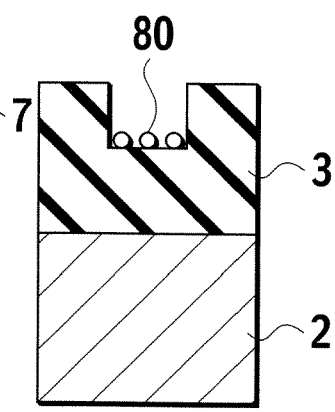

As shown in FIG. 30A and FIG. 30B, the pure water having the room temperature is used to remove a surplus part of the mixed film 89 using the CMP process. Thereafter, the mixed film 89 is subject to the plasma ashing using the $O_2$ gas in order to remove the polyvinyl alcohol 88 from the combined film 89 as shown in FIG. 31A and FIG. 31B. Therefore, only the fine particles 80 are left in the trench 8T of the substrate 2.

Figure 32A:
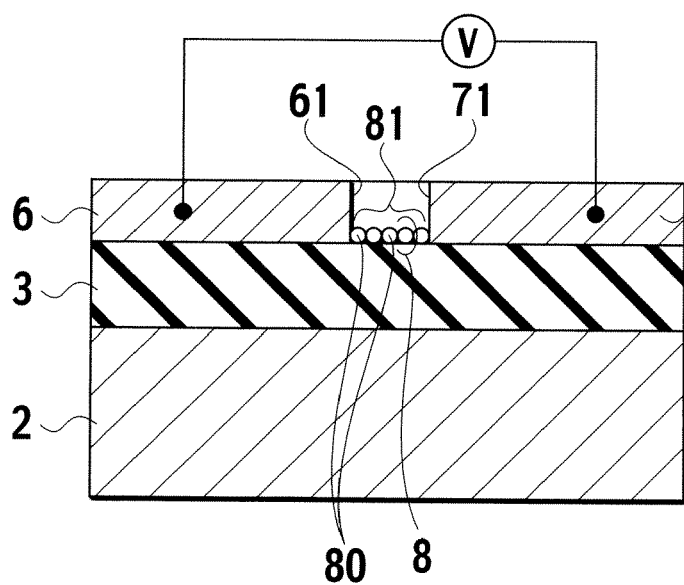
FIG. 32A and FIG. 32B are cross sections of the switching element and the semiconductor device in a modified example of the first embodiment and in a fourth manufacturing process.
Figure 32B:
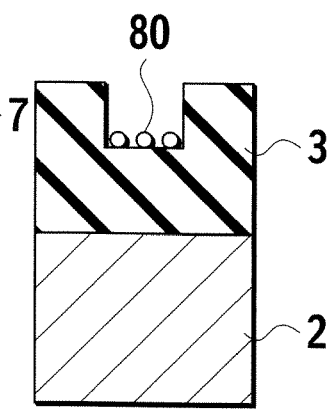
Figure 33:
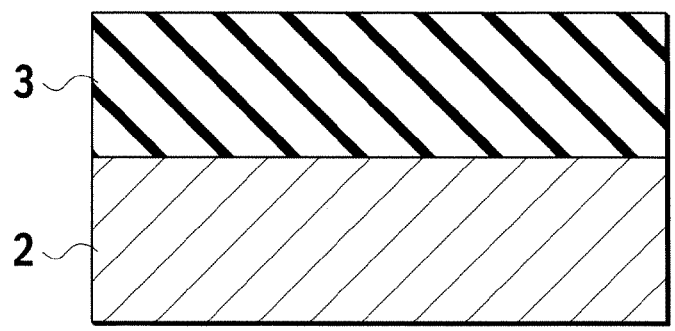
FIG. 33 is a cross section of a switching element and a semiconductor device in the second embodiment and in a first manufacturing process.

For instance, a voltage of 1V is applied between the first and second main electrodes 6 and 7 as shown in FIG. 32A and FIG. 32B. The electric field E is produced in the first direction from the first electrode wall 61 of the first main electrode 6 to the second electrode wall 71 of the second main electrode 7. In response to the production of the electric field E, a plurality of fine particles 80 are aligned in the first direction by the attractive force acting on randomly dispersed fine particles 80. Adjacent unit channels 81 are separated in the second direction by the repulsive force acting on the fine particles 80. The channel region 8 in which a plurality of unit channels 81 are arranged in parallel can be formed. In each unit channel 81, the fine particles 80 are aligned. Then, excimer laser beams are illuminated onto the aligned fine particles 80. The fine particles 80 of the unit channels 81 are bonded. Specifically, the fine particles 80 at one end of each unit channel 80 are coupled to the first electrode wall 61 while the fine particles 80 at the other end of each unit channel 81 are coupled to the second electrode wall 71.

In the foregoing fabrication process, unnecessary areas of the comb-shaped connection region (i.e., the connection region (not shown) connected to the first main electrode 6 and a connection region (not shown) connected to the second main electrode 7) are removed using a resist mask which has been prepared by the lithography process. The reactive etching process using HBr and $O_2$ gas is preferably applied to the foregoing removal. The unnecessary areas mean areas where a probe is contacted in order to apply the voltage for aligning the fine particles 80. After the foregoing process, the fine particles 80 are put into the same state as that shown in FIG. 24A and FIG. 24B. The processes shown from FIG. 25A and FIG. 25B to FIG. 27A and FIG. 27B are performed, so that the semiconductor device 1 will be completed.

Second Embodiment

In the second embodiment, the switching element 5 and semiconductor device 1 will be manufactured as described hereinafter with reference to FIG. 33 to FIG. 48.

First of all, a 720 μm thick substrate 2 is prepared. The substrate 2 is cleaned using hydrofluoric acid. An insulating film 3 is formed on the substrate 2. The insulating film 3 is an $SiO_2$ film which has grown to a thickness of 300 nm at 950° C. using the thermal oxidation process. Alternatively, the insulating film 3 may be an isolation-insulator film for insulating adjacent eMISFET, MOSFET or the like fabricated on a different part of the substrate 2. For instance, when the STI process is adopted in the manufacturing process of the second embodiment, the insulating film 3 may be prepared in the process for making the silicon oxide film to be embedded in the STI trench. The silicon oxide film is mainly made from TEOS using the CVD process.

Figure 34:
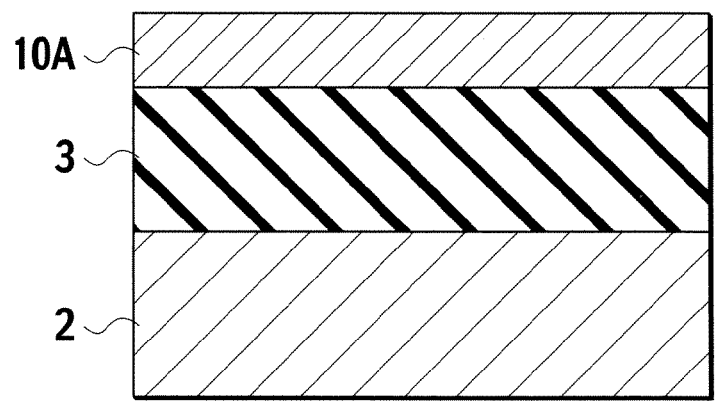
FIG. 34 is a cross section of the switching element and the semiconductor device in the second embodiment and in a second manufacturing process.

Referring to FIG. 34, a control electrode film 10A is formed on the insulating film 3. Specifically, the control electrode film 10A is mainly made from silane added with $PH_3$ by the LPCVD process, e.g., a P-doped poly-crystal silicon film, which is 30 nm thick.

Figure 35:
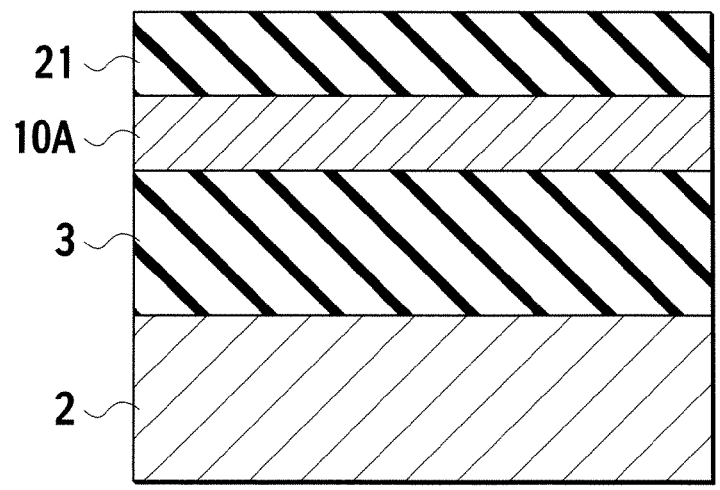
FIG. 35 is a cross section of the switching element and the semiconductor device in the second embodiment and in a third manufacturing process.

An insulating film 21 is made on the control electrode film 10A as shown in FIG. 35. The insulating film 21 is a 50 nm thick silicon nitride film ($Si_3N_4$), which is mainly made from dichloro-silane and ammonium, and is deposited by the LPCVD process.

Figure 36:
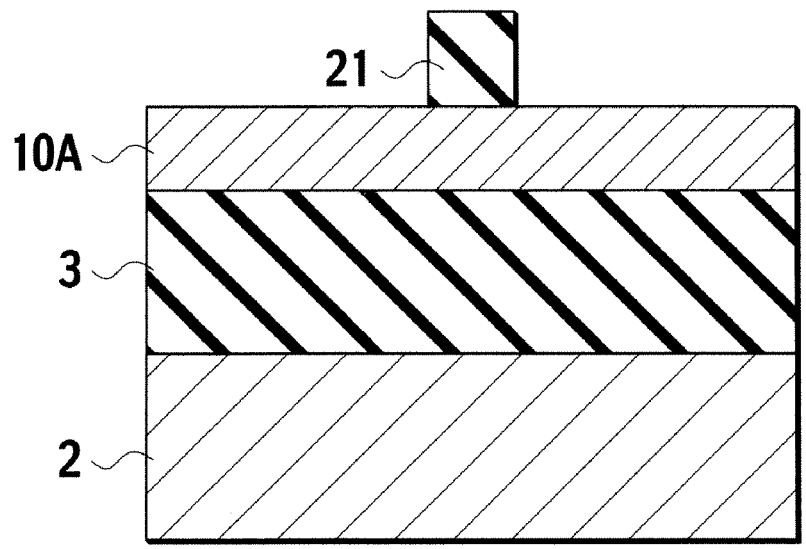
FIG. 36 is a cross section of the switching element and the semiconductor device in the second embodiment and in a fourth manufacturing process.

A resist mask (not shown) having a 10 nm open pattern is made using the lithography process. The insulating film 21 is etched and is patterned using the resist mask as shown in FIG. 36. The reactive ion etching process using $CHF_3$ gas, $CF_4$ gas, and $O_2$ gas is preferable to the patterning. Thereafter, the resist mask is removed.

Figure 37:
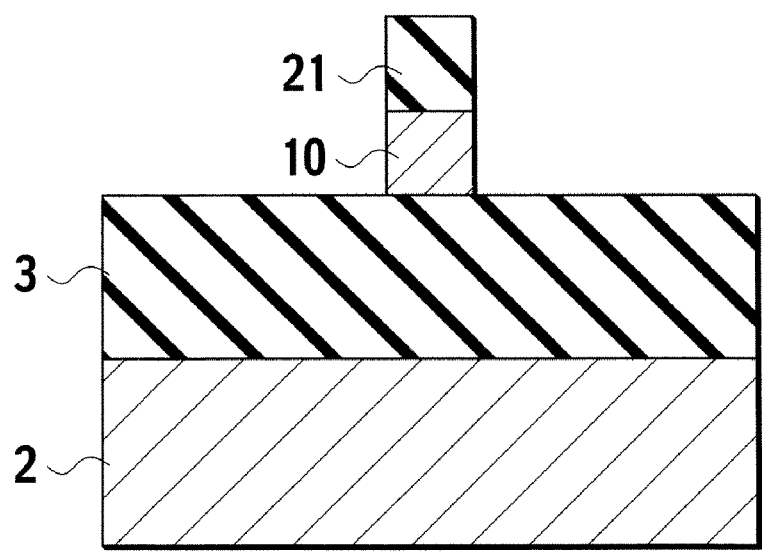
FIG. 37 is a cross section of the switching element and the semiconductor device in the second embodiment and in a fifth manufacturing process.

Referring to FIG. 37, the control electrode film 10A is patterned using the insulating film 21 as an etching mask, thereby making a control electrode 10. The reactive ion etching process using the HBr and $O_2$ gases is preferable to the patterning.

Figure 38:
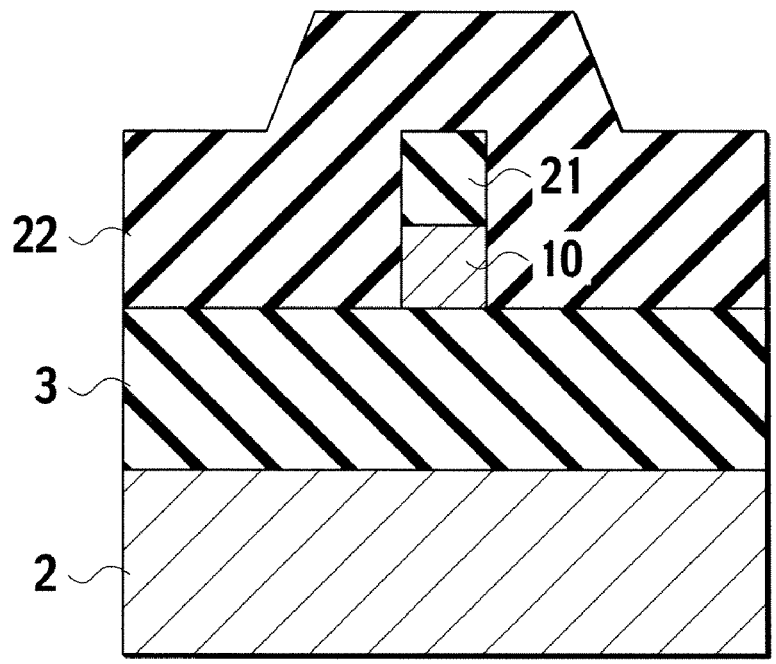
FIG. 38 is a cross section of the switching element and the semiconductor device in the second embodiment and in a sixth manufacturing process.

An insulating film 22 is applied all over the insulating film 21 as well as the substrate 2 as shown in FIG. 38. The insulating film 22 is a 100 nm thick $SiO_2$ film which is mainly made from TEOS and is prepared using the CVD process.

Figure 39:
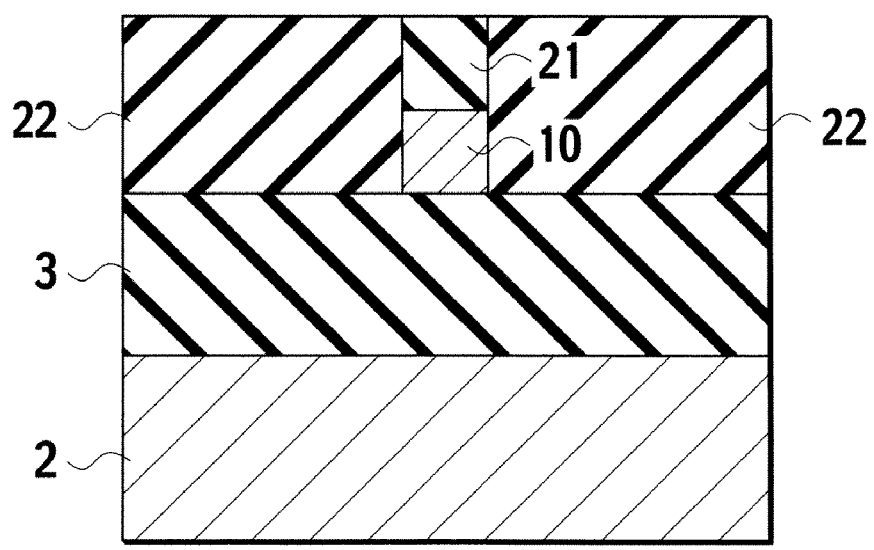
FIG. 39 is a cross section of the switching element and the semiconductor device in the second embodiment and in a seventh manufacturing process.
Figure 40:
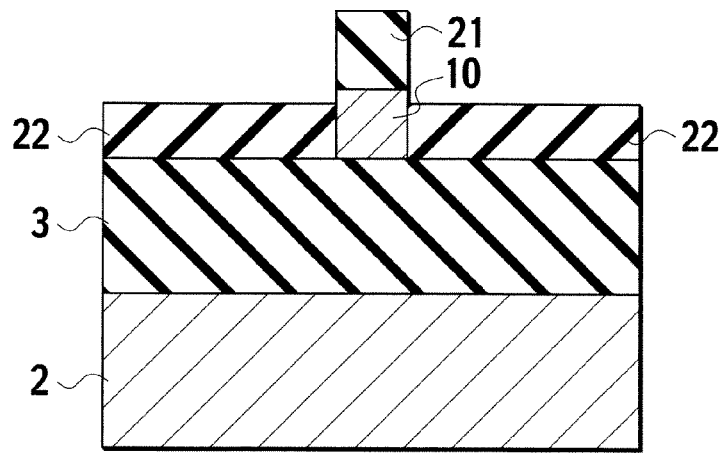
FIG. 40 is a cross section of the switching element and the semiconductor device in the second embodiment and in an eighth manufacturing process.

The insulating film 22 is smoothed by the chemical mechanical polishing (CMP) process using the insulating film 21 as a stop as shown in FIG. 39. Thereafter, the insulating film 22 is etched back from the front surface thereof, so that the insulating film 22 has a given thickness, e.g., 27 nm as shown in FIG. 40. The reactive etching process with the $CHF_3$ and CO gases is preferably used for the etching-back.

Figure 41:
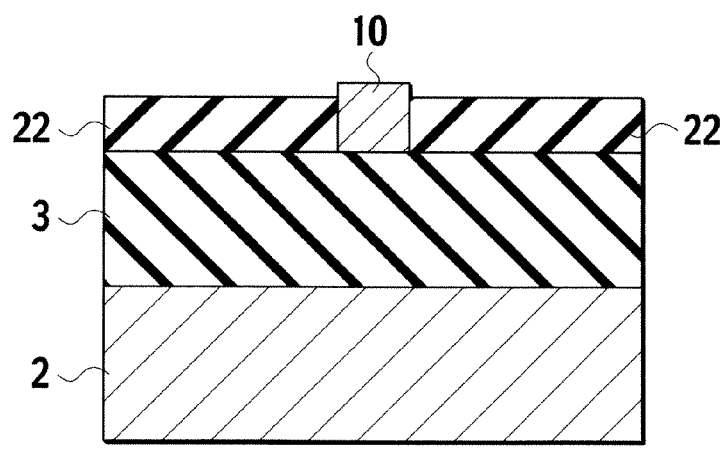
FIG. 41 is a cross section of the switching element and the semiconductor device in the second embodiment and in a ninth manufacturing process.

As shown in FIG. 41, the insulating film 22 is selectively removed from the control electrode 10. The wet etching process with a 160° C. phosphoric acid solution is used for the removal.

Figure 42:
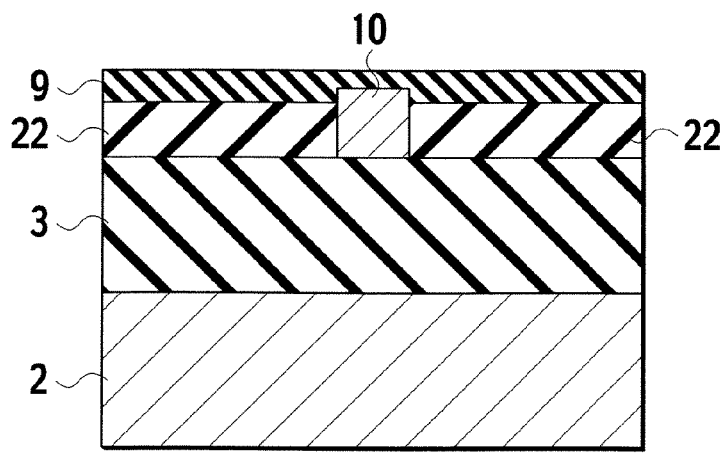
FIG. 42 is a cross section of the switching element and the semiconductor device in the second embodiment and in a tenth manufacturing process.

Referring to FIG. 42, an insulating film 9 is applied over the control electrode 10 as well as the substrate 2. For instance, the insulating film 9 is an $SiO_2$ film which is 3 nm thick, is mainly made of TEOS and is prepared by the CVD process. Alternatively, the insulating film 9 may be such a single film as an SiON film, an HfSiON film or the like, or a composite layer of the SiON film, HfSiON film and an $SiO_2$ film. These films are appropriate to gate insulating films.

Figure 43:
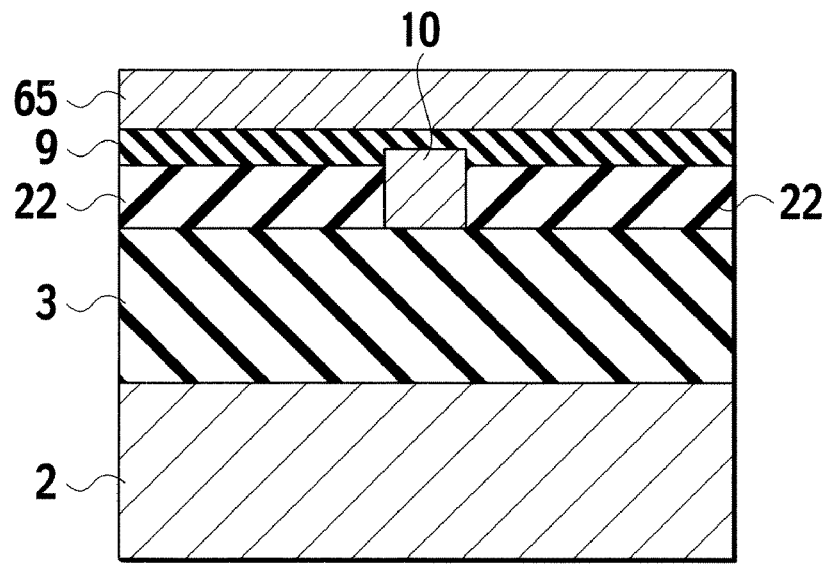
FIG. 43 is a cross section of the switching element and the semiconductor device in the second embodiment and in an eleventh manufacturing process.

A main electrode film 65 is applied all over the insulating film 9 as shown in FIG. 43. The main electrode film 65 is preferably a tungsten (W) film which is 10 nm thick and is prepared by the sputtering process, for instance.

Figure 44:
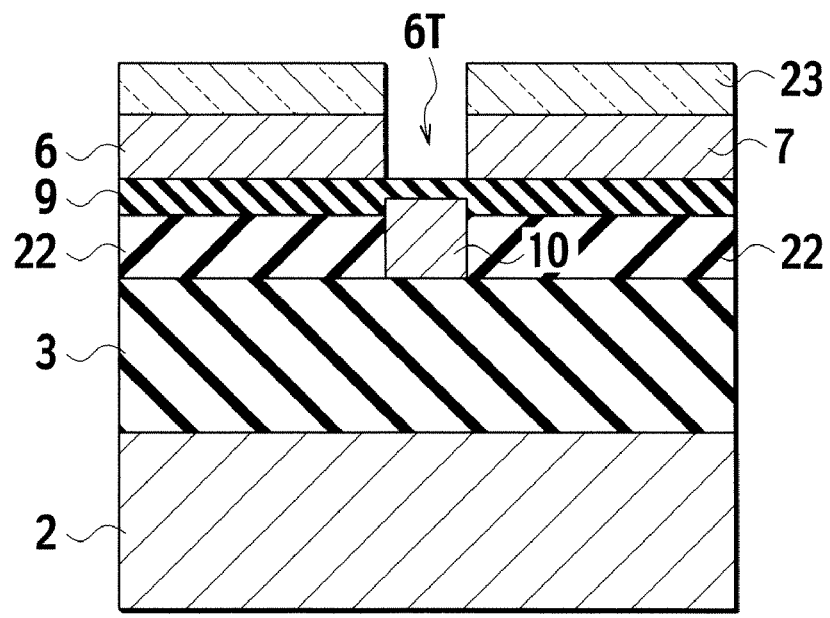
FIG. 44 is a cross section of the switching element and the semiconductor device in the second embodiment and in a twelfth manufacturing process.

A resist mask 23 is prepared by the lithography process. The resist mask 23 is provided with patterns for making the first and second main electrodes 6 and 7, and a connection area pattern (not shown). The main electrode film 65 is patterned using the resist mask 23 as shown in FIG. 44. The part of the switching element 5 is formed with the first main electrode 6, the second main electrode 7, and the trench 6T between the first and second main electrodes 6 and 7. The trench 6T is positioned on the control electrode 10 and serves as the channel region 8. The trench 6T is 10 nm wide. The patterning is preferably conducted by the reactive ion etching process using the $CHF_3$ and $SF_6$ gases.

Figure 45:
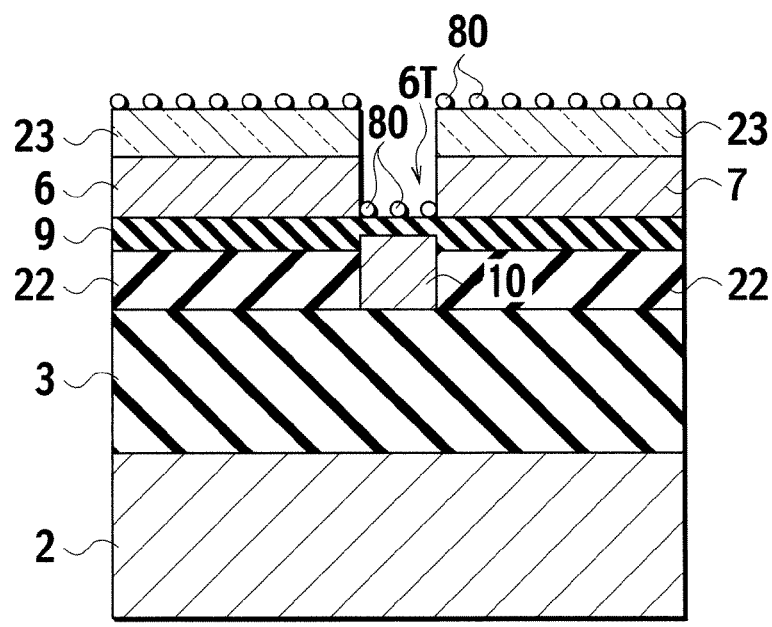
FIG. 45 is a cross section of the switching element and the semiconductor device in the second embodiment and in a thirteenth manufacturing process.

Referring to FIG. 45, fine particles 80 are dispersed in the trench 6T where the channel region 8 is to be formed. In the second embodiment, fine particles 80 are also dispersed onto the resist mask 23 which is left on the first and second main electrodes 6 and 7. The fine particles 80 are made of Si, and have an average diameter of 2 nm. The fine particles 80 which are suspended in isopropyl alcohol are discharged in minute droplets via the hollow needle electrode 102 of the dispenser 100. A high voltage is applied to the hollow needle electrode 102. The isopropyl alcohol around the fine particles 80 vaporizes before the fine particles 80 reach the substrate 2, i.e., the resist mask 23. Therefore, only the Si particles, i.e., the fine particles 80, are applied onto the resist mask 23.

Figure 46:
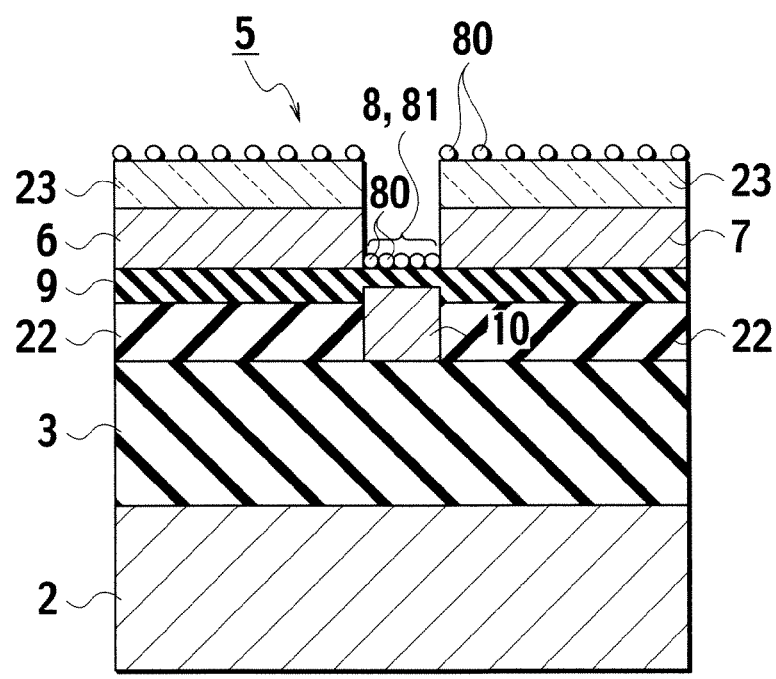
FIG. 46 is a cross section of the switching element and the semiconductor device in the second embodiment and in a fourteenth manufacturing process.

As shown in FIG. 46, the voltage of 1 volt is applied between the first and second main electrodes 6 and 7. Then, the electric field E is produced in the first direction from the first electrode wall 61 to the second electrode wall 71. In response to the generation of the electric field E, the fine particles 80 which are at random are aligned by the attractive force acting on them. Therefore, a plurality of unit channels 81 in which the fine particles are aligned in the first direction can be made. Adjacent unit channels 81 are separated in the second direction by the repulsive force acting on the fine particles 80. The channel region 8 includes a plurality of juxtaposed unit channels 81 in which the fine particles 80 are aligned. ArF excimer laser beams are illuminated to the fine particles 80 in order to couple fine particles 80 at one end of the unit channel 81 to the first electrode wall 61, and fine particles 80 at the other end of the unit channel 81 to the second electrode wall 71.

Figure 47:
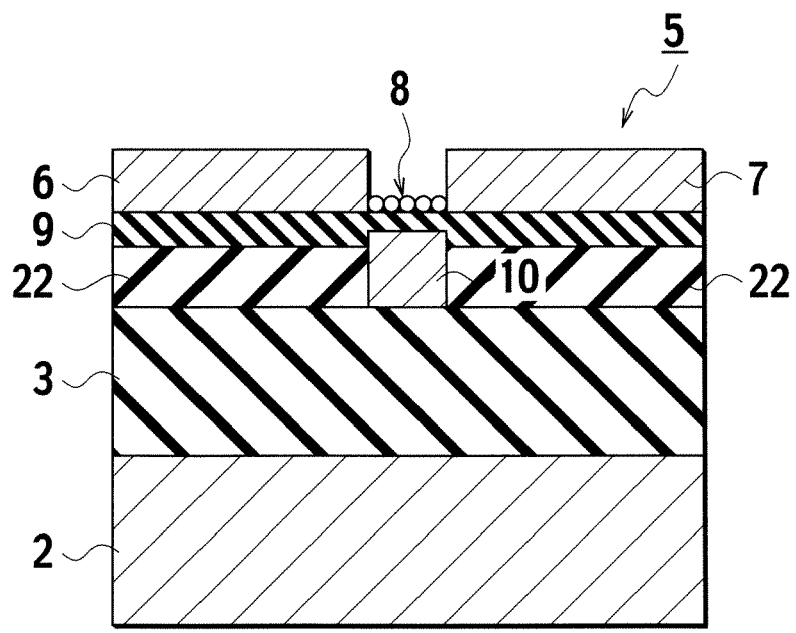
FIG. 47 is a cross section of the switching element and the semiconductor device in the second embodiment and in a fifteenth manufacturing process.

The resist mask 23 as well as the fine particles 80 thereon is removed as shown in FIG. 47. In this state, the switching element 5 is completed. The unnecessary parts of the comb-shaped connecting areas bonded to the first and second main electrodes 6 and 7 are removed using a new resist mask prepared by the lithography process. For this purpose, the reactive ion etching is preferably utilized with the $CHF_3$ and $SF_6$ gases. The unnecessary parts are parts to which the probe is touched in order to apply the voltage for aligning the fine particles 80.

Figure 48:
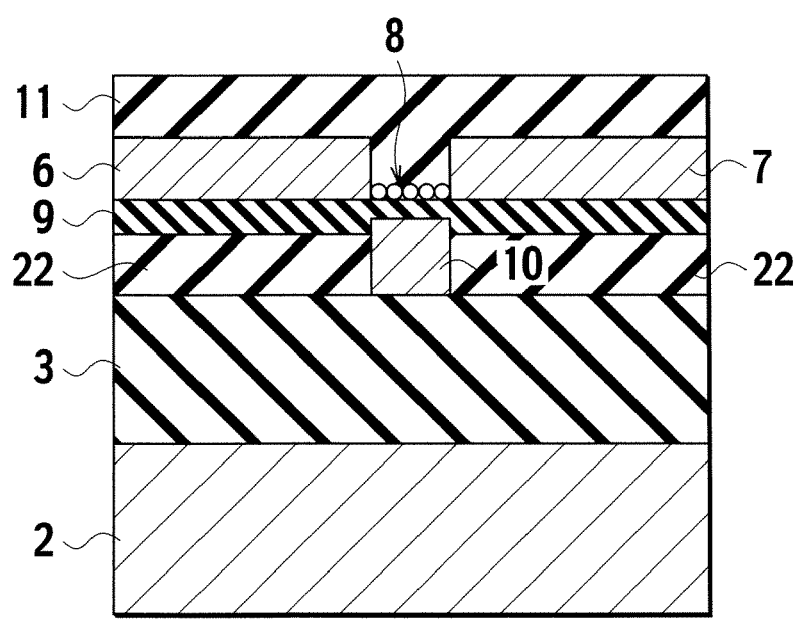
FIG. 48 is a cross section of the switching element and the semiconductor device in the second embodiment and in a sixteenth manufacturing process.

A passivation film 11 is formed on the switching element 5 as well as the substrate 2 as shown in FIG. 48. The passivation film 11 is preferably an $SiO_2$ film which is 100 nm thick, is mainly made from TEOS, and is prepared by the CVD process. Connecting wirings for the first and second main electrodes 6 and 7 are formed on the passivation film 11. A final passivation film is applied on the connecting wirings. In this state, the semiconductor device 1 is completed.

The switching element 5 and semiconductor device 1 fabricated by the method according to the second embodiment are as effective and advantageous as those according to the first embodiment.

Third Embodiment

According to the third embodiment, a switching element 5 and semiconductor device 1 are manufactured as follows and as shown in FIG. 49 to FIG. 72.

Figure 49:
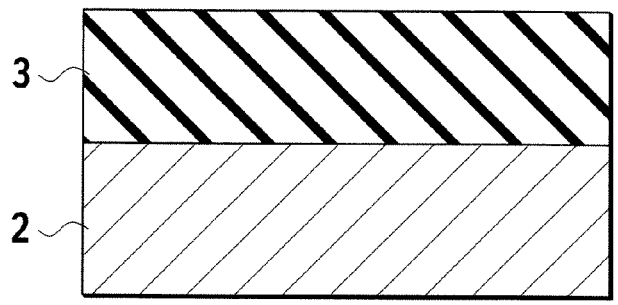
FIG. 49 is a cross section of a switching element and a semiconductor device in the third embodiment and in a first manufacturing process.

First of all, a 720 μm thick substrate 2 is prepared. The substrate 2 is cleaned using hydrofluoric acid. Refer to FIG. 49. An insulating film 3 is formed on the substrate 2. The insulating film 3 is an $SiO_2$ film which has grown to a thickness of 300 nm at 950° C. using the thermal oxidation process. Alternatively, the insulating film 3 may be an isolation-insulator film for insulating adjacent MISFET, MOSFET or the like fabricated on a different region of the substrate 2. For instance, when the STI process is adopted in the manufacturing process of the third embodiment, the insulating film 3 may be prepared in the process for making the silicon oxide film to be filled in the STI trench. The silicon oxide film is mainly made from TEOS using the CVD process.

Figure 50:
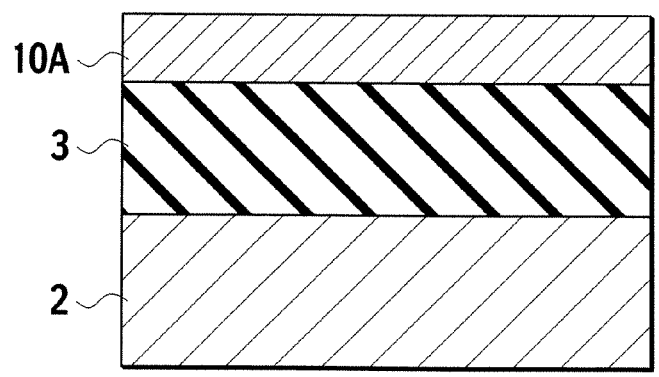
FIG. 50 is a cross section of the switching element and the semiconductor device in the third embodiment and in a second manufacturing process.

Referring to FIG. 50, a control electrode film 10A is formed on the insulating film 3. Specifically, the control electrode film 10A is mainly made from silane added with $PH_3$ by the LPCVD process, e.g., a P-doped poly-crystal silicon film, which is 30 nm thick.

Figure 51:
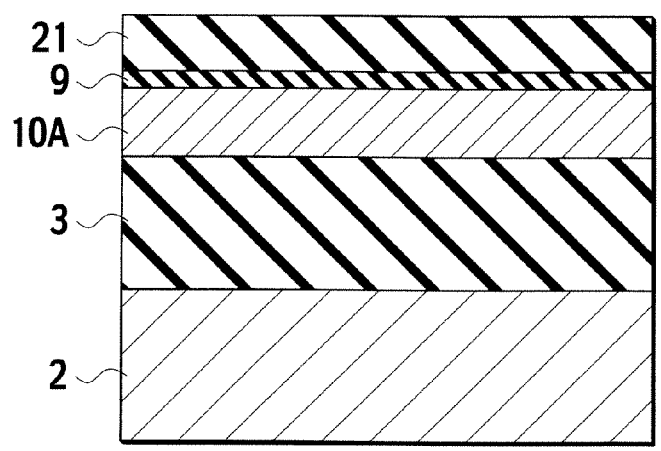
FIG. 51 is a cross section of the switching element and the semiconductor device in the third embodiment and in a third manufacturing process.

An insulating film 9 is made on the control electrode film 10A, and an insulating film 21 is made on the insulating film 9 as shown in FIG. 51. The insulating film 9 is a 5 nm thick H SiON film, and is deposited by the atomic layer deposition (ALD) process. The insulating film 21 is a 50 nm thick $Si_3N_4$ film which is mainly made from dichloro-silane and ammonium, and is prepared by the LPCVD process. Alternatively, the insulating film 9 may be a single SiON film, $SiO_2$ film or the like, or a composite layer of SiON and $SiO_2$ films which are optimum as gate insulating films.

Figure 52:
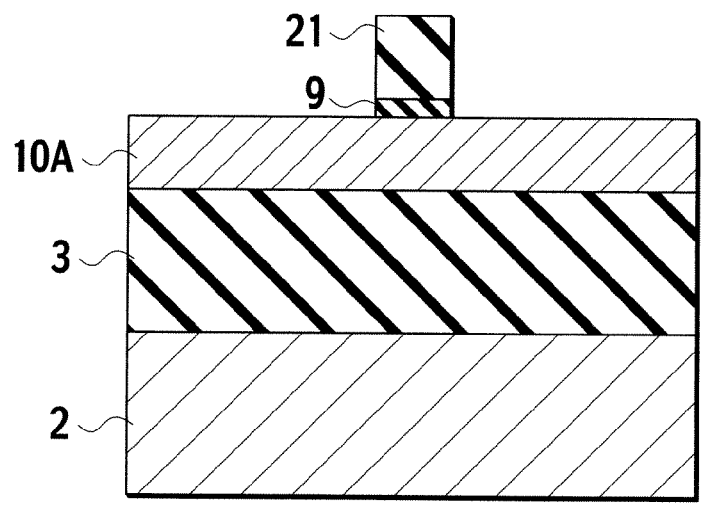
FIG. 52 is a cross section of the switching element and the semiconductor device in the third embodiment and in a fourth manufacturing process.

A resist mask (not shown) having a 10 nm-open pattern is made using the lithography process. The insulating film 21 and the insulating film 9 are etched and patterned using the resist mask, as shown in FIG. 52. The reactive ion etching process using $CHF_3$ gas, $CF_4$ gas, and $O_2$ gas is preferable to the patterning. Thereafter, the resist mask is removed.

Figure 53:
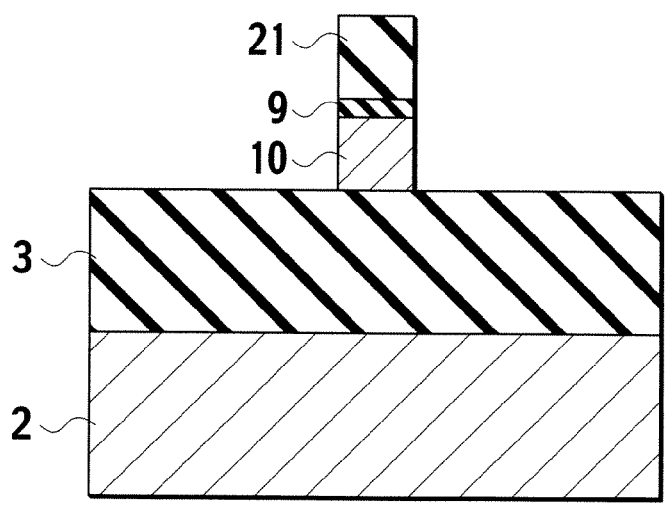
FIG. 53 is a cross section of the switching element and the semiconductor device in the third embodiment and in a fifth manufacturing process.

As show in FIG. 53, the control electrode film 10A is patterned using the insulating film 21 as an etching mask, thereby making the control electrode 10. The reactive ion etching with the HBr and $O_2$ gases is preferably applied to the foregoing patterning.

Figure 54:
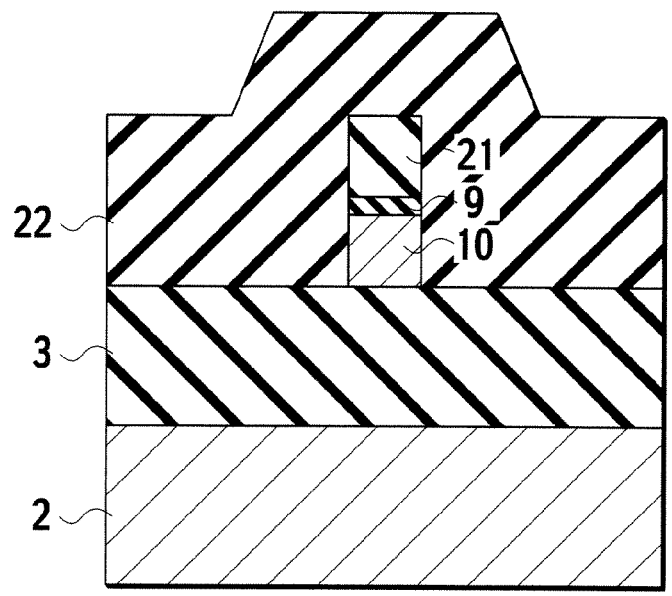
FIG. 54 is a cross section of the switching element and the semiconductor device in the third embodiment and in a sixth manufacturing process.

An insulating film 22 is applied over the insulating film 21 as well as the substrate 2 as shown in FIG. 54. The insulating film 22 is preferably an $SiO_2$ film which is mainly made from TEOS, is 100 nm thick, and is prepared by the CVD process.

Figure 55:
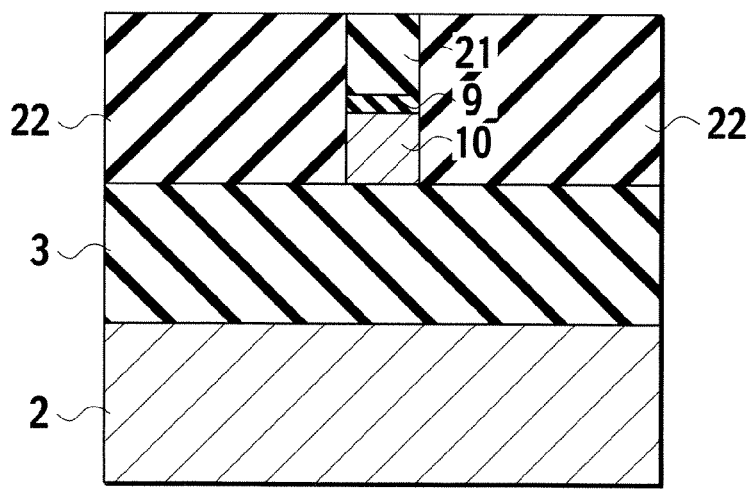
FIG. 55 is a cross section of the switching element and the semiconductor device in the third embodiment and in a seventh manufacturing process.
Figure 56:
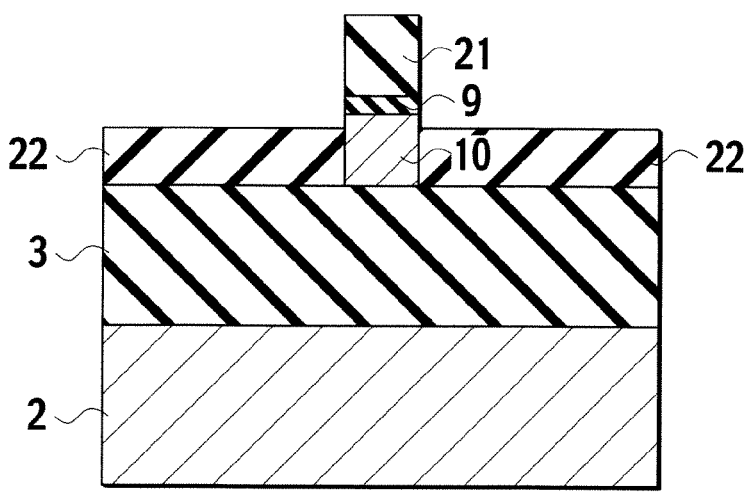
FIG. 56 is a cross section of the switching element and the semiconductor device in the third embodiment and in an eighth manufacturing process.

The insulating film 22 is smoothed by the CMP process using the insulating film 21 as a stop layer as shown in FIG. 55. Thereafter, the insulating film 22 is etched back as shown in FIG. 56, so that it is partly left on the insulating film 3. In this case, the insulating film 22 is 28 nm thick, for instance. The reactive ion etching process with the $CHF_3$ and CO gases is preferably used for the etching-back.

Figure 57:
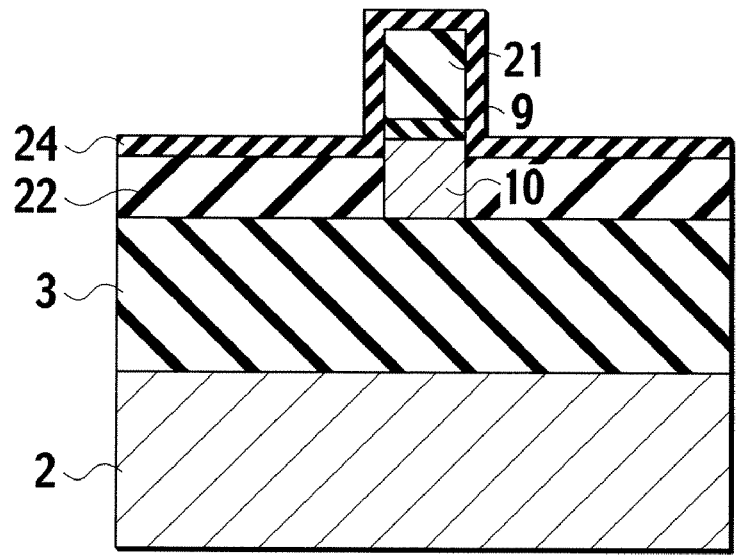
FIG. 57 is a cross section of the switching element and the semiconductor device in the third embodiment and in a ninth manufacturing process.

Referring to FIG. 57, an insulating film 24 is formed on all over the insulating film 21 including on its sidewalls and on the insulating film 22. The insulating film 24 is preferably an $SiO_2$ film which is mainly made from TEOS, is 2 nm thick, and is prepared by the CVD process.

Figure 58:
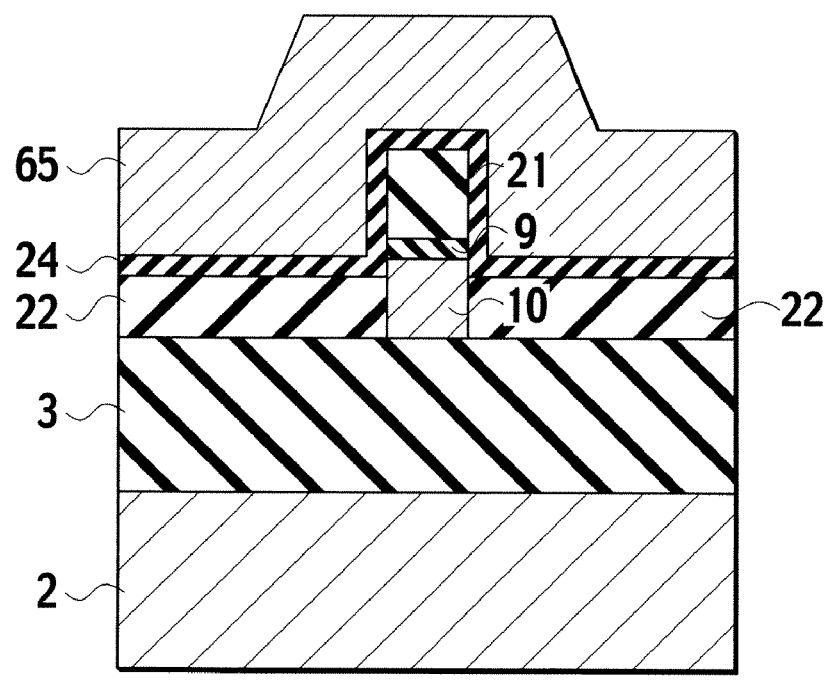
FIG. 58 is a cross section of the switching element and the semiconductor device in the third embodiment and in a tenth manufacturing process.

A main electrode film 65 is formed all over the insulating film 24. Refer to FIG. 58. The main electrode film 65 is preferably a mixed film of a 2 nm thick titanium (Ti) film and a 40 nm thick tungsten (W) film on the titanium (Ti) film. These films are sequentially made by the sputtering process.

Figure 59:
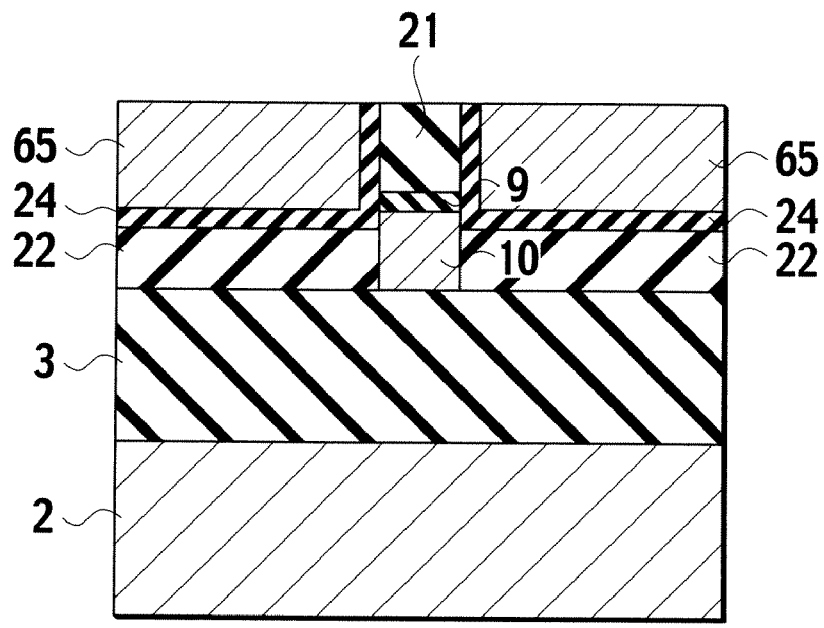
FIG. 59 is a cross section of the switching element and the semiconductor device in the third embodiment and in an eleventh manufacturing process.
Figure 60:
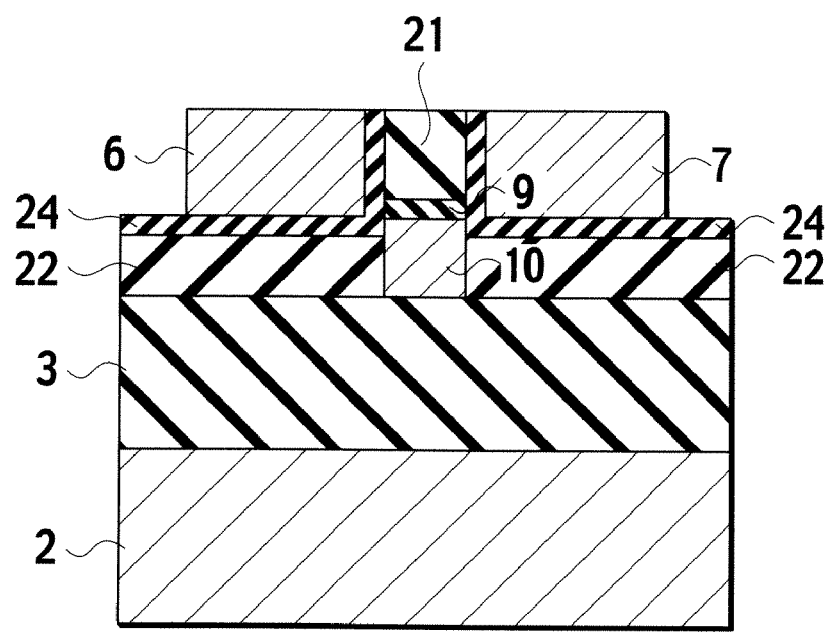
FIG. 60 is a cross section of the switching element and the semiconductor device in the third embodiment and in a twelfth manufacturing process.

The main electrode film 65 is smoothed by the CMP process using the insulating layer 21 as a stop layer, as shown in FIG. 59. A resist mask 23 is made by the lithography process, and has a pattern for the first and second main electrodes 6 and 7 and a pattern for the connection area (not shown). As shown in FIG. 60, the main electrode film 65 is patterned using the resist mask 23, so that the first and second main electrodes 6 and 7 are made. The reactive ion etching process with the $CHF_3$ and $SF_6$ gases is preferably used for the patterning.

Figure 61:
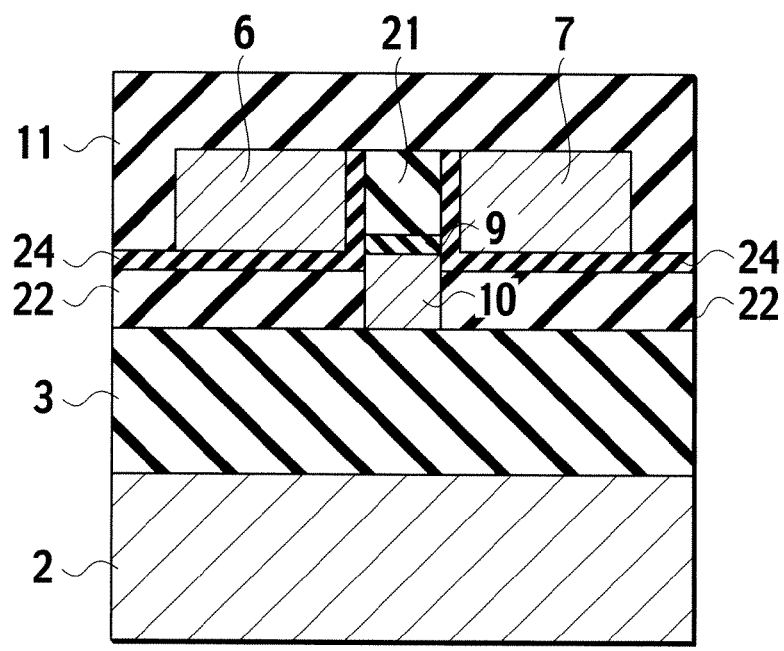
FIG. 61 is a cross section of the switching element and the semiconductor device in the third embodiment and in a thirteenth manufacturing process.

A passivation film 11 is deposited all over the first and second main electrodes 6 and 7 as well as the substrate 2. The passivation film 22 is preferably an $SiO_2$ film which is mainly made from TEOS, is 100 nm thick, and is formed by the CVD process. Refer to FIG. 61.

Figure 62:
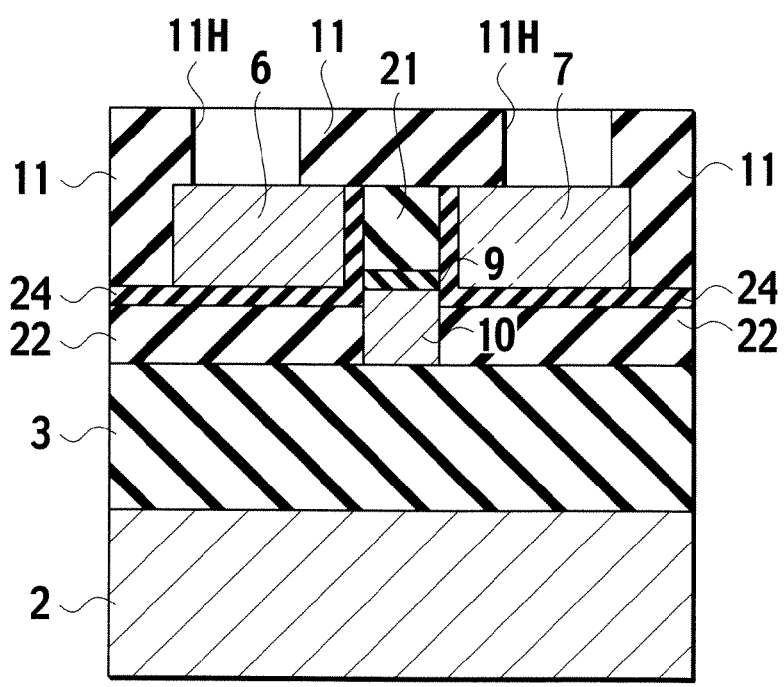
FIG. 62 is a cross section of the switching element and the semiconductor device in the third embodiment and in a fourteenth manufacturing process.

Contact holes 11H are formed in the passivation film 11 extending over the first and second main electrodes 6 and 7. Refer to FIG. 62. A resist mask is made by the lithography process, and is used to etch the passivation film 11, thereby making the contact holes 11H. The reactive ion etching process with the $CHF_3$ and CO gases is preferably used for the foregoing purpose.

Figure 63:
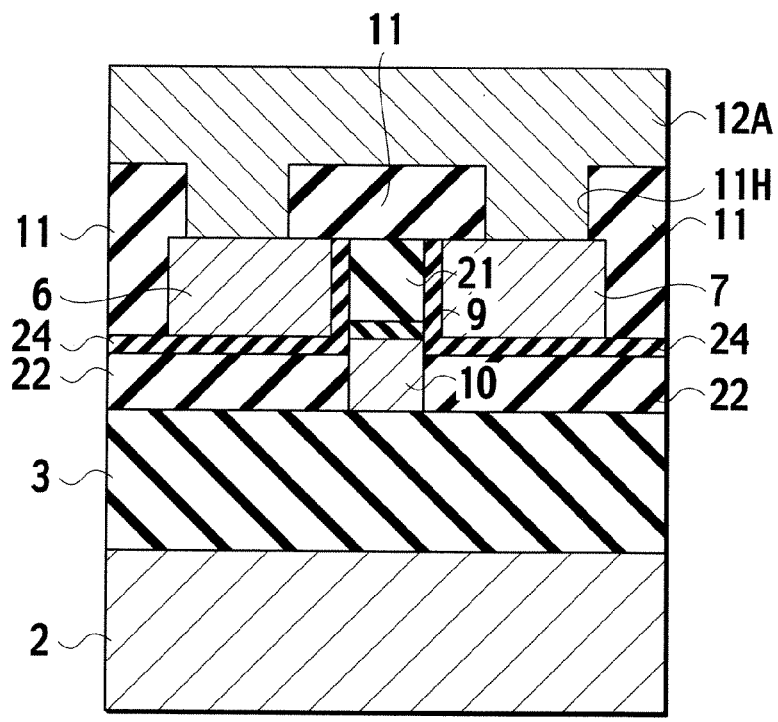
FIG. 63 is a cross section of the switching element and the semiconductor device in the third embodiment and in a fifteenth manufacturing process.

As shown in FIG. 63, a wiring film 12A is made on the passivation film 11 for connection with the first and second main electrodes 6 and 7 via the contact holes 11H. The wiring film 12A is an aluminum alloy film, is 150 nm thick, and is prepared by the sputtering process.

Figure 64:
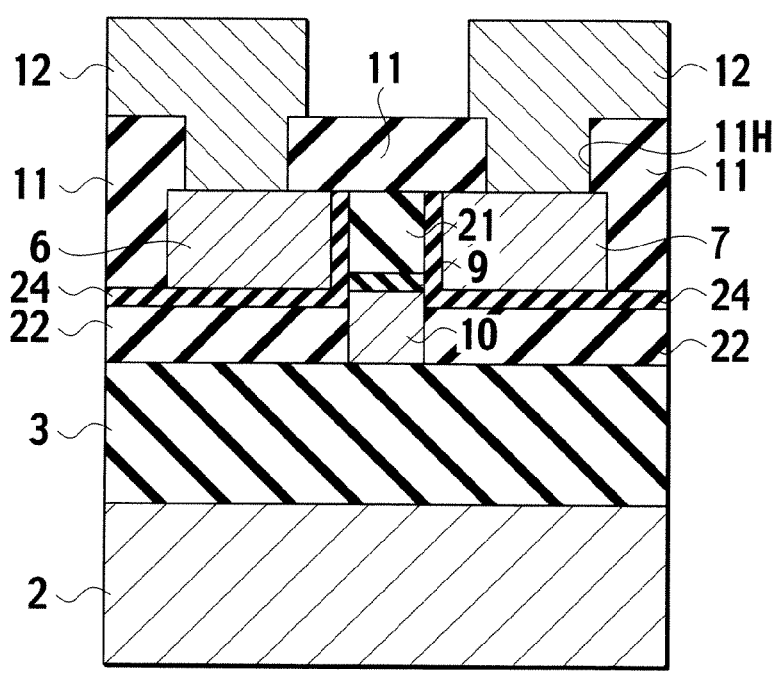
FIG. 64 is a cross section of the switching element and the semiconductor device in the third embodiment and in a sixteenth manufacturing process.

A resist mask (not shown) is made by the lithography process. The resist mask is used to pattern the wiring film 12A, thereby making a wiring 12, as shown in FIG. 64. The wiring 12 is patterned in the manufacturing process, specifically while the fine particles 80 are aligned, and is designed to apply a voltage between the first and second main electrodes 6 and 7. The reactive ion etching with the $Cl_2$ and $BCl_3$ gases is preferably used for the patterning.

Figure 65:
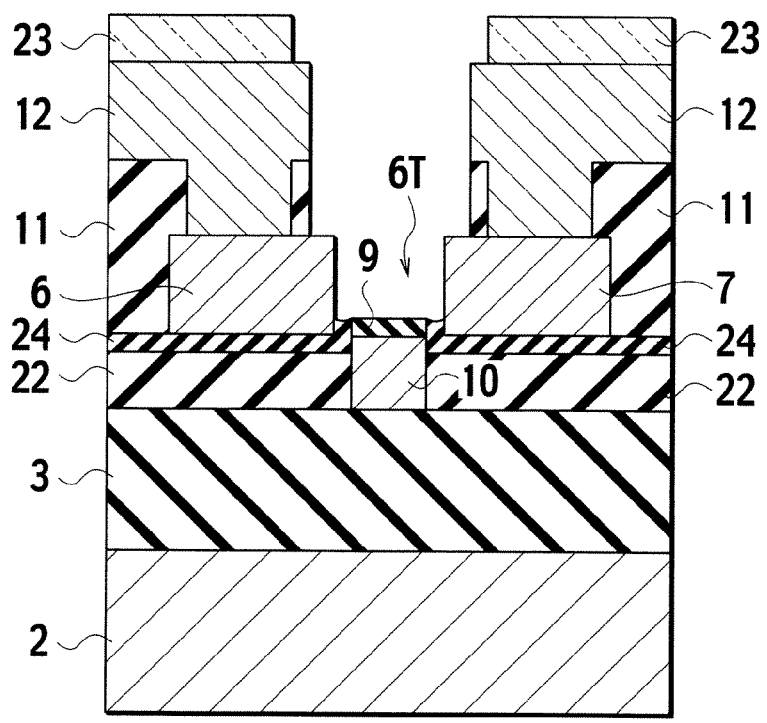
FIG. 65 is a cross section of the switching element and the semiconductor device in the third embodiment and in a seventeenth manufacturing process.

A resist mask 23 is formed all over the wiring 12 as well as the substrate 2 using the lithography process. The resist mask 23 has an open pattern on the control electrode 10 between the first and second main electrodes 6 and 7. Refer to FIG. 65.

Referring to FIG. 65, the resist mask 23 is used to etch and remove the passivation film 11 and insulating films 21 and 24 which are exposed via the open pattern, thereby forming the trench 6T for making the channel region 8 between the first and second main electrodes 6 and 7. The reactive ion etching with the $CHF_3$ and CO gases is preferably used for etching the passivation film 11 and the insulating film 24. Further, the reactive ion etching with the $CHF_3$, $CF_4$ and $O_2$ gases is preferably used for etching the insulating film 21. Since the wiring 12, first and second main electrodes 6 and 7, and insulating film 9 contain metal elements, it is possible to maintain sufficient etching selectivity. The metal elements seldom decrease in the foregoing reactive etching processes even if the foregoing components are not covered by the resist mask 23. Therefore, positioning precision in the lithography process can be eased up. This is effective in improving the yield of the manufacturing processes and reducing the fabrication cost.

Figure 66:
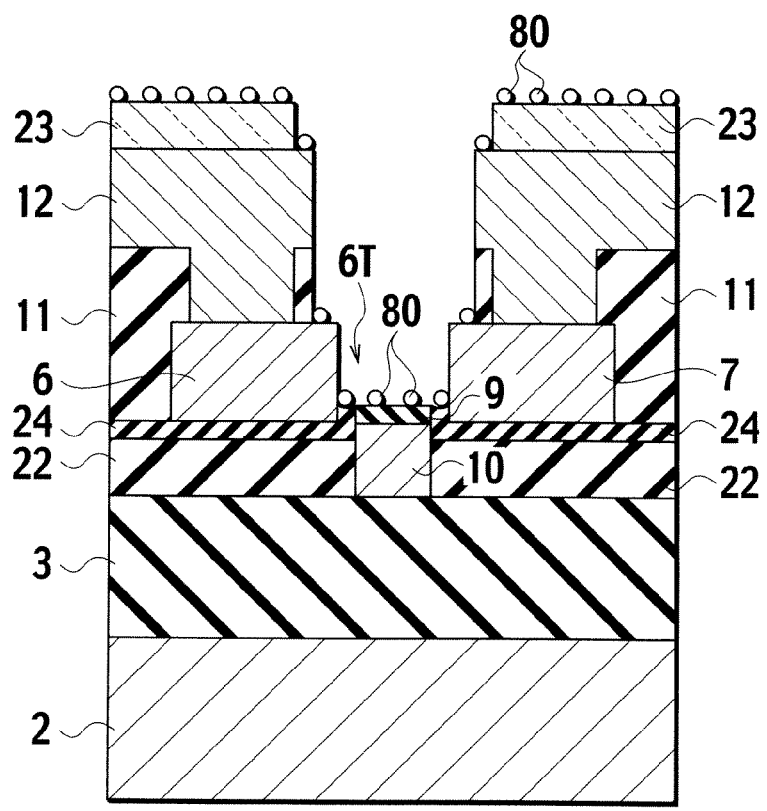
FIG. 66 is a cross section of the switching element and the semiconductor device in the third embodiment and in an eighteenth manufacturing process.

Fine particles 80 are sprayed into the trench 6T, specifically at an area where the channel region 8 is to be made, as shown in FIG. 66. Further, the fine particles 80 are applied all over the resist mask 23 in the third embodiment. This is because the resist mask 23 remains as it is. The fine particles 80 are made of Si, and have an average diameter of 2 nm. The fine particles 80 which are suspended in isopropyl alcohol are discharged in minute droplets using the dispenser 100. A high voltage is applied to the hollow needle electrode 102. The isopropyl alcohol around the fine particles 80 vaporizes before the fine particles 80 arrive on the substrate 2, i.e., the resist mask 23. Therefore, only the Si particles, i.e., only the fine particles 80, are applied onto the resist mask 23.

Figure 67:
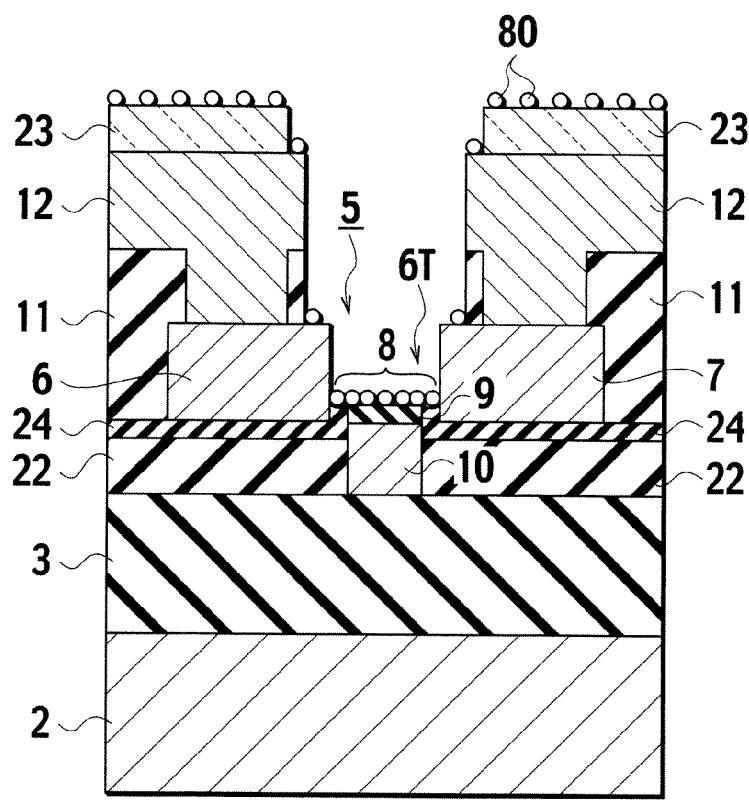
FIG. 67 is a cross section of the switching element and the semiconductor device in the third embodiment and in a nineteenth manufacturing process.

As shown in FIG. 67, a voltage of 1.5 volts is applied between the first and second main electrodes 6 and 7 via the wiring 12. Then, the electric field E is produced in the first direction from the first electrode wall 6 of the first main electrode 6 to the second electrode wall 71 of the second main electrode 7. In response to the generation of the electric field E, the fine particles 80 which are at random are aligned by the attractive force acting on them. Therefore, a plurality of unit channels 81 in which the fine particles 80 are lined up in the first direction can be made. Adjacent unit channels 81 are separated in the second direction by the repulsive force acting on the fine particles 80. The channel region 8 includes a plurality of juxtaposed unit channels 81 in which the fine particles 80 are aligned. ArF excimer laser beams are illuminated onto the fine particles 80 in order to couple fine particles 80 at one end of the unit channel 81 to the first electrode wall 61, and fine particles at the other end of the unit channel 81 to the second electrode wall 71.

Figure 68:
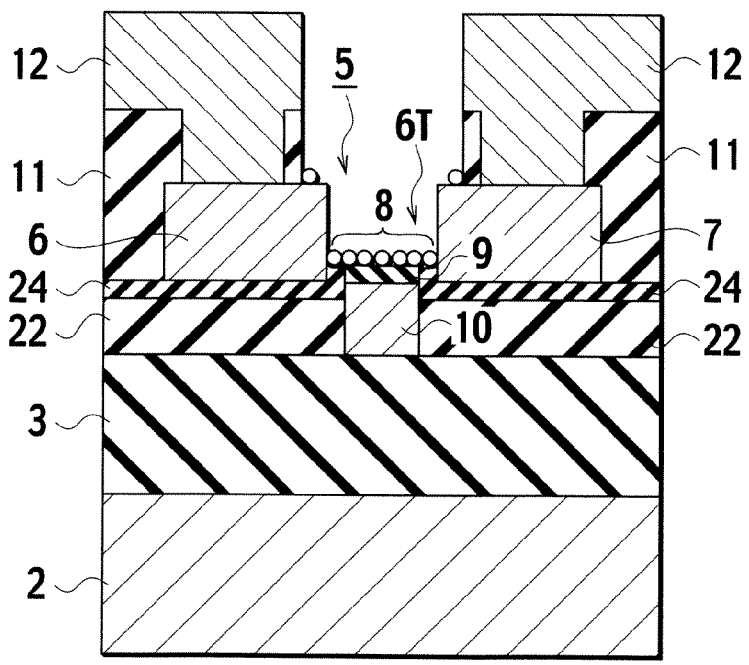
FIG. 68 is a cross section of the switching element and the semiconductor device in the third embodiment and in a twentieth manufacturing process.

As shown in FIG. 68, the resist mask 23 is removed together with the fine particles 80 thereon. In this state, the switching element 5 is completed. Some fine particles 80 maybe left on the first and second main electrodes 6 and 7 and be left as they are in a next fabricating step since they do not adversely affect the switching element 5.

Figure 69:
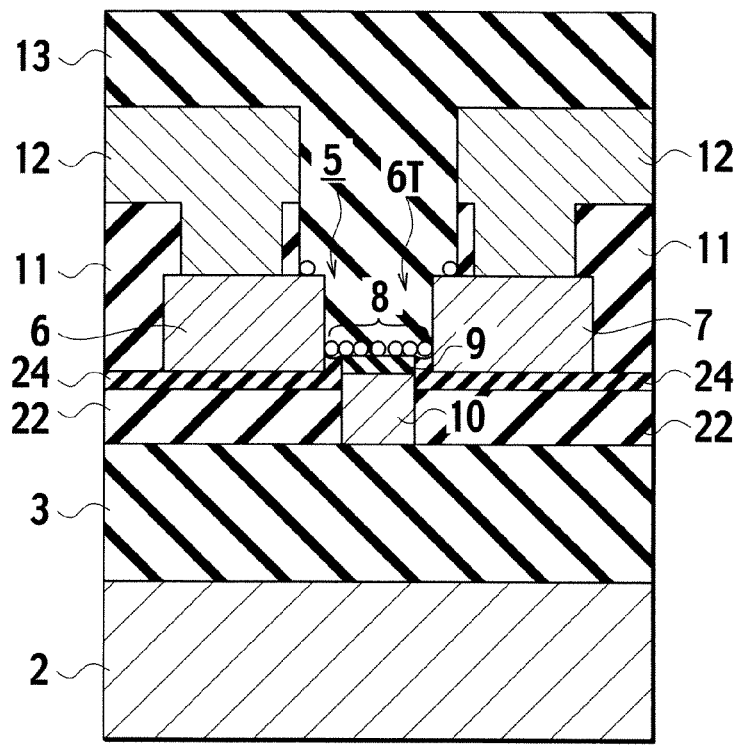
FIG. 69 is a cross section of the switching element and the semiconductor device in the third embodiment and in a twenty-first manufacturing process.
Figure 70:
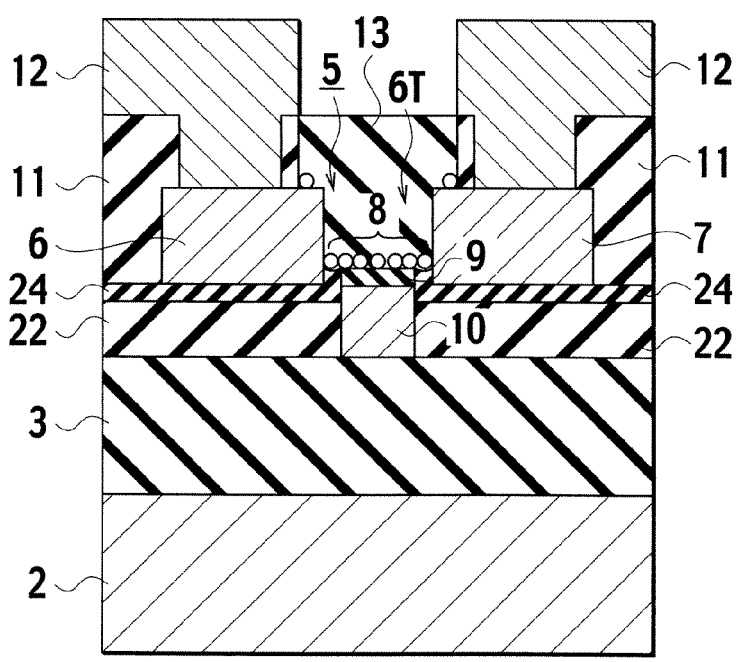
FIG. 70 is a cross section of the switching element and the semiconductor device in the third embodiment and in a twenty-second seventeenth manufacturing process.

An insulating film 13 is made all over the wiring 12 as well as the substrate 2 in order to fill the trench 6T of the channel region 8. Refer to FIG. 69. The insulating film 13 is preferably an $SiO_2$ film which is mainly made from TEOS, is 20 nm thick, and is prepared by the CVD process. The insulating film 13 is then etched back as shown in FIG. 70, so that is left only in the trench 6T. The reactive etching process with the $CHF_3$ and CO gases is preferably used for the etching-back.

Figure 71:
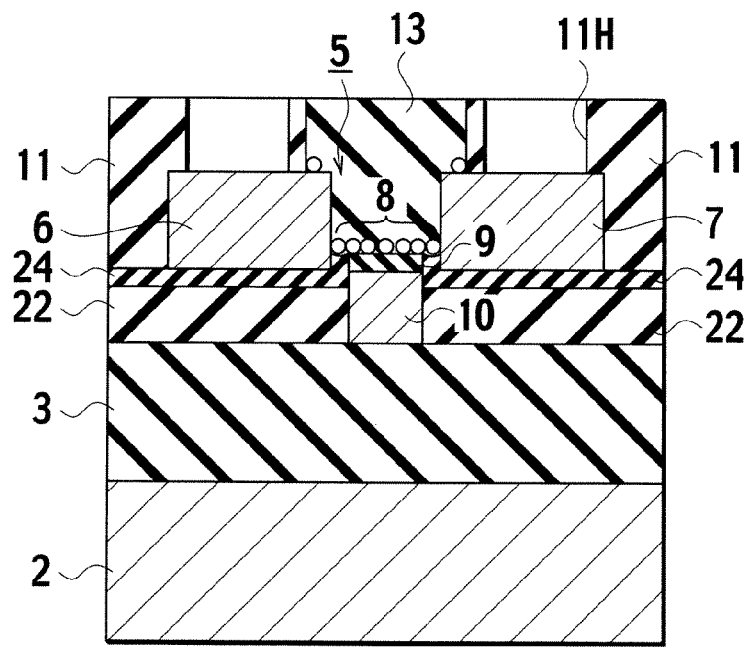
FIG. 71 is a cross section of the switching element and the semiconductor device in the third embodiment and in a twenty-third manufacturing process.
Figure 72:
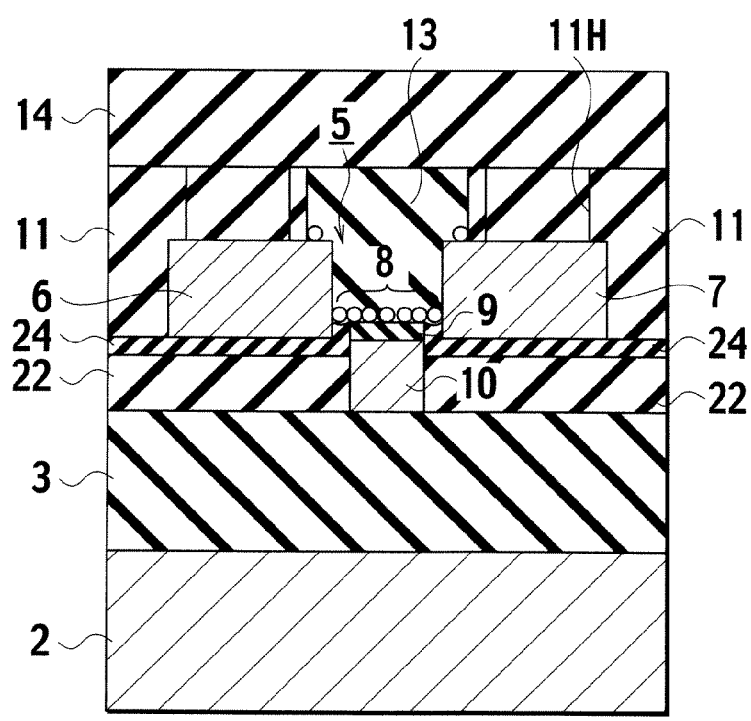
FIG. 72 is a cross section of the switching element and the semiconductor device in the third embodiment and in a twenty-fourth manufacturing process.

As shown in FIG. 71, the wiring 12 is selectively removed by the wet etching process using dilute hydrochloric acid. A passivation film 14 is formed all over the passivation film 11 and the insulating film 13 in order to cover an exposed inner surface of the contact holes 11H as shown in FIG. 72. The passivation film 14 is preferably an $SiO_2$ film which is mainly made from TEOS, is 20 nm thick, and is prepared by the CVD process. Although not shown, a wiring is formed on the passivation layer 14 and is connected to the first and second main electrodes 6 and 7. Thereafter, a final passivation film is made on the wiring. After the foregoing processes, the semiconductor device 1 is completed.

The fabricating method of the third embodiment is as effective and advantageous as that of the first embodiment.

Fourth Embodiment

The following describe a method of manufacturing the switching element 5 and semiconductor device 1 according to a fourth embodiment shown in FIG. 73 to FIG. 80. The fabricating steps shown in FIG. 49 to FIG. 59 in the third embodiment are also applicable to the fourth embodiment, and will not be described.

[Basic Method of Dispersing Fine Particles]

In the semiconductor device 1, a space between electrodes is made by forming a sacrifice layer in an area enclosed by a spacer. The sacrifice layer is anisotropically etched using a chemical solution after an upper component (i.e., an insulating film 15 shown in FIG. 79) is made. However, as wirings are micro-fabricated and widths of wirings or spaces between wirings become equal to or less than several ten nm, the surface tension of the chemical solution becomes extensively large. Therefore, it is very difficult to infiltrate the chemical solution into the space between electrodes. Even if the chemical solution is sufficiently applied, they will be very difficult to be discharged out of the space. Further, if the chemical solution can be discharged by some means, the fine particles 80 have to be left in the space. It is very difficult to prevent the fine particles 80 from being discharged together with the chemical solution.

Therefore, the sacrifice layer is preferably discharged in the shape of a gas. In order to reduce a cost, the sacrifice layer is preferably discharged by an extensively simple process, e.g., is treated by heat and is broken down into a volatile substance. To meet the foregoing requirements, such pyrolytic polymer as polyalkylene oxide is used for the sacrifice layer. Especially, polyethylene oxide and polypropylene oxide containing two or three monomer carbons are thermally decomposed at a relatively low temperature, and are easy to handle.

Specifically, silicon particles which are prepared by a reverse micelle process and have a 2 nm diameter are used as fine particles 80. The fine particles 80 are dispersed in propylene glycol monomethyl ether acetate (PGMEA), which is popular as resist solvent, thereby making solution. Polyethylene oxide having an average molar weight of approximately 300000 is blended in the solution at a 2% weight ratio. As the solution is applied onto the substrate 2 using a spin coater rotating at 2000 rpm, the solvent may vaporize during the rotation. Therefore, a mixed film in which silicon fine particles are dispersed in the polyethylene oxide film can be made (refer to FIG. 74). Further, the first and second electrodes 6 and 7 are patterned so that the trench 6T is made at a predetermined position of the substrate 2.

A mixed polyethylene oxide film containing fine particles 80 is chemically polished using a mixed solution which is made of propylene glycol monomethyl ether (PGME) and isopropyl alcohol (IPA) in the ratio of 3:1, having a low rate of dissolution. As the mixed polyethylene oxide film is dissolved by polishing, the fine particles 80 dispersed in the dissolved polyethylene oxide can be discharged from the film. When a top surface of the electrodes is exposed, the chemical polishing is completed. In this state, the mixed film remains only in the trench (see FIG. 75).

Figure 76:
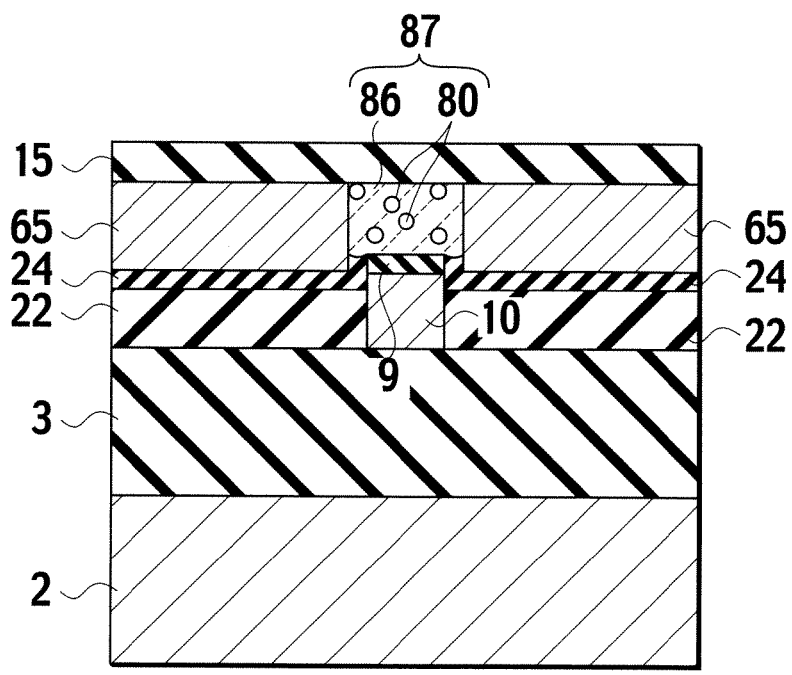
FIG. 76 is a cross section of the switching element and the semiconductor device in the fourth embodiment and in a fourth manufacturing process.

An upper insulating film 15 is spin-coated on all over the substrate 2 (see FIG. 76). The upper insulating film 15 is preferably a spin-on-glass (SOG) film. The thermal treatment of the SOG film may be processed in two separate steps. In such a case, the purpose of the first thermal process is evaporating the residual solvent in the film, which does not require high temperature treatment. Therefore, the SOG film can be made on the polyethylene oxide film without thermally decomposing it. Thereafter, a resist mask is made by the lithography process. The resist mask has an open pattern at positions except for the main electrodes 6 and 7 and the channel region 8. The insulating film 15 is patterned using the resist mask and the reactive ion etching process. Further, the resist mask is removed by the plasma ashing treatment using $O_2$ gas (refer to FIG. 77). The patterned insulating film 15 is used as an etching mask for patterning the main electrodes by the reactive ion etching process (refer to FIG. 78). Apart of polyethylene oxide and fine particles 80 which are immediately under the exposed part of the patterned insulating film 15 will be removed by etching during the patterning of the main electrodes.

Thermal treatment is executed at 180° C. in order to decompose polyethylene oxide. Substances produced by the thermal decomposition are discharged via gaps which are caused by the patterning (refer to FIG. 79). Most of substances produced by decomposing polyethylene oxide are gases, so that only movable fine particles 80 remain in the space defined by the insulating film and the electrode surfaces.

Figure 80:
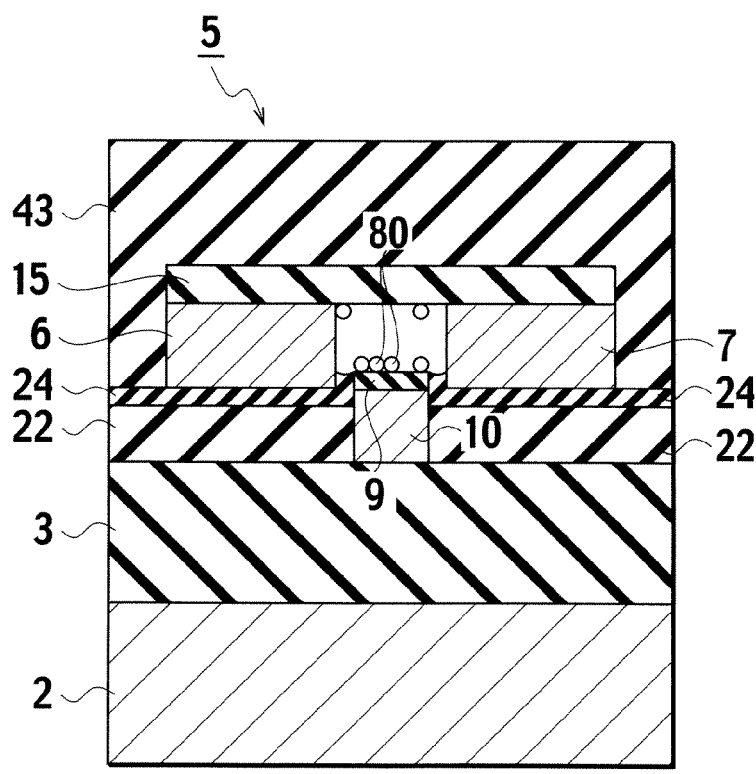
FIG. 80 is a cross section of the switching element and the semiconductor device in the fourth embodiment and in an eighth manufacturing process.

An SOG film is applied by spin-coating with a high viscous solution (refer to FIG. 80). The SOG film is formed on the insulating film 15. In this case, a hollow space (where polyethylene oxide is removed) is kept as it is under the insulating film 15, making use of a meniscus caused by the surface tension of the SOG film.

[Specific Method of Fabricating Semiconductor Device]

Figure 73:
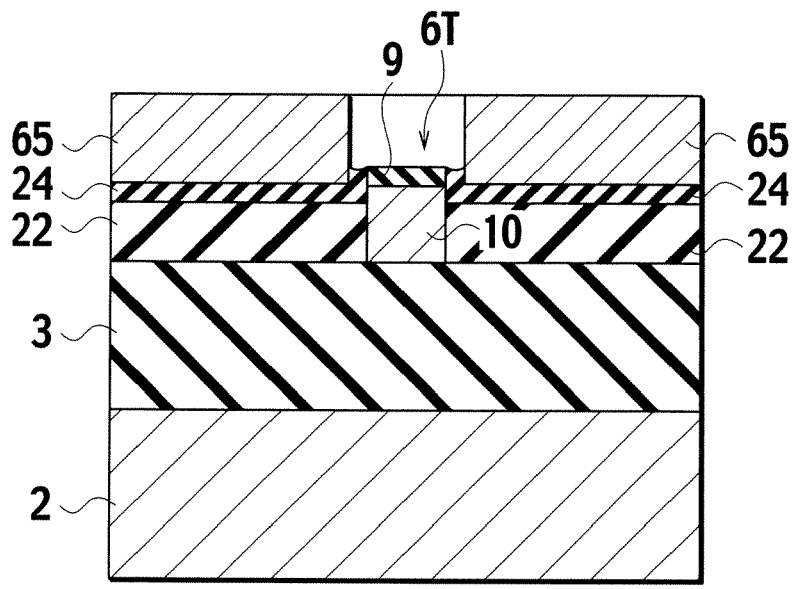
FIG. 73 is a cross section of a switching element and a semiconductor device in the fourth embodiment and in a first manufacturing process.

Specifically, the semiconductor device 1 will be manufactured as follows using the foregoing dispersing method. After the process shown in FIG. 59 in the third embodiment, the exposed insulating films 21 and 24 are selectively removed as shown in FIG. 73, thereby making the trench 6T where the insulating film 9 is exposed. The reactive ion etching process with the $CHF_3$ and CO gases is preferably used for etching the insulating film 24. The insulating film 21 may be removed by the reactive ion etching with the $CHF_3$, $CF_4$ and $O_2$ gases.

Figure 74:
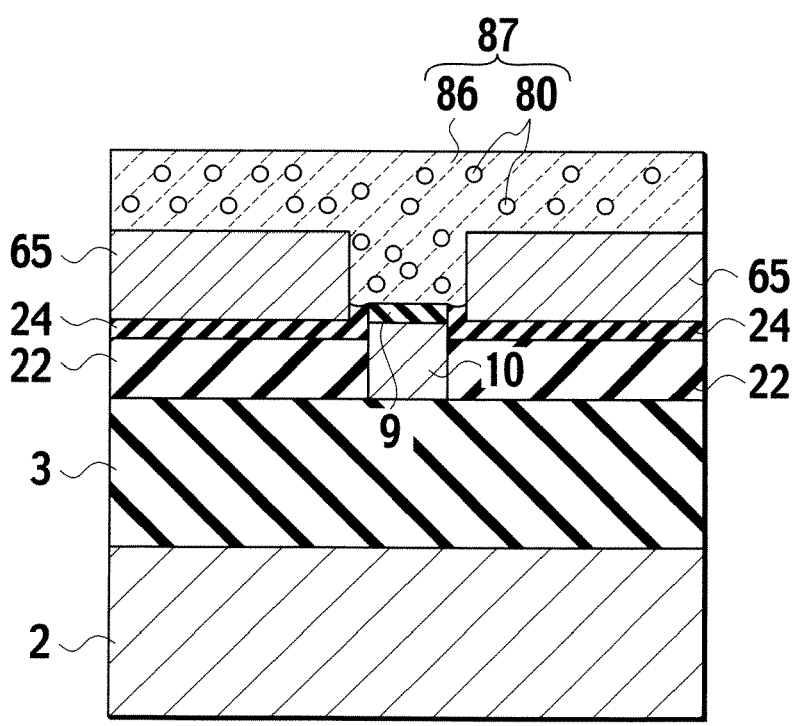
FIG. 74 is a cross section of the switching element and the semiconductor device in the fourth embodiment and in a second manufacturing process.

A mixed film 87 containing fine particles 80 is made all over the main electrode film 65 and in the trench 6T. Refer to FIG. 74. In the fourth embodiment, the fine particles 80 are poly-crystal silicon particles whose diameter is approximately 2 nm. The mixed film 87 is made as follows. Fine particles 80 are dispersed in the propylene glycol monomethyl ether acetate (PGMEA) solution containing two-weight % polyethylene oxide 86. The mixed solution is spin-coated onto the substrate 2 at 2000 rpm and hardened in order to make the mixed film 87. The polyethylene oxide 86 has an average molecular weight of approximately 300000. The polyethylene oxide 86 is used as one example of alkylene oxide. Alternatively, any other pyrolytic polymers may be usable.

Figure 75:
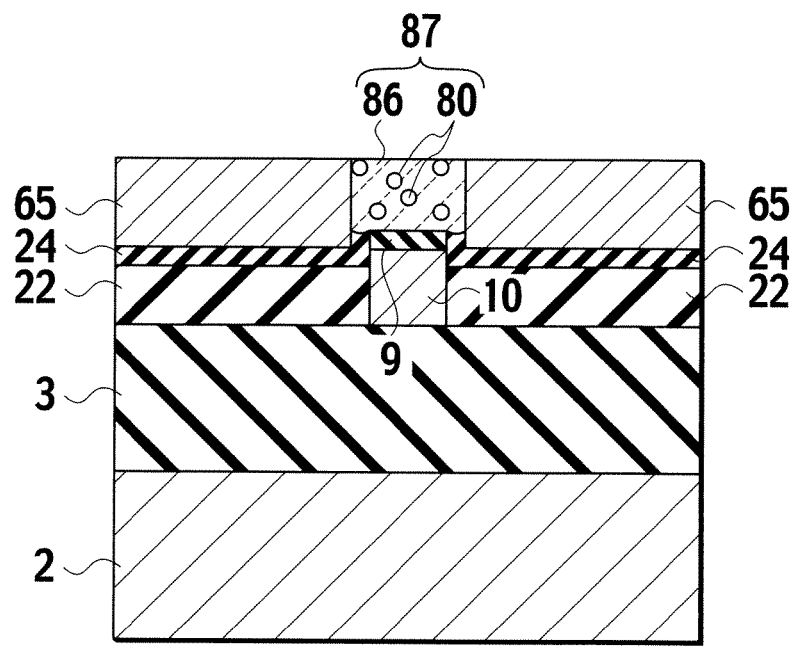
FIG. 75 is a cross section of the switching element and the semiconductor device in the fourth embodiment and in a third manufacturing process.

An unnecessary part of the mixed film 87 is removed by the CMP process as shown in FIG. 75. A mixed liquid containing the propylene glycol monomethyl ether (PGME) and isopropyl alcohol (IPA) in the rate of 3:1 is used for the chemical mechanical polishing. Therefore, the mixed film 87 containing fine particles 80 is left in the trench 6T for the channel region 8.

Figure 77:
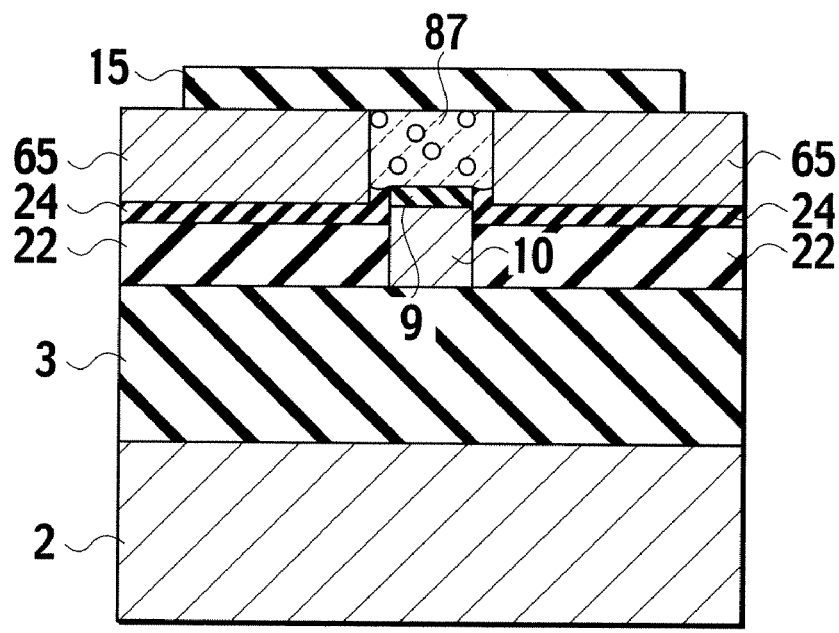
FIG. 77 is a cross section of the switching element and the semiconductor device in the fourth embodiment and in a fifth manufacturing process.
Figure 78:
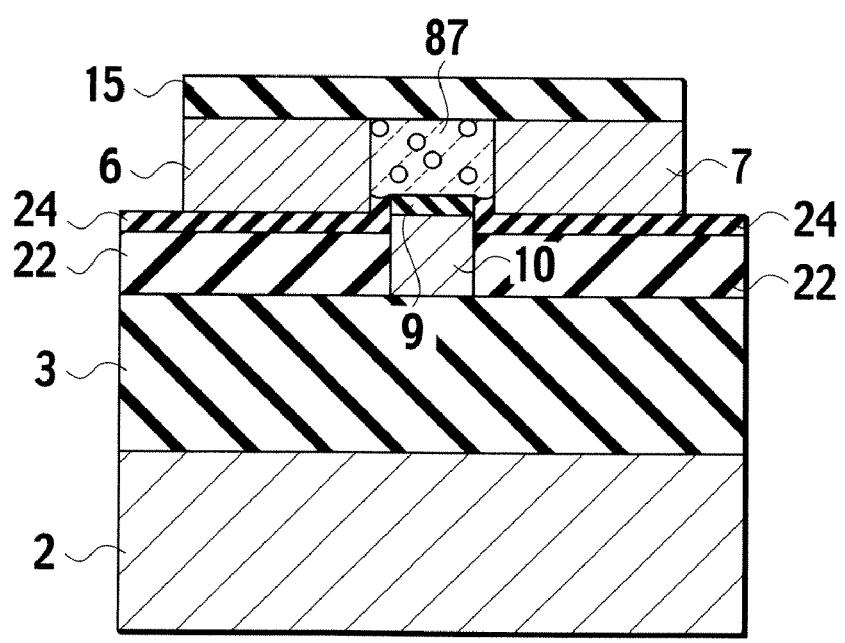
FIG. 78 is a cross section of the switching element and the semiconductor device in the fourth embodiment and in a sixth manufacturing process.
Figure 79:
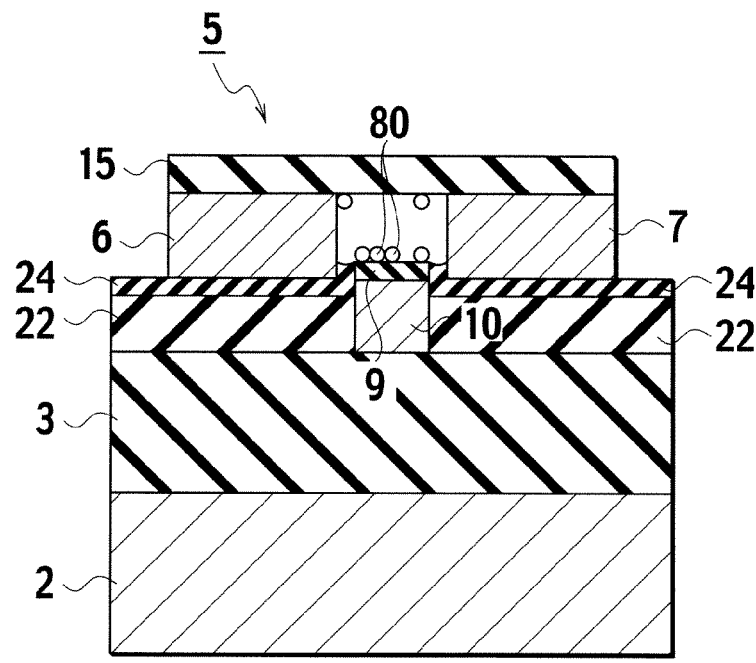
FIG. 79 is a cross section of the switching element and the semiconductor device in the fourth embodiment and in a seventh manufacturing process.

Referring to FIG. 76, the insulating film 15 is spin-on-galss (SOG) coated on the substrate 2 including the main electrode film 65 and mixed film 87, and is hardened. The insulating film 15 is 100 nm thick, for instance. Thereafter, a resist mask (not shown) has an open pattern at positions except for the first and second main electrodes 6 and 7 and the channel region 8 is made using lithography process The insulating film 15 is patterned using the resist mask as shown in FIG. 77. The reactive ion etching process with the $CF_4$ and $O_2$ gases is preferably used for this purpose. The main electrode film 65 is patterned using the patterned insulating film 15 as an etching mask, thereby making the first and second main electrodes 6 and 7 as shown in FIG. 78. The reactive etching process with the $CHF_3$ and $SF_6$ gases is preferably usable for the patterning.

Thermal treatment is executed at 180° C. (for instance) in order to decompose polyethylene oxide 86 of the mixed film 87. Substances produced by the thermal decomposition are discharged via gaps which are caused by the patterning (refer to FIG. 79). Most of substances produced by decomposed polyethylene oxide are gases, so that only movable fine particles 80 remain in the space defined by the insulating films 9 and 15, and the first and second electrode walls 61 and 71.

An SOG film 43 is spin-coated all over the insulating film 15 by using a high viscous solution (refer to FIG. 80). The SOG film 43 is placed on the insulating film 15, and a hollow space (where polyethylene oxide is removed) is kept as it is under the insulating film 15, making use of a meniscus caused by the surface tension of the SOG film 43. In this case, a part of sides of the first and second main electrodes 6 and 7 is adjacent to the hollow space. This structure is rather preferable because it is effective in reducing a capacitance parasitically applied to the first and second main electrodes 6 and 7.

Thereafter, wirings for the first and second main electrodes 6 and 7 are made, and the final passivation film is formed on the wirings. The semiconductor device 1 of the fourth embodiment is completed after the foregoing fabricating steps.

In the fourth embodiment, when final wirings are completed, a voltage is applied between the first and second main electrodes 6 and 7 via the final wirings, so that the fine particles 80 are aligned and the channel region 8 is made, as in the switching elements 5 and semiconductor devices 1 in the first to third embodiments. When the fine particles 80 are aligned and are heated, they can be maintained in the aligned state. In this state, the fine particles 80 are bonded between themselves, between the fine particles 80 and the first electrode wall 61, and between the fine particles 80 and the second electrode wall 71.

The foregoing processes also enable to use the device as a write-once type memory device. In the initial state, the fine particles 80 in every device are randomly dispersed, and can only carry a relatively small current, which means the every device is in the OFF state. After aligning and heating by sufficient current in the selected devices, the fine particles 80 in the selected devices are ordered and bonded, and can carry a relatively large current, which means the selected devices turn into the ON states. The devices may be fabricated in the matrix with selecting devices, and row and column decoders as in a conventional memory device.

Further, in order to alternately align and non-align the fine particles 80, applying 0-V voltage between the main electrodes 6 and 7, and using the thermal motion of the particles 80 may change them from aligned to non-aligned state, i.e., from ON to OFF state. In this process, using the thermal motion can be actualized by mild heating of the whole device provided by a resistive heater embedded in the SOG film 43 or the passivation film, or by a external heating unit, such as an oven, by which the whole device is mildly heated. This process also enables to use the device as an erasable memory device, in which the same processes as in the previous one can be used to change the state from OFF to ON to write. The devices may be fabricated in the matrix with selecting devices, and row and column decoders as in a conventional memory device. Since the mild heating can hardly restrict its effective area, the erase process is carried out by collectively, which means the block of the devices in the matrix or the whole devices on the same substrate are erased at the same time.

Further, the fine particles 80 may be non-aligned using an electric field produced in response to the application of a voltage to the control electrode 10, which can produce the electric field in a different direction from the one by the main electrodes 6 and 7. This process also enables to use the device as an erasable memory device, in which the same processes as in the previous one can be used to change the state from OFF to ON to write, and the application of the voltage to the control electrode 10 can be used to change the state from ON to OFF to erase. The devices may be fabricated in the matrix with selecting devices, and row and column decoders as in a conventional memory device. Since only one control electrode can be selected to erase the data, the erase process may be carried out individually differing to using the heating process.

Fifth Embodiment

In the fifth embodiment, the switching element 5 and semiconductor device 1 will be manufactured as follows and as shown in FIG. 81 to FIG. 103.

Figure 81:
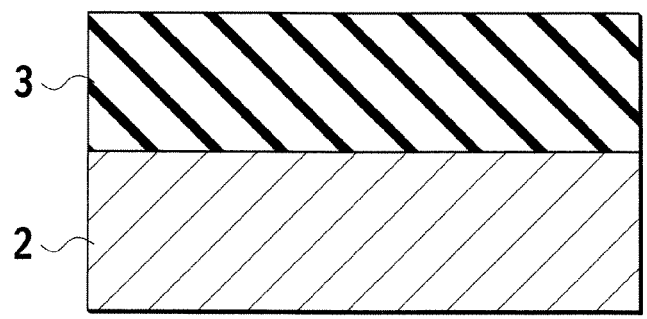
FIG. 81 is a cross section of a switching element and a semiconductor device in the fifth embodiment and in a first manufacturing process.

First of all, a 720 μm thick substrate 2 is prepared. The substrate 2 is cleaned using hydrofluoric acid. Refer to FIG. 81. An insulating film 3 is formed on the substrate 2. The insulating film 3 is an $SiO_2$ film which has grown to a thickness of 300 nm at 950° C. using the thermal oxidation method. Alternatively, the insulating film 3 may be an isolation-insulator film for insulating adjacent MISFET, MOSFET or the like fabricated on a different region of the substrate 2. For instance, when the STI process is adopted in the manufacturing process of the fifth embodiment, the insulating film 3 may be prepared when making the silicon oxide film to be filled in the STI trench. The silicon oxide film is mainly made from TEOS using the CVD process.

Figure 82:
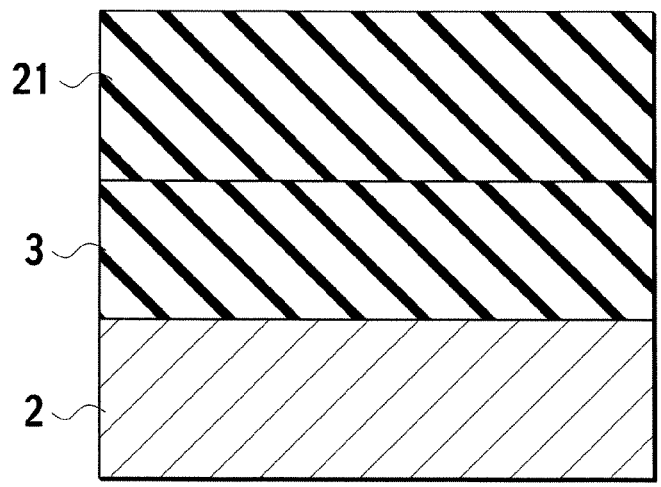
FIG. 82 is a cross section of the switching element and the semiconductor device in the fifth embodiment and in a second manufacturing process.

Referring to FIG. 82, an insulating film 21 is applied all over the insulating film 3. The insulating film 21 is preferably an $Si_3N_4$ film which is mainly made from dichloro-silane and ammonia, is prepared by the LPCVD process, and is 70 nm thick.

Figure 83:
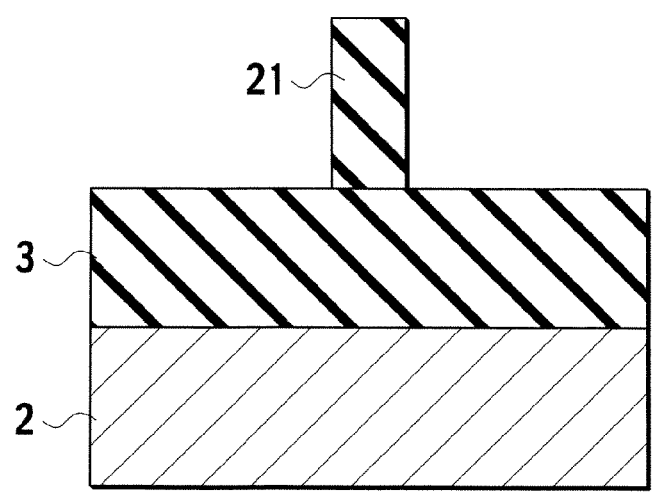
FIG. 83 is a cross section of the switching element and the semiconductor device in the fifth embodiment and in a third manufacturing process.

A resist mask (not shown) having a 10 nm-open pattern is made using the lithography process. The insulating film 21 is etched and patterned using the resist mask, as shown in FIG. 83. The reactive ion etching process using $CHF_3$ gas, $CF_4$ gas, and $O_2$ gas is preferable to the patterning. Thereafter, the resist mask is removed.

Figure 84:
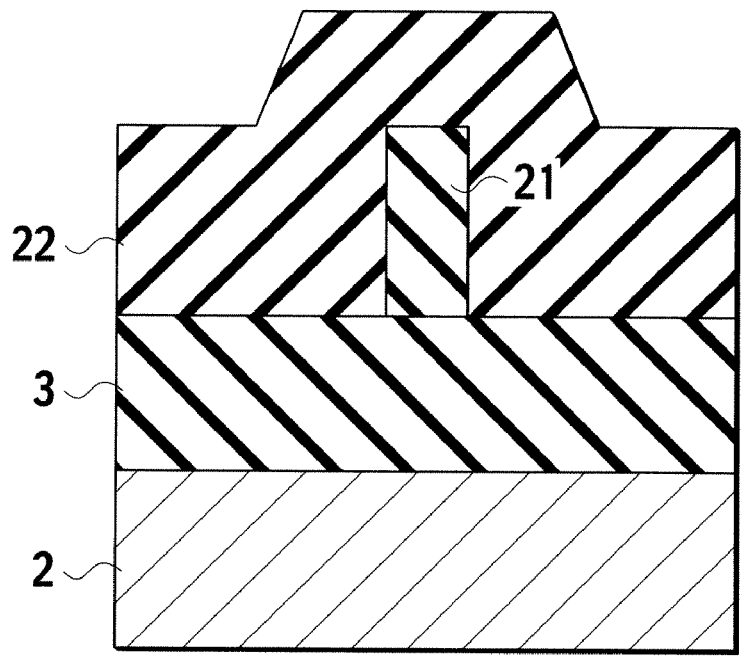
FIG. 84 is a cross section of the switching element and the semiconductor device in the fifth embodiment and in a fourth manufacturing process.
Figure 85:
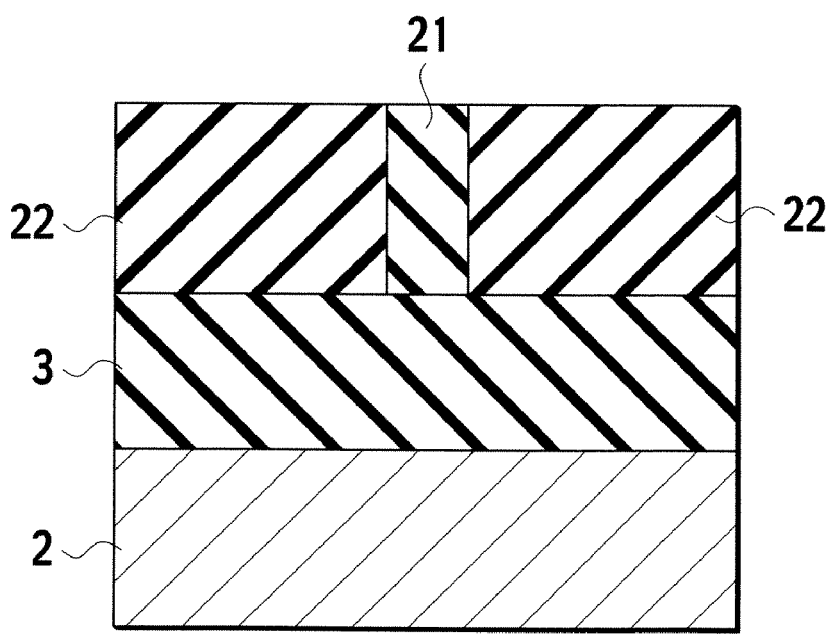
FIG. 85 is a cross section of the switching element and the semiconductor device in the fifth embodiment and in a fifth manufacturing process.

An insulating film 22 is applied all over the insulating film 21 as well as the substrate 2 as shown in FIG. 84. The insulating film 22 is a 100 nm thick $SiO_2$ film which is mainly made from TEOS and is prepared by the CVD process. The insulating film 22 is smoothed by the chemical mechanical polishing (CMP) process using the insulating film 21 as a stop layer. Refer to FIG. 85.

Figure 86:
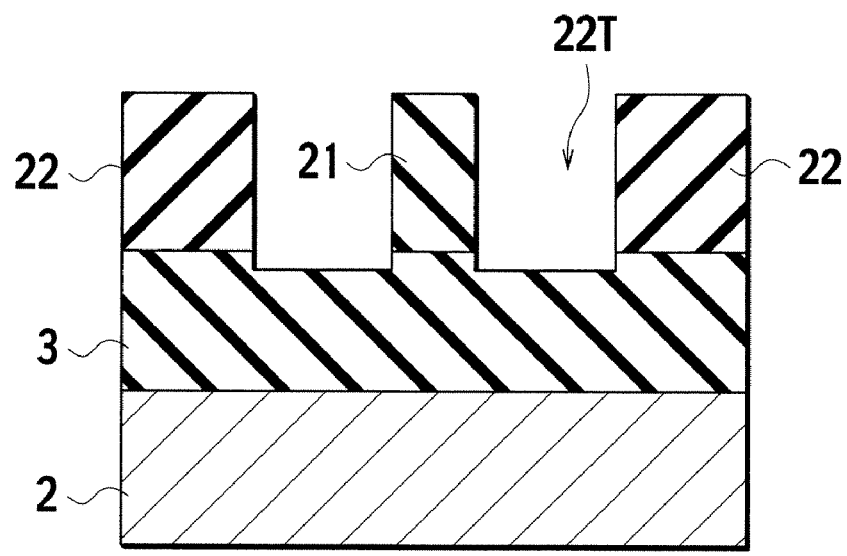
FIG. 86 is a cross section of the switching element and the semiconductor device in the fifth embodiment and in a sixth manufacturing process.

A resist mask having an open pattern for the first and second main electrodes 6 and 7 and the channel region 8 is formed on the insulating films 21 and 22 as well as the substrate 2. The lithography process is used for this purpose. The insulating film 22 is etched and removed using the resist mask and insulating film 21 as etching masks, thereby making a trench 22T for the first and second main electrodes 6 and 7. The reactive ion etching process with the $CHF_3$ and CO gases is preferably used for this process. Refer to FIG. 86. In this case, since the insulating film 22 and the insulating film 3 under the insulating film 22 cannot assure a sufficient etching selectivity ratio, the insulating film 3 will be over-etched. In the fifth embodiment, this over-etching is rather preferable as will be described later.

Figure 87:
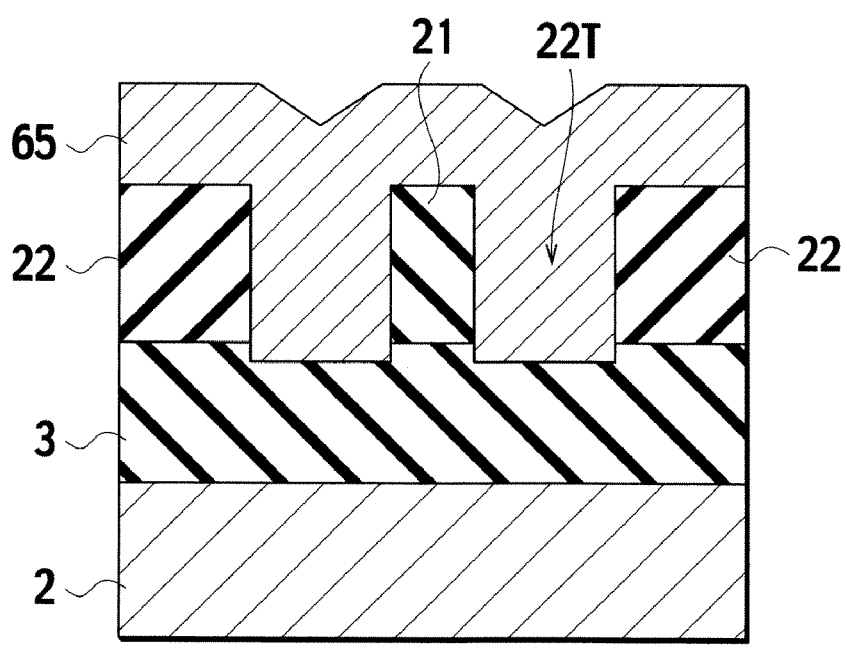
FIG. 87 is a cross section of the switching element and the semiconductor device in the fifth embodiment and in a seventh manufacturing process.

As shown in FIG. 87, a main electrode film 65 is made all over the insulating films 21 and 22 as well as the substrate 2 in order to fill the trench 22T. The main electrode film 65 is preferably a 100 nm thick tungsten (W) film prepared by the sputtering process.

Figure 88:
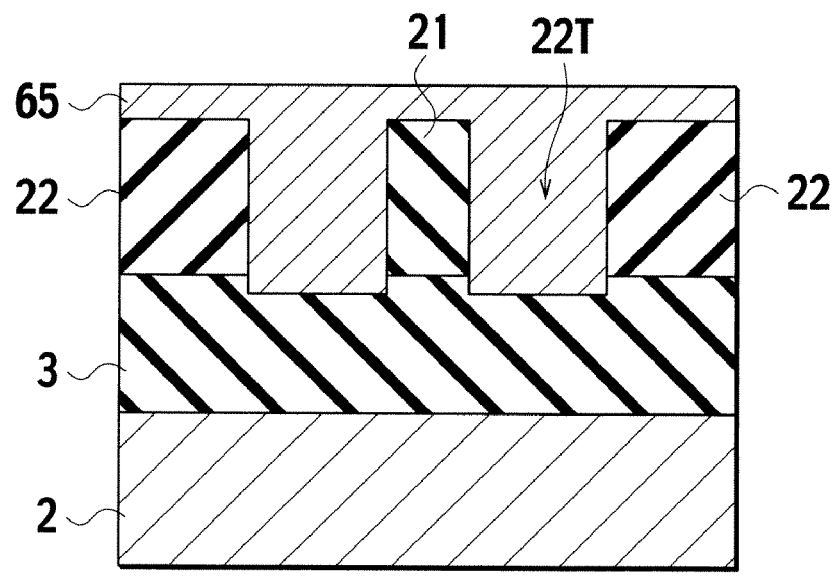
FIG. 88 is a cross section of the switching element and the semiconductor device in the fifth embodiment and in an eighth manufacturing process.
Figure 89:
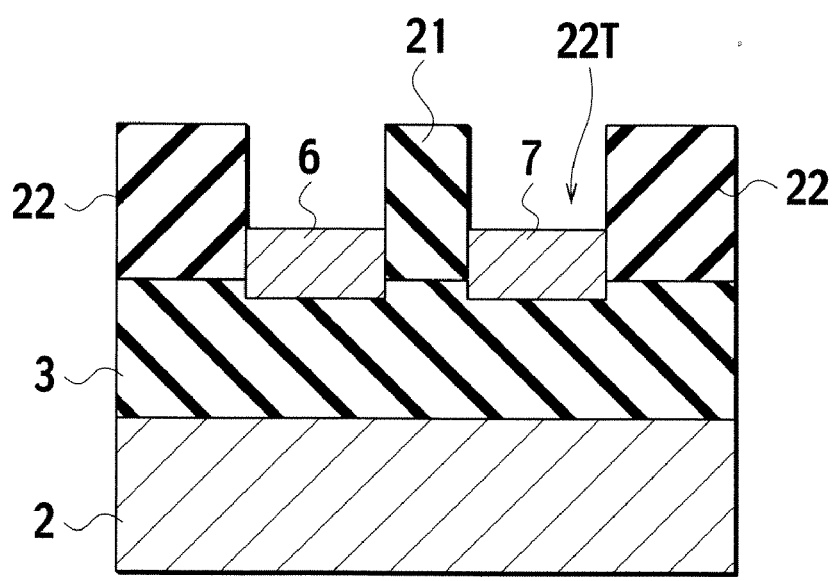
FIG. 89 is a cross section of the switching element and the semiconductor device in the fifth embodiment and in a ninth manufacturing process.

Referring to FIG. 88, the main electrode film 65 is smoothed by the CMP process in such a manner that the insulating films 21 and 22 will not be exposed. Thereafter, the main electrode film 65 is etched back, so that a part thereof is left in the trench 22T as shown in FIG. 89. The main electrode film 65 remained in the trench 22T is 30 nm thick, and is used to make the first and second main electrodes 6 and 7. The reactive ion etching process with the $SF_6$ and $O_2$ gases is preferable to the etching-back.

Figure 90:
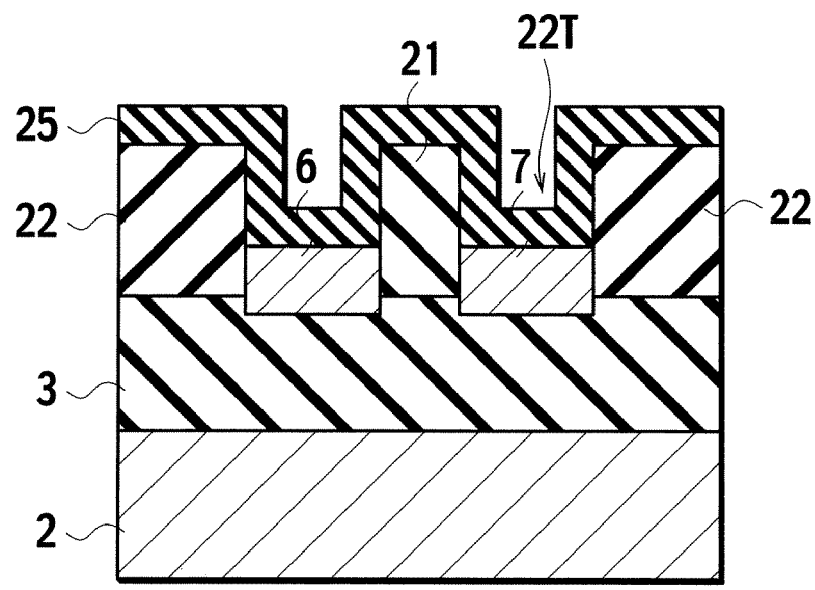
FIG. 90 is a cross section of the switching element and the semiconductor device in the fifth embodiment and in a tenth manufacturing process.

An insulating film 25 is formed on all over the substrate 2, including sidewalls of the insulating film 21 and 22, and the first and second main electrodes 6 and 7. Refer to FIG. 90. The insulating film 25 is preferably a 7 nm thick $SiO_2$ film which is mainly made from TEOS, and is prepared by the CVD process.

Figure 91:
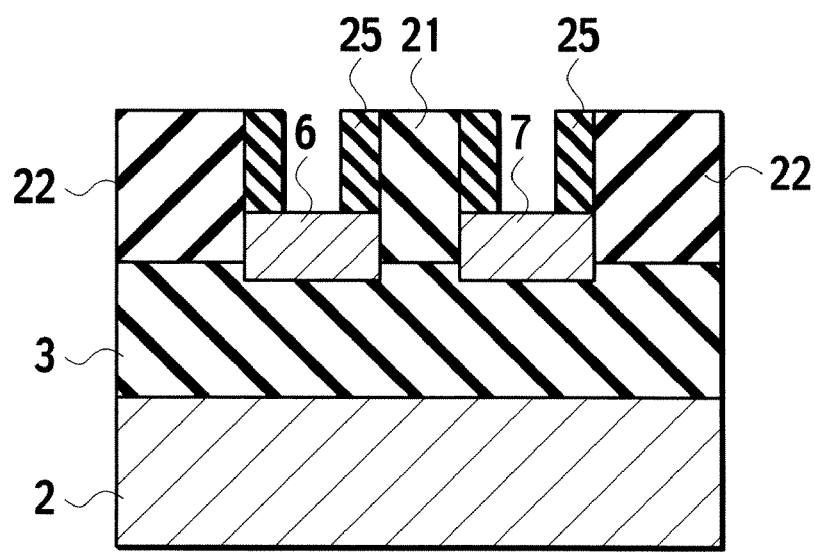
FIG. 91 is a cross section of the switching element and the semiconductor device in the fifth embodiment and in an eleventh third manufacturing process.

As shown in FIG. 91, the insulating film 25 is etched back, so that tops of the first and second main electrodes 6 and 7 are exposed in the trench 22T. The reactive ion etching process with the $CHF_3$ and CO gases is preferable to the etching-back.

Figure 92:
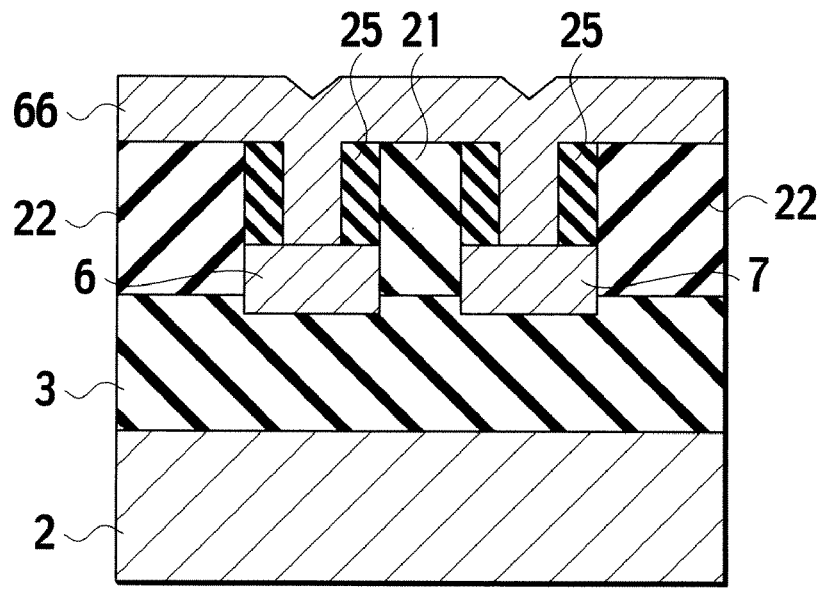
FIG. 92 is a cross section of the switching element and the semiconductor device in the fifth embodiment and in a twelfth manufacturing process.
Figure 93:
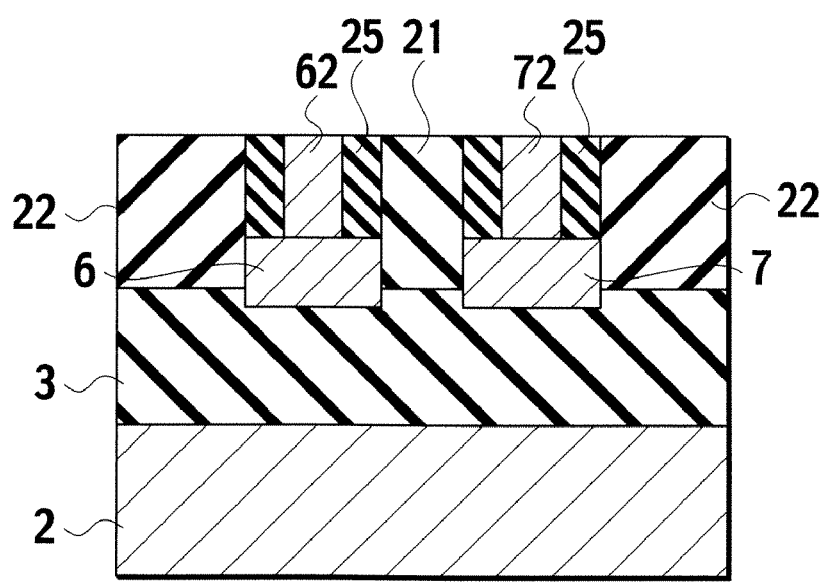
FIG. 93 is a cross section of the switching element and the semiconductor device in the fifth embodiment and in a thirteenth manufacturing process.

A lead electrode film 66 is made over the first and second main electrodes 6 and 7 in the trench 22T, and the insulating films 21 and 22 as well as the substrate 2. The lead electrode film 66 is preferably a tungsten (W) film which is 80 nm thick, and is prepared by the sputtering process. Refer to FIG. 92. The lead electrode film 66 is smoothed by the CMP process in order that it is embedded in the trench 22T. The lead electrode film 66 is used to make a lead electrode 62 to be connected to the first main electrode 6 and a lead electrode 72 to be connected to the second main electrode 7, as shown in FIG. 93.

Figure 94:
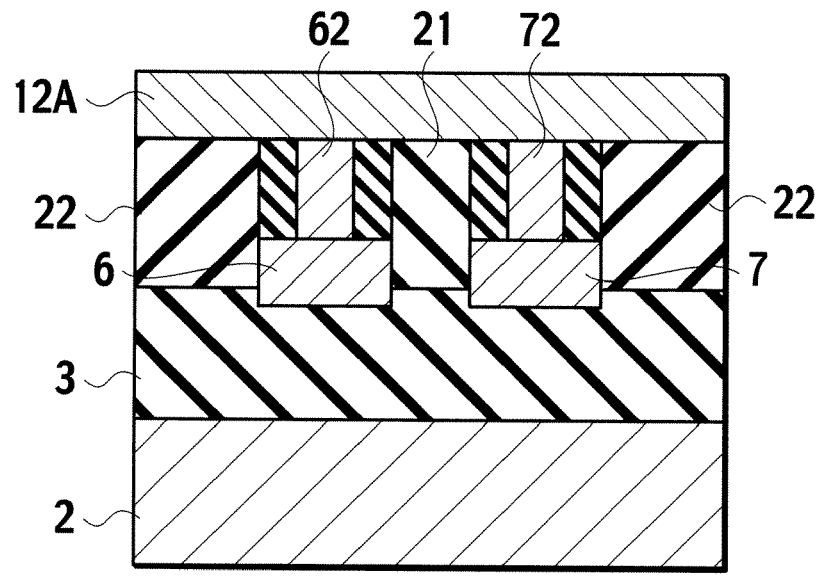
FIG. 94 is a cross section of the switching element and the semiconductor device in the fifth embodiment and in a fourteenth manufacturing process.

A wiring film 12A is made over the insulating films 21 and 22 as well as the substrate 2, and is connected to the lead electrodes 62 and 72, as shown in FIG. 94. The wiring film 12A is preferably an aluminum alloy film which is prepared by the sputtering process, and is 100 nm thick.

Figure 95:
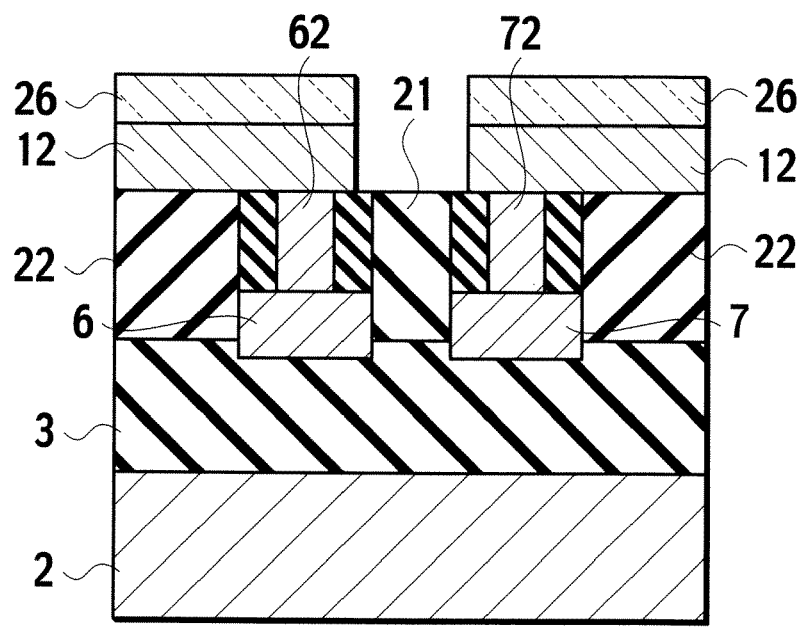
FIG. 95 is a cross section of the switching element and the semiconductor device in the fifth embodiment and in a fifteenth manufacturing process.

A resist mask 26 is made on the wiring film 12A by the lithography process. The wiring film 12A is patterned via the resist mask 26, thereby making the wiring 12. Refer to FIG. 95. The wiring 12 is patterned in the design to apply a voltage between the first and second main electrodes 6 and 7 in the manufacturing process, specifically while the fine particles 80 are aligned. The reactive ion etching with the $Cl_2$ and $BCl_3$ gases is preferably used for the patterning. Thereafter, the resist mask 26 is removed.

Figure 96:
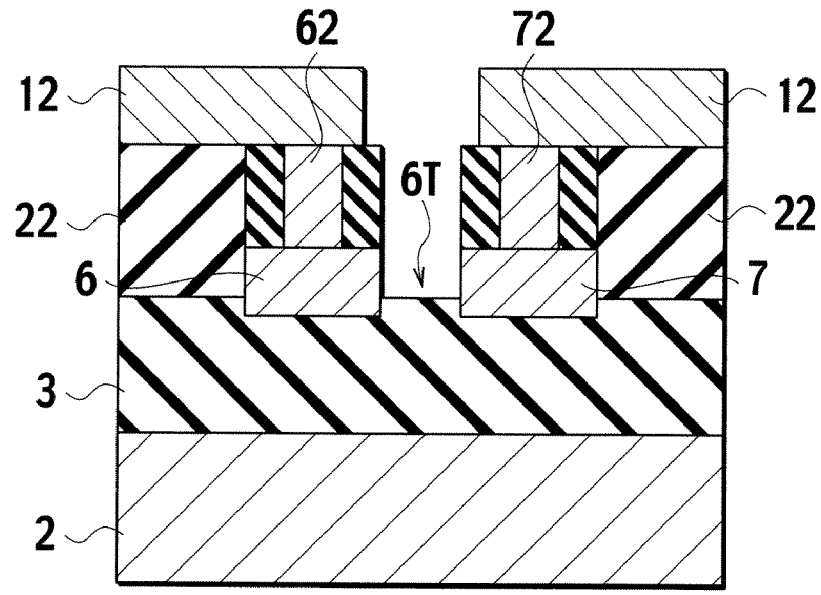
FIG. 96 is a cross section of the switching element and the semiconductor device in the fifth embodiment and in a sixteenth manufacturing process.

As shown in FIG. 96, the insulating film 21 is selectively removed, thereby making the trench 6T for the channel region 8. The reactive ion etching with the $CHF_3$, $CF_4$ and $O_2$ gases is preferably used for the foregoing purpose.

Figure 97:
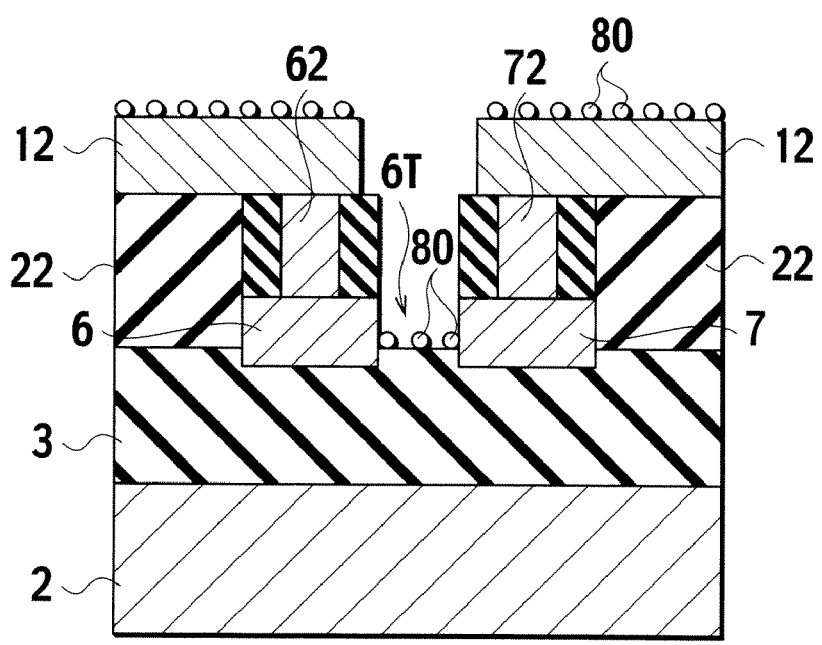
FIG. 97 is a cross section of the switching element and the semiconductor device in the fifth embodiment and in a seventeenth manufacturing process.

Fine particles 80 are dispersed in the trench 6T where the channel region 8 is to be made, as shown in FIG. 97. The fine particles 80 are made of Si particles which has the average diameter of 2 nm, are suspended in isopropyl alcohol, and are discharged as minute droplets via the hollow needle electrode 102 of the dispenser 100 (shown in FIG. 28). A high voltage is applied to the hollow needle electrode 102. The isopropyl alcohol in the minute droplets is evaporated before they reach the surface of the substrate 2, i.e., the wiring 12 or the insulating film 3. This means that only the fine Si particles 80 are sprayed onto the wiring 12 and the insulating film 3.

Figure 98:
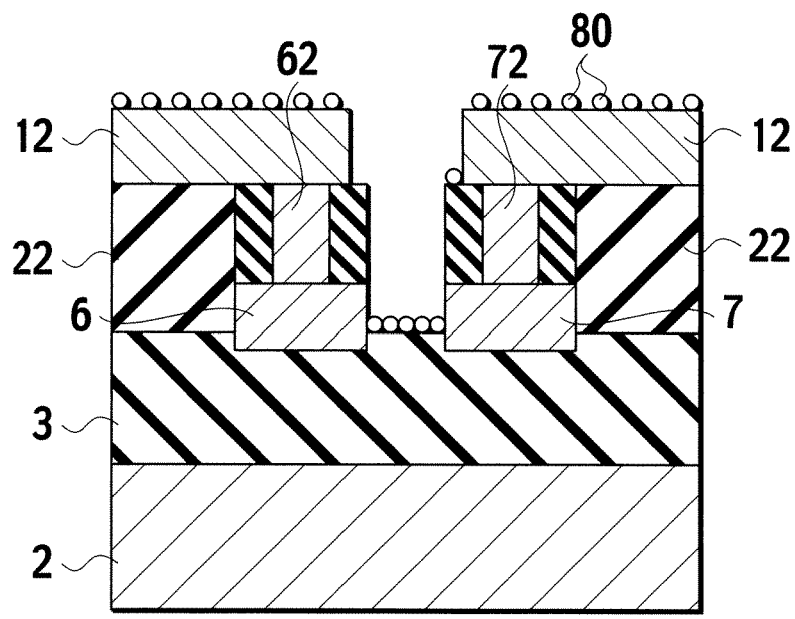
FIG. 98 is a cross section of the switching element and the semiconductor device in the fifth embodiment and in an eighteenth manufacturing process.

As shown in FIG. 98, a voltage of 1.5 volt is applied between the first and second main electrodes 6 and 7 via the wiring 12. Then, the electric field E is produced in the first direction from the first electrode wall 61 of the first main electrode 6 to the second electrode wall 71 of the second main electrode 7. In response to the generation of the electric field E, the fine particles 80 which are at random are aligned by the attractive force acting on them. Therefore, a plurality of unit channels 81 in which the fine particles 80 are aligned in the first direction can be made. Adjacent unit channels 81 are separated in the second direction by the repulsive force acting on the fine particles 80. The channel region 8 includes a plurality of juxtaposed unit channels 81 in which the fine particles 80 are aligned. ArF excimer laser beams are illuminated to the fine particles 80 in order to couple fine particles 80 at one end of the unit channel 81 to the first electrode wall 61, and fine particles at the other end of the unit channel 81 to the second electrode wall 71.

The insulating film 3 is over-etched, and the first and second main electrodes 6 and 7 are present at the over-etched part of the insulating film 3. Therefore, bottoms of the first and second main electrodes 6 and 7 are lower than the bottom of the trench 6T where fine particles 80 are dispersed. Not the electric field produced at a corner of the first main electrode 6 and the first electrode wall 61 but the uniform electric field produced at the center of the first electrode wall 61 is applied to the fine particles 80. Also, not the electric field produced at a corner of the second main electrode 7 and the second electrode wall 71 but the uniform electric field produced at the center of the second electrode wall 71 is applied to the fine particles 80.

Figure 99:
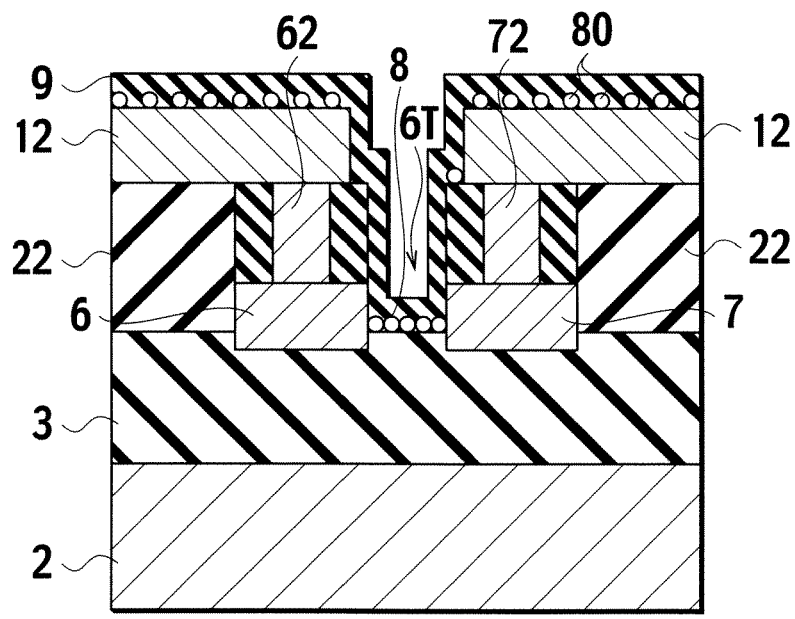
FIG. 99 is a cross section of the switching element and the semiconductor device in the fifth embodiment and in a nineteenth manufacturing process.

As shown in FIG. 99, an insulating film 9 is applied all over the fine particles 80 aligned in the trench 6T as well as the substrate 2. The insulating film 9 is preferably an HfSiON film which is 5 nm thick and is prepared by the ALD process. Alternatively, the insulating film 9 may be a single layer of an SiON film, an $SiO_2$ film and so on which are optimum as gate insulator films, or a composite layer of the foregoing films.

Figure 100:
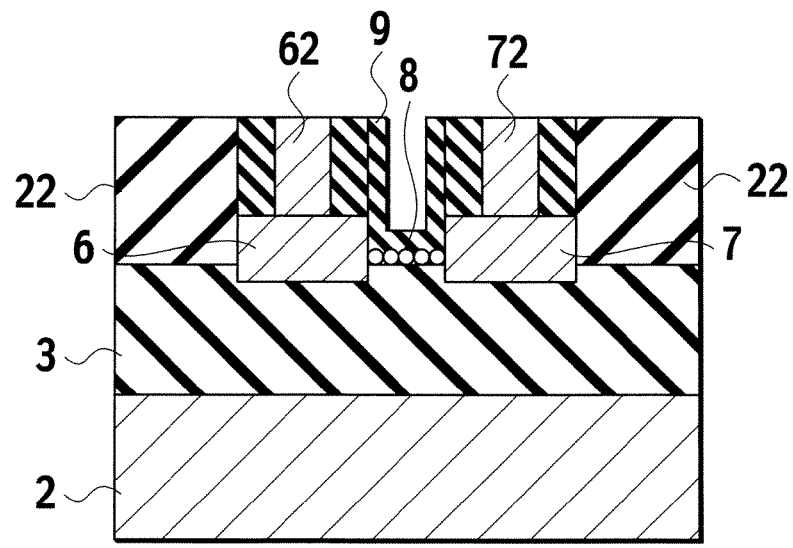
FIG. 100 is a cross section of the switching element and the semiconductor device in the fifth embodiment and in a twentieth manufacturing process.

The wiring 12 is removed as shown in FIG. 100. Further, unnecessary fine particles 80 on the wiring 12 are removed together with the insulating film 9. The wet etching process with dilute hydrochloric acid is preferably usable for the removal of the wiring 12.

Figure 101:
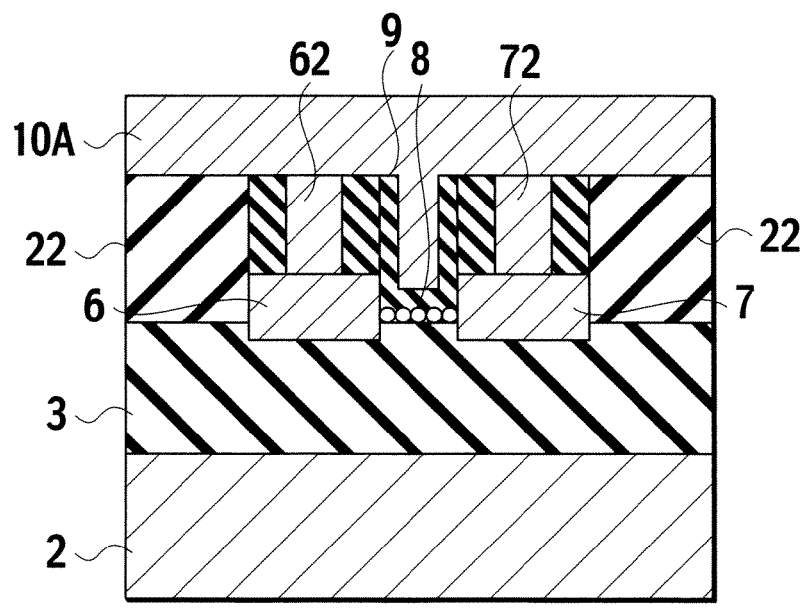
FIG. 101 is a cross section of the switching element and the semiconductor device in the fifth embodiment and in a twenty-first manufacturing process.

A control electrode film 10A is applied all over the insulating film 9 and the substrate 2. Refer to FIG. 101. The control electrode film 10A is preferably a P-doped poly-crystal silicon film which is mainly made from silane added with $PH_3$, is prepared by the LPCVD process, and is 100 nm thick, for instance. Step coverage of the poly-crystal silicon film is excellent, so that the silicon film can be filled in the trench 6T, and obtain flat surface over the trench 6T.

Figure 102:
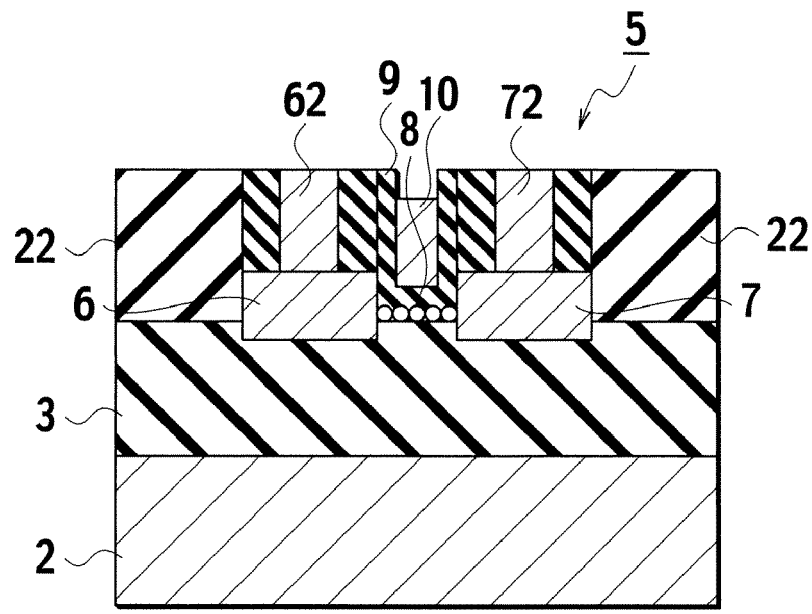
FIG. 102 is a cross section of the switching element and the semiconductor device in the fifth embodiment and in a twenty-second manufacturing process.

Referring to FIG. 102, the control electrode film 10A is etched back, so that it has a certain thickness in the trench 6T. The control electrode film 10A in the trench 6T is used to make the control electrode 10. The reactive ion etching process with the HBr and $O_2$ gases is preferably usable for the etching-back. The certain thickness is 35 nm, for instance. In this stage, the switching element 5 is completed.

Figure 103:
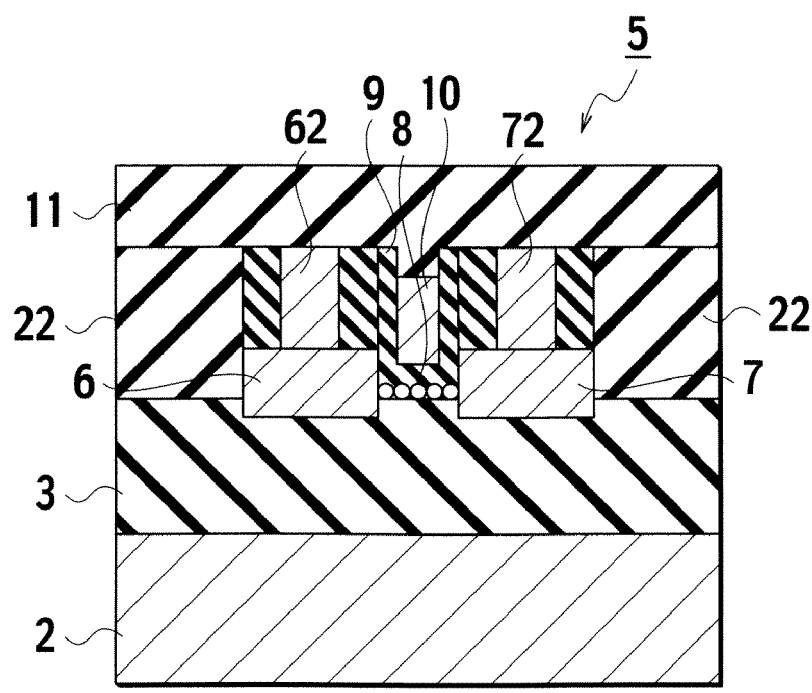
FIG. 103 is a cross section of the switching element and the semiconductor device in the fifth embodiment and in a twenty-third manufacturing process.

As shown in FIG. 103, a passivation film 11 is applied all over the switching element 5 as well as the substrate 2. The passivation film 11 is preferably an $SiO_2$ film which is mainly made from TEOS, is prepared by the CVD process, and 150 nm thick. Although not shown, a wiring to be connected to the first and second main electrodes 6 and 7 is applied on the passivation film 11. Further, a final passivation film is applied on the wiring. In this state, the semiconductor device 1 of the fifth embodiment is completed.

According to the fifth embodiment, the patterns can be precisely micro-fabricated, can be controlled with ease with respect to sizes and positions.

Sixth Embodiment

A sixth embodiment of the invention will be described with reference to FIG. 104 to FIG. 113. In this embodiment, a semiconductor device includes a memory cell (switching element) having a dual dot structure.

Figure 104:
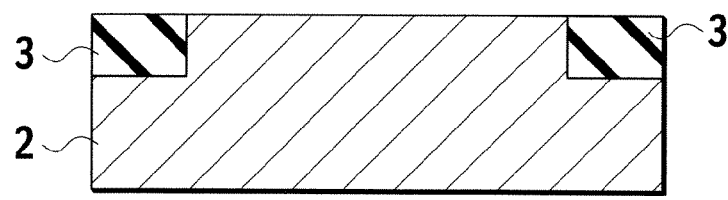

First of all, a 720 μm thick substrate 2 is prepared, and is cleaned using hydrofluoric acid. A trench is made on an isolation region of the substrate 2, and the insulating film 3 is formed to fill the trench by the STI process as shown in FIG. 104.

Figure 105:
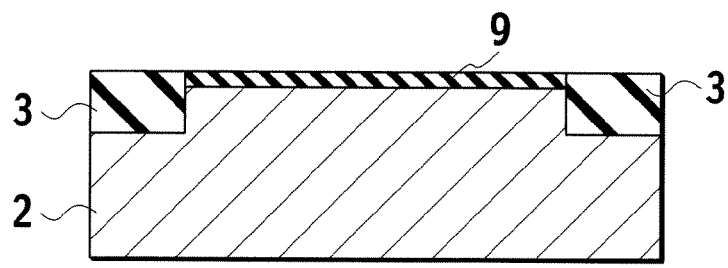

An insulating film 9 is applied on an active area of the substrate 2 as shown in FIG. 105. The insulating film 9 is an $SiO_2$ film which has grown to a thickness of 2 nm at a temperature of 950° C. by the thermal oxidation process. Alternatively, the insulating film 9 may be a single layer of an HfSiON film or an SiON film, or a composite layer of the HfSiON film and $SiO_2$ film or a composite layer of the $SiO_2$ film and SiON film. A resist mask (not shown, and having an open pattern in the active area) is made by the lithography process. A concentration of impurities on the substrate 2 is controlled by ion implantation using the resist mask. For instance, boron (B) ions are implanted at an accelerating voltage of 10 kV. After removing the resist mask, implanted impurities are activated and diffused by the thermal process, so that the concentration of impurities near the surface can be adjusted to approximately $10^{16}$ atoms/cm$^3$.

Figure 106:
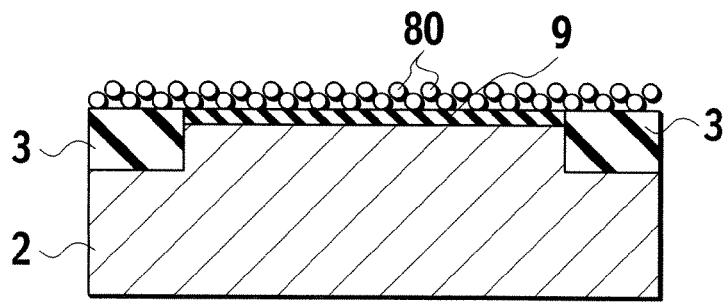

Fine particles 80 are dispersed on at least the insulating film 9 in the active area, as shown in FIG. 106. The fine particles 80 are made of Si which has the average diameter of 5 nm, is suspended in isopropyl alcohol, and is emitted as minute droplets via the hollow needle electrode 102 of the dispenser 100 (shown in FIG. 28). A high voltage is applied to the hollow needle electrode 102. The isopropyl alcohol in the minute droplets is evaporated before they reach the surface of the substrate 2. This means that only the Si fine particles 80 are sprayed onto the insulating film 9.

Figure 107:
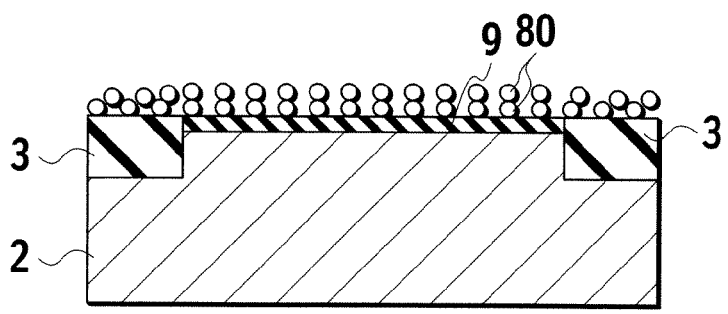

In a vacuum, a substrate 2 is placed between two electrode plates (not shown). As shown in FIG. 107, the surface of the substrate 2 is exposed to an electric field oriented in a direction of the normal line in order to align the fine particles 80 on the insulating film 9. Though the fine particles 80 are aligned on the insulating film 9, an intensity of the electric field on the insulating film 3 is not sufficient enough to align the fine particles 80 in accordance with the shape and high dielectric constants of the substrate 2. While the fine particles 80 are being aligned, repulsive force acts on the fine particles 80 in plane, so that fine particles 80 are separated. Therefore, a coverage is smaller than that obtained when the fine particles 80 are close-packed. As a typical example, when 5 nm fine particles 80 are close-packed, a surface density is $2.3 \times 10^{12}$ particles/cm$^2$. When fine particles 80 are aligned in one layer with 2 nm spaces kept between them, the surface density is $1.2 \times 10^{12}$ particles/cm$^2$. Therefore, when fine particles 80 in an amount of 1 ML are dispersed and are aligned with 2 nm spaces kept between them, rows of fine particles 80 in which every two fine particles 80 are vertically aligned can be formed at the surface density of approximately $1 \times 10^{12}$ particles/cm$^2$. With the dual dot structure of the memory cell, the surface density of dots is required only to be larger than $2.5 \times 10^{11}$ particles/cm$^2$ in order to demonstrate the efficiency of the memory by expelling or inducing the carriers at the channel region. The surface density of the semiconductor device 1 of the sixth embodiment can sufficiently satisfy this requirement.

Figure 108:
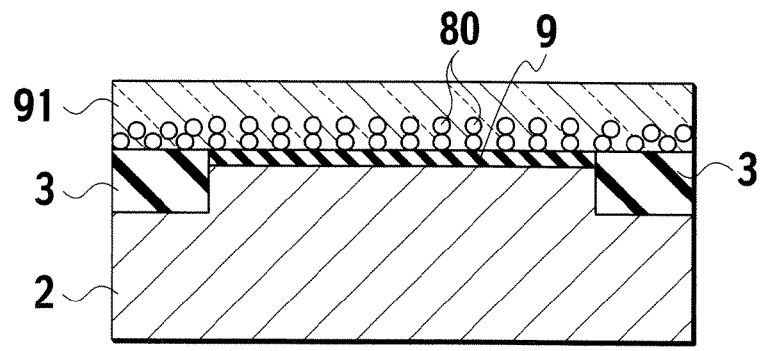
Figure 109:
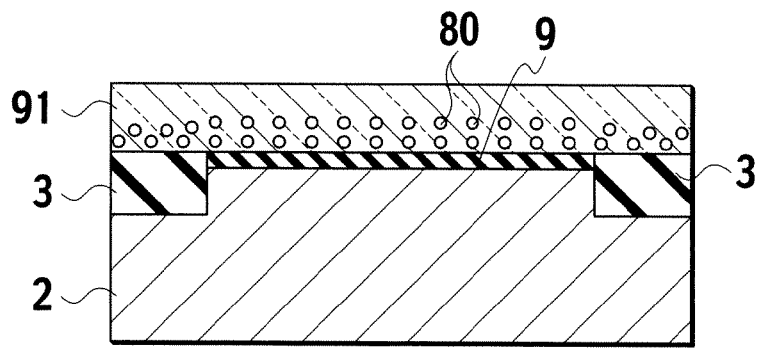

An insulating film 91 is applied over the fine particles 80 as shown in FIG. 108. The insulating film 91 is preferably an SiO$_2$ film which is mainly made from TEOS, is prepared by the CVD process, and is 15 nm thick. The thermal oxidation process at 950° C. is carried out so as to oxidize the fine particles 80 from the surface to a depth of 1 nm, for instance, as shown in FIG. 109. This process also thermally oxidize the interface of the substrate 2 facing to the insulating film 9, thereby the thickness of the insulating film 9 becomes thicker by approximately 1 nm.

Figure 110:
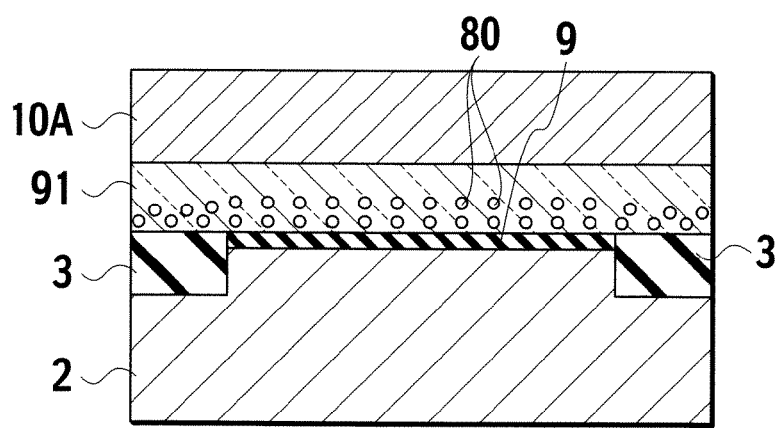

As shown in FIG. 110, a control electrode film 10A is applied over the insulating film 91 as well as the substrate 2. The control electrode film 10A is a P-doped poly-crystal silicon film which is mainly made from silane added with PH$_3$, is prepared by the LPCVD process, and is 40 nm thick, for instance.

Figure 111:
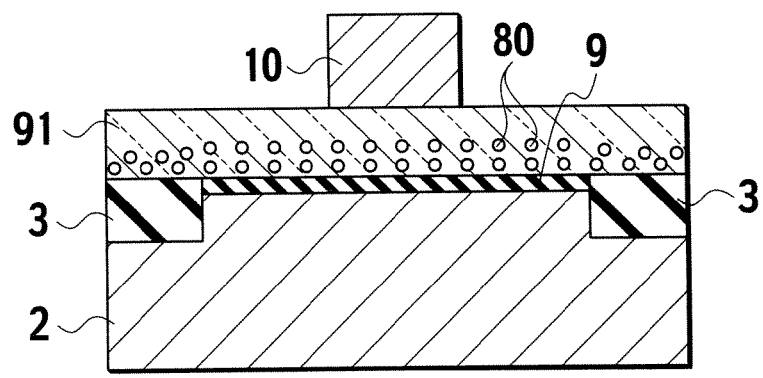

The control electrode film 10A is patterned using a resist mask prepared by the lithography process, and by the reactive ion etching process with HBr and O$_2$ gases. Therefore, the control electrode 10 will be formed as shown in FIG. 111. The control electrode 10 forms the word line (not shown) which extends vertically in the plane of FIG. 111.

Figure 112:
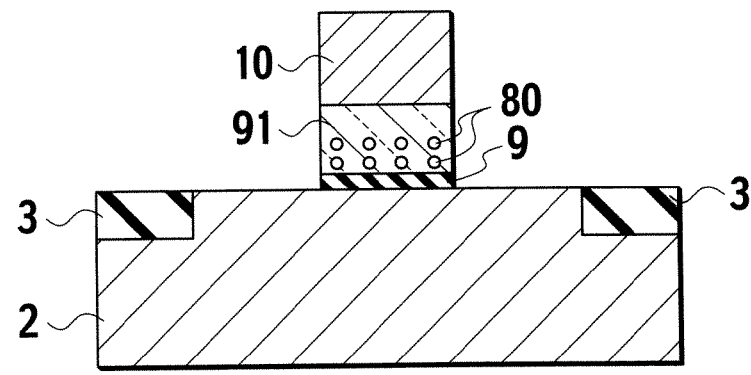

Referring to FIG. 112, the insulating film 91, fine particles 80 and insulating film 9 which are exposed around the control electrode 10 are patterned and removed using the control electrode 10 as an etching mask. The reactive ion etching process with the CHF$_3$ and O$_2$ gases is preferably usable for the patterning.

Figure 113:
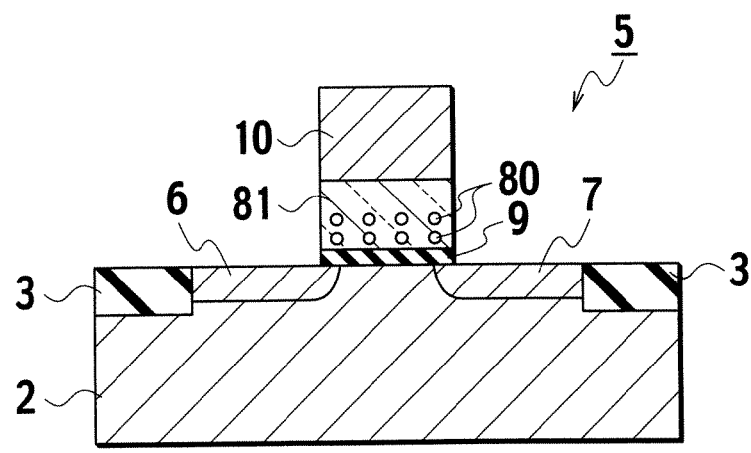

As shown in FIG. 113, the first and second main electrodes 6 and 7 are made on the surface of the substrate 2 by ion implantation. A resist mask (not shown) having an open pattern in an active area is prepared by the lithography process. This resist mask and the control electrode 10 are used as a mask for ion implantation. The first and second main electrodes 6 and 7 function as a source region and a drain region, respectively. These main electrodes 6 and 7 are made by implanting As ions into the surface of the substrate 2 at 1 kV acceleration voltage. After removing the resist mask, the implanted area is thermally treated in order to activate and diffuse impurities. The first and second main electrodes 6 and 7 are designed to have a density of impurities of approximately $10^{20}$ atoms/cm$^3$. After making the first and second main electrodes 6 and 7, the memory cell with the switching element 5 which can store information (i.e., have the dual dot structure) will be completed.

Although not shown, a bit line or a source line is made and is connected to the first or second main electrode 6 or 7 of the memory cell. In this state, the semiconductor device 1 of the sixth embodiment will be completed.

In the sixth embodiment, the fine particles 80 are Si particles. Alternatively, the fine particles 80 may be FePt, Au, Ag, CdSe or SiO$_2$ particles, which are easily fabricated and available. Further, carbon particles or fullerene may be easily processed to obtain fine particles 80. Especially, C$_{60}$ dimer is preferable as elliptical fine particles. According to the invention, the fine particles 80 may be polyhedral or columnar as well as spherical or elliptical.

Other Embodiments

While the invention herein disclosed has been described by means of specific embodiments and applications thereof, numerous modifications and variations could be made thereto by those skilled in the art without departing from the scope of the invention set fourth in the claims.

What is claimed is:

1. A switching element comprising:
 a first electrode having a first surface;
 a second electrode having a second surface which stands off from the first surface; and
 a channel region constituted by a plurality of unit channels, each unit channel having opposite ends thereof in contact with the first electrode and the second electrode and including fine particles which are in direct physical contact with each other in a first direction from the first surface of the first electrode to the second surface of the second electrode, and the unit channels being separated from one another in a second direction across the first direction.

2. The switching element as defined in claim 1, wherein the second surface faces the first surface and stands off in the first direction from the first surface, and each unit channel has opposite ends thereof in contact with the first surface of the first electrode and the second surface of the second electrode.

3. The switching element as defined in claim 1, wherein the fine particles are spherical or elliptical, and have substantially the same shape and diameter.

4. The switching element as defined in claim 3, wherein a diameter of the each spherical fine particle or a shorter diameter of the each elliptical fine particle is shorter than a length of a shortest side of the first surface of the first electrode or a length of a shortest side of the second surface of the second electrode.

5. The switching element as defined in claim 1, wherein fine particles of each unit channel are in contact with one another by attractive force; and fine particles of one unit channel stand off from fine particles of adjacent unit channels by repulsive force.

6. The switching element as defined in claim 5, wherein the attractive force acts on fine particles in the first direction in response to an electric field oriented in the first direction while the repulsive force acts on fine particles in the second direction in response to the electric field oriented in the first direction.

7. The switching element as defined in claim 1, wherein the first surface of the first electrode or the second surface of the second electrode is flat or curved.

8. The switching element as defined in claim 1, further comprising an insulator placed on the channel region, and a control electrode placed on the insulator.

9. The switching element as defined in claim 1, wherein the fine particles are joined with each other by an electric field or a magnetic field.

10. The switching element as defined in claim 1, wherein the fine particles are made of Ge or C of IV group, or GaAs, GaN, GaSb, or InP of III-V group.

11. The switching element as defined in claim 1, wherein the channel region has a channel length defined by:
   Channel Length=2×(radius of the fine particles)×(No. of the fine particles in a linear line).

12. A semiconductor device comprising:
   a substrate;
   a switching element mounted on the substrate; and
   the switching element comprising:
   a first electrode having a first surface;
   a second electrode having a second surface which stands off from the first surface;
   a channel region constituted by a plurality of unit channels, each unit channel having opposite ends thereof being in contact with the first electrode and the second electrode and including fine particles which are in direct physical contact with each other in a first direction from the first surface of the first electrode to the second surface of the second electrode, and the unit channels being separated from one another in a second direction across the first direction.

13. A switching element comprising:
   a first electrode having a first surface;
   a second electrode having a second surface which stands off from the first surface; and
   fine particles which are randomly dispersed between the first surface of the first electrode and the second surface of the second electrode, and
   whose state can be at least once changed to the aligned one in which a plurality of unit channels constitute a channel region, each unit channel has opposite ends thereof in contact with the first electrode and the second electrode and includes fine particles which are in direct physical contact with each other in a first direction from the first surface of the first electrode to the second surface of the second electrode, and the unit channels are separated from one another in a second direction across the first direction.

14. The switching element as defined in claim 13, wherein the fine particles are joined with each other by an electric field or a magnetic field.

15. The switching element as defined in claim 13, wherein the fine particles are made of Ge or C of IV group, or GaAs, GaN, GaSb, or InP of III-V group.

16. The switching element as defined in claim 13, wherein the channel region has a channel length defined by:
   Channel Length=2×(radius of the fine particles)×(No. of the fine particles in a linear line).

17. The semiconductor device as defined in claim 12, wherein the channel region has a channel length defined by:
   Channel Length=2×(radius of the fine particles)×(No. of the fine particles in a linear line).

18. The semiconductor device as defined in claim 12, wherein the switching element further comprises a dielectric film placed between the first and second surfaces;
   the each unit channel having opposite ends thereof being in contact with the first electrode and the second electrode on the dielectric film.

19. The semiconductor device as defined in claim 12, wherein the fine particles are joined with each other by an electric field or a magnetic field.

20. The semiconductor device as defined in claim 12, wherein the fine particles are made of Ge or C of IV group, or GaAs, GaN, GaSb, or InP of III-V group.

21. A semiconductor device comprising:
   a substrate;
   a switching element mounted on the substrate; and
   the switching element comprising:
   a first electrode having a first surface;
   a second electrode having a second surface which stands off from the first surface; and
   fine particles which are randomly dispersed between the first surface of the first electrode and the second surface of the second electrode, and
   whose state can be at least once changed to the aligned one in which a plurality of unit channels constitute a channel region, each unit channel has opposite ends thereof in contact with the first electrode and the second electrode and includes fine particles which are in direct physical contact with each other in a first direction from the first surface of the first electrode to the second surface of the second electrode, and the unit channels are separated from one another in a second direction across the first direction.

22. The semiconductor device as defined in claim 21, wherein the fine particles are joined with each other by an electric field or a magnetic field.

23. The semiconductor device as defined in claim 21, wherein the fine particles are made of Ge or C of IV group, or GaAs, GaN, GaSb, or InP of III-V group.

24. The semiconductor device as defined in claim 21, wherein the channel region has a channel length defined by:
   Channel Length=2 ×(radius of the fine particles)×(No. of the fine particles in a linear line).

* * * * *